(12) United States Patent
Yamazaki et al.

(10) Patent No.: US 7,692,194 B2
(45) Date of Patent: Apr. 6, 2010

(54) SEMICONDUCTOR DEVICE

(75) Inventors: Shunpei Yamazaki, Tokyo (JP); Atsuo Isobe, Kanagawa (JP); Hiromichi Godo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/015,362

(22) Filed: Jan. 16, 2008

(65) Prior Publication Data

US 2008/0179675 A1    Jul. 31, 2008

(30) Foreign Application Priority Data

Jan. 26, 2007 (JP) ............... 2007-016116

(51) Int. Cl.
*H01L 29/04* (2006.01)
*H01L 31/036* (2006.01)
*H01L 31/0376* (2006.01)
*H01L 31/20* (2006.01)

(52) U.S. Cl. ............... 257/59; 257/72; 257/347; 257/E29.117

(58) Field of Classification Search ............ 257/72, 257/337, 338, 347, 353, 368, 369, E29.117, 257/E29.287, 59
See application file for complete search history.

(56) References Cited

U.S. PATENT DOCUMENTS

| | | | |
|---|---|---|---|
| 5,652,453 A | 7/1997 | Iwamatsu et al. | |
| 6,030,873 A | 2/2000 | Iwamatsu et al. | |
| 7,189,636 B2 * | 3/2007 | Ichinose et al. | ............ 438/586 |
| 2008/0128808 A1 * | 6/2008 | Yamazaki et al. | ............ 257/347 |
| 2008/0179597 A1 | 7/2008 | Yamazaki et al. | |

FOREIGN PATENT DOCUMENTS

| | | |
|---|---|---|
| JP | 61-048975 | 3/1986 |
| JP | 08-335702 | 12/1996 |
| JP | 2003-289079 | 10/2003 |
| JP | 2008-182165 A | 8/2008 |

\* cited by examiner

*Primary Examiner*—Hoai v Pham
(74) *Attorney, Agent, or Firm*—Nixon Peabody LLP; Jeffrey L. Costellia

(57) ABSTRACT

A semiconductor device having a novel structure by which the operating characteristics and reliability are improved and a manufacturing method thereof. An island-shaped semiconductor layer provided over a substrate, including a channel formation region provided between a pair of impurity regions; a first insulating layer provided so as to be in contact with the side surface of the semiconductor layer; a gate electrode provided over the channel formation region so as to get across the semiconductor layer; and a second insulating layer provided between the channel formation region and the gate electrode are included. The semiconductor layer is locally thinned, the channel formation region is provided in the thinned region, and the second insulating layer covers the first insulating layer provided on the side surface of the semiconductor layer at least in the region which overlaps with the gate electrode.

13 Claims, 30 Drawing Sheets

2180

2180

2180

2180

2180

2180

2180

2180

SEMICONDUCTOR DEVICE

BACKGROUND OF THE INVENTION

1. Field of the Invention

The present invention relates to a semiconductor device and a manufacturing method thereof. In this specification, a semiconductor device refers to any device capable of functioning with the use of semiconductor characteristics.

2. Description of the Related Art

In recent years, the information society has been increasingly developed, and the demand for higher speed, larger capacitance, smaller size, lighter weight, or the like of information communication equipment such as a personal computer or a mobile phone has been increased. With such a trend of the times, LSI (large scale integration) has been needed to be provided with higher integration, higher speed, and lower power consumption, which has resulted in essentially needing higher performance and miniaturization of each transistor for forming LSI.

Pattern diagrams of a conventional thin film transistor are FIGS. 12A to 12C. FIG. 12A is a top diagram of the thin film transistor, FIG. 12B is a cross-sectional diagram along a one-dotted dashed line O-P in FIG. 12A, and FIG. 12C is a cross-sectional diagram along a one-dotted dashed line Q-R in FIG. 12A. Note that, in FIG. 12A, a thin film and the like included in the thin film transistor are partially omitted.

As for the thin film transistor, an island-shaped semiconductor layer 9006 is provided over a substrate 9000 with a base insulating layer 9002 interposed therebetween. Over the semiconductor layer 9006, a conductive layer 9012 which functions as a gate electrode is formed with a gate insulating layer 9004 interposed therebetween. Further, the semiconductor layer 9006 includes a channel formation region 9008 which is formed in the region which overlaps with the conductive layer 9012 with the gate insulating layer 9004 interposed therebetween, and source and drain regions 9010. Further, an interlayer insulating layer 9014 is provided over the gate insulating layer 9004 and the conductive layer 9012, and conductive layers 9016 which function as source and drain electrodes are formed over the interlayer insulating layer 9014. The conductive layers 9016 are electrically connected to the semiconductor layer 9006.

In view of higher performance and miniaturization of a transistor, various structures have been considered for a thin film transistor. For example, in order to realize higher performance and miniaturization of a transistor, reduction in thickness of a gate insulating layer has been progressed.

For example, according to Reference 1 (Japanese Published Patent Application No. 2003-289079), ionized hydrogen is introduced into a semiconductor layer such that the surface of the semiconductor layer is subjected to ozone oxidation, whereby thinning of a gate insulating layer can he performed and a thin film transistor with good characteristics can be formed.

SUMMARY OF THE INVENTION

However, the method of forming a thin gate insulating layer described in Reference 1 reduces throughput and is not suited for mass production because the number of manufacturing steps is increased by the step of introducing ionized hydrogen into a semiconductor layer, the step of thermal treatment for desorption of hydrogen atoms from the semiconductor layer after the surface of the semiconductor layer is subjected to ozone oxidation, or the like and a certain period of processing time is needed for ozone oxidation. Further, when a gate insulating layer is thinned, a problem of leakage current due to insufficiency of coverage at the edge of the semiconductor layer becomes obvious and the reliability tends to decrease. Further, in a thin film transistor in which a silicon thin film is formed of crystalline silicon which is crystallized by laser irradiation, crystal grain boundaries are randomly formed and plane directions of crystals are nonuniform. Therefore, the threshold voltage fluctuates largely and the operating characteristics tend to be adversely affected. Furthermore, there is a structural disadvantage in that a substrate bias cannot be applied since a substrate supporting the semiconductor layer has electrical insulation properties The present invention is made in view of the foregoing problems, and it is an object of the present invention to provide a semiconductor device having a novel structure by which the operating characteristics and reliability are improved and a manufacturing method thereof.

The present invention relates to a semiconductor device having a so-called SOI (Silicon On Insulator) structure in which a semiconductor layer over an insulating surface is used for forming an element, in which the semiconductor layer is locally thinned and a channel formation region is provided in the thinned region.

The semiconductor layer is provided to have an island shape and includes a channel formation region between at least a pair of impurity regions. Further, a conductive layer forming a gate electrode is formed over the channel formation region so as to get across the semiconductor layer. An insulating layer is provided between the channel formation region and the conductive layer forming a gate electrode.

Note that the thickness of the locally thinned region of the semiconductor layer is preferably in the range of 10 to 25 nm. Therefore, the channel formation region is preferably formed in the region where the thickness is in the range of 10 to 25 nm.

Further, in the present invention, an insulating layer is provided so as to be in contact with the side surface of the island-shaped semiconductor layer. At least in a region where the gate electrode and the edge of the semiconductor layer are overlapped with each other, the insulating layer provided so as to be in contact with the side surface of the island-shaped semiconductor layer is covered with the insulating layer provided between the channel formation region and the conductive layer forming the gat electrode.

A specific structure of the present invention includes the following: an island-shaped semiconductor layer provided over a substrate, including a channel formation region provided between a pair of impurity regions; a first insulating layer provided so as to be in contact with the side surface of the semiconductor layer; a gate electrode provided over the channel formation region so as to get across the semiconductor layer; and a second insulating layer provided between the channel formation region and the gate electrode. The semiconductor layer is locally thinned, the channel formation region is provided in the thinned region, and the second insulating layer covers the first insulating layer provided on the side surface of the semiconductor layer at least in the region which overlaps with the gate electrode.

Another structure of the present invention includes the following: an island-shaped semiconductor layer provided over a substrate, including a channel formation region provided between a pair of impurity regions and silicide regions provided so as to be in contact with the impurity regions; a first insulating layer provided so as to be in contact with the side surface of the semiconductor layer; a gate electrode which is provided over the channel formation region so as to get across the semiconductor layer; a second insulating layer provided between the channel formation region and the gate electrode; and a third insulating layer provided on the side surface of the gate electrode. The semiconductor layer is locally thinned, the channel formation region is provided in the thinned region, and the second insulating layer covers the first insulating layer provided on the side surface of the semiconductor layer at least in the region which overlaps with the gate electrode.

Another structure of the present invention includes the following: an island-shaped semiconductor layer provided over a substrate, including a channel formation region provided between a pair of impurity regions and silicide regions provided so as to be in contact with the impurity regions; a first insulating layer provided so as to be in contact with the side surface of the semiconductor layer; a gate electrode provided over the channel formation region so as to get across the semiconductor layer; a second insulating layer provided between the channel formation region and the gate electrode; a third insulating layer provided on the side surface of the gate electrode; and conductive layers provided on the silicide regions so as to be electrically connected to the impurity regions via the silicide regions. The semiconductor layer is locally thinned, the channel formation region is provided in the thinned region, and the second insulating layer covers the first insulating layer provided on the side surface of the semiconductor layer at least in the region which overlaps with the gate electrode.

In the above-described structure, an impurity element for providing the same conductivity type as the impurity regions may be added into the silicide regions.

Further, in the above-described structure, the thickness of the second insulating layer provided between the channel formation region and the gate electrode is preferably in the range of 1 to 20 nm.

Further, in the above-described structure, in the semiconductor layer, an impurity element for providing the same conductivity type as the impurity regions may also be added between the channel formation region and the impurity regions at a lower concentration than the impurity regions, to form low-concentration impurity regions.

Further, according to one feature of the semiconductor device of the present invention, an island-shaped semiconductor layer is formed over a substrate, a first insulating layer is formed in contact with the side surface of the semiconductor layer, the semiconductor layer is selectively etched to be locally thinned, a second insulating layer is formed over the semiconductor layer, a gate electrode is formed over the thinned region of the semiconductor layer and the second insulating layer so as to get across the semiconductor layer, and an impurity element is added into the semiconductor layer with the gate electrode as a mask to form a pair of impurity regions and a channel formation region between the pair of impurity regions in a self-aligned manner.

Further, according to another feature of the semiconductor device of the present invention, an island-shaped semiconductor layer is formed over a substrate, a first insulating layer is formed in contact with the side surface of the semiconductor layer, the semiconductor layer is selectively etched to be locally thinned, a second insulating layer is formed over the semiconductor layer, a gate electrode is formed over the thinned region of the semiconductor layer and the second insulating layer so as to get across the semiconductor layer, an impurity element is added into the semiconductor layer with the gate electrode as a mask to form a pair of impurity regions and a channel formation region between the pair of impurity regions in a self-aligned manner, a third insulating layer is formed in contact with the side surface of the gate electrode, the second insulating layer is selectively etched with the third insulating layer and the gate electrode as masks to selectively expose the semiconductor layer, and a metal layer is formed over at least the exposed semiconductor layer and then is subjected to thermal treatment to make part of the region where the semiconductor layer and the metal layer are in contact with each other silicide so that a silicide region is formed in part of the semiconductor layer.

Further, according to another feature of the semiconductor device of the present invention, an island-shaped semiconductor layer is formed over a substrate, a first insulating layer is formed in contact with the side surface of the semiconductor layer, the semiconductor layer is selectively etched to be locally thinned, a second insulating layer is formed over the semiconductor layer, a gate electrode is formed over the thinned region of the semiconductor layer and the second insulating layer so as to get across the semiconductor layer, a third insulating layer is formed in contact with the side surface of the gate electrode, the second insulating layer is selectively etched with the third insulating layer and the gate electrode as masks to selectively expose the semiconductor layer, an impurity element is added into the semiconductor layer with the gate electrode and the third insulating layer as masks to form a pair of impurity regions and a channel formation region between the pair of impurity regions in a self-aligned manner, and a metal layer is formed over at least the exposed semiconductor layer and then is subjected to thermal treatment to make part of the region where the semiconductor layer and the metal layer are in contact with each other silicide so that a silicide region is formed in part of the semiconductor layer.

In the above-described structure, the metal layer is preferably formed of a metal element selected from nickel (Ni), titanium (Ti), cobalt (Co), and platinum (Pt), or an alloy material containing the metal element.

Further, in the above-described structure, the conductive layer is formed in contact with the silicide region so that the conductive layer and the impurity regions can be electrically connected to each other.

Further, in the above-described structure, the second insulating layer is formed so as to cover the first insulating layer which is formed in contact with the side surface of the semiconductor layer in the region which overlaps with the gate electrode.

Further, in the above-described structure, the semiconductor layer is preferably selectively etched such that the thickness of the thinned region is in the range of 10 to 25 nm. Therefore, the channel formation region is preferably formed in the region having the thickness of in the range of 10 to 25 nm.

According to the present invention, by locally thinning a semiconductor layer and forming a channel formation region in the thinned region, the operating characteristics of a semiconductor device can be improved. Further, according to the present invention, a defect due to the edge of a semiconductor layer can be prevented, so that a highly reliable semiconductor device can be provided. Thus, higher performance of a semiconductor device can be realized.

DETAILED DESCRIPTION OF THE INVENTION

Figure 1A:
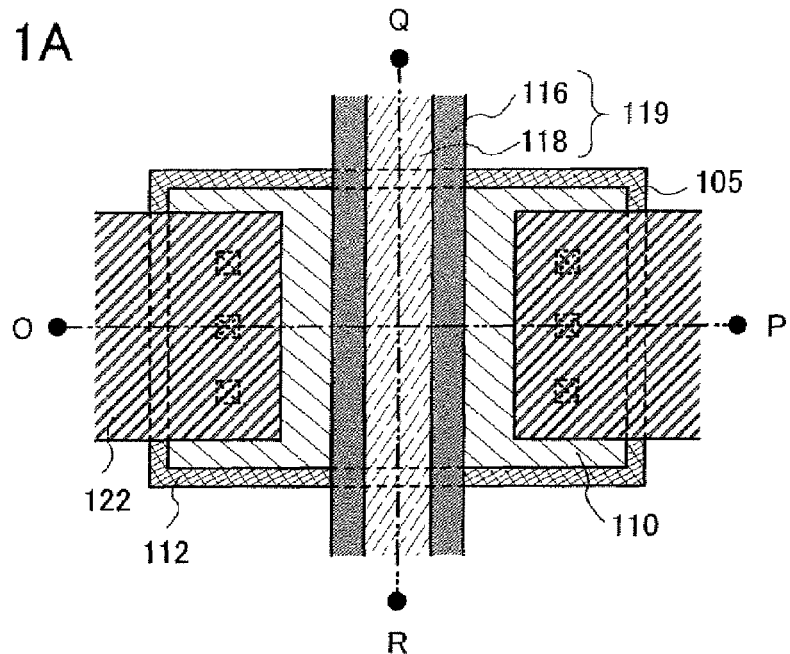
FIGS. 1A to 1C are diagrams showing an example of a main structure of a semiconductor device of the present invention.

Although the present invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. In the structures of the present invention described below, reference numerals for denoting the same elements may be used in common throughout the drawings.

Embodiment Mode 1

Figure 1B:
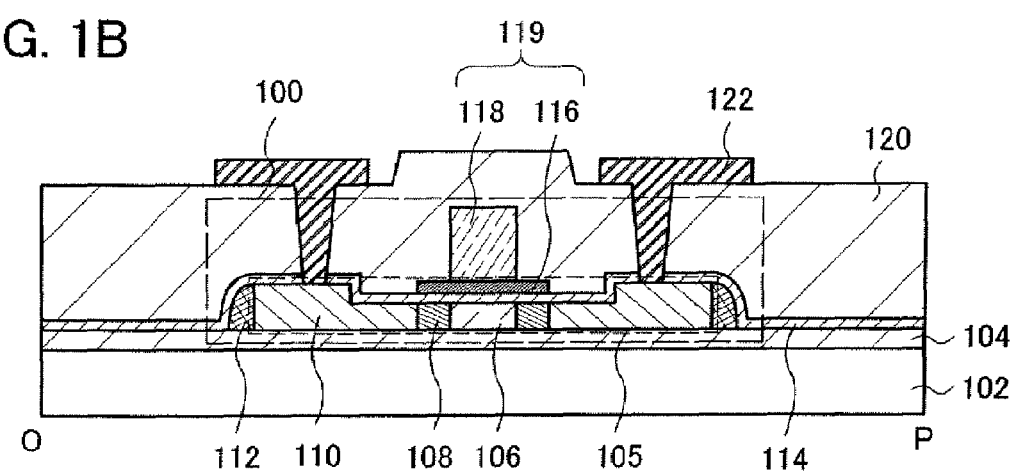
Figure 1C:
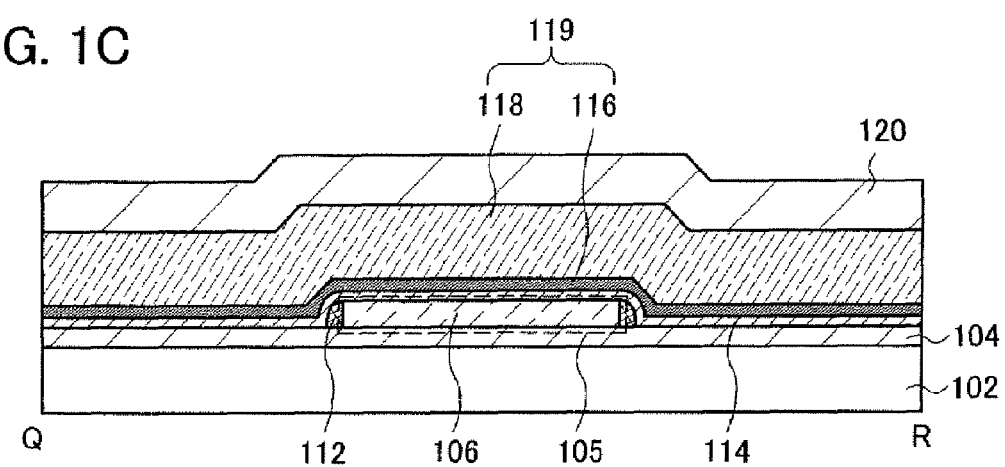

FIG. 1A is a top diagram and FIGS. 1B and 1C are cross-sectional diagrams for describing a main structure of a semiconductor device of the present invention. FIGS. 1A to 1C particularly show a structure of a thin film transistor; FIG. 1A is a top diagram, FIG. 1B is a cross-sectional diagram along a one-dotted dashed line O-P in FIG. 1A, and FIG. 1C is a cross-sectional diagram along a one-dotted dashed line Q-R in FIG. 1A. Note that a thin film and the like are partially omitted in FIG. 1A.

A semiconductor device shown in FIGS. 1A to 1C includes a thin film transistor 100 which is provided over a substrate 102 with an insulating layer 104 interposed therebetween. The thin film transistor 100 includes an island-shaped semiconductor layer 105; an insulating layer 112 which is provided in contact with the side surface of the island-shaped semiconductor layer 105; an insulating layer 114 which is provided over one surface of the semiconductor layer 105; conductive layers 116 and 118 which are provided over the semiconductor layer 105 with the insulating layer 114 interposed therebetween; and conductive layers 122 which form source and drain electrodes, provided over the semiconductor layer 105 with the insulating layer 114 and an insulating layer 120 interposed therebetween. The conductive layers 122 are electrically connected to the semiconductor layer 105 through the insulating layers 114 and 120.

A gate electrode 119 is formed of a stacked-layer structure of the conductive layers 116 and 118. The gate electrode 119 is provided so as to get across the island-shaped semiconductor Layer 105. Although the example in which the gate electrode is formed of the two-layer-stacked structure of the conductive layers 116 and 118 is described here, the present invention is not limited thereto; the gate electrode may employ a single layer structure or a stacked-layer structure including three or more layers. Further, the side surface of the conductive layer included in a gate electrode may be tapered. Further, the gate electrode may employ a stacked-layer structure including two or more conductive layers, and the taper angle may be different in the layers. When the gate electrode is formed of a stacked-layer structure of conductive layers, the width (the length in the direction parallel to a direction for carrier flow in a channel formation region (a direction from source region to drain region)) of the layers may be almost equal to each other, or the width of the lower conductive layer may be larger than that of the upper conductive layer. Further, an insulating layer called a sidewall (hereinafter, also called a sidewall insulating layer) may also be formed in contact with the side surface of the gate electrode.

The island-shaped semiconductor layer 105 includes a locally thinned region. The semiconductor layer 105 includes a channel formation region 106, a pair of impurity regions 108 which function as LDD regions, and a pair of impurity regions 110 which function as a source and drain region. Hereinafter, in this specification, the impurity regions which function as LDD regions are also called low-concentration impurity regions; and the impurity regions which function as a source and drain region are also called high-concentration impurity regions. In this embodiment mode, they are referred to as the low-concentration impurity regions 108 and the high-concentration impurity regions 110.

The thickness of the semiconductor layer 105 is 0.5 to 200 nm, and preferably 10 to 50 nm. Further, the thickness of the thinned region of the semiconductor layer 105 is 0.5 to 30 nm, and preferably 10 to 25 nm.

Further, the edge of the island-shaped semiconductor layer 105 may have a tapered shape. For example, the edge may be tapered at a taper angle of 45° or more and less than 95°, and preferably at a taper angle of 60° or more and less than 95°, or may be gently tapered at a taper angle of less than 45°. Note that the taper angle refers to an inclination angle formed by the side surface of a layer which is tapered to the bottom surface of the same and the bottom surface thereof. In this embodiment mode, the edge has a tapered shape at a taper angle of nearly 90°.

The channel formation region 106 is positioned between the pair of high-concentration impurity regions 110 and each of the low-concentration impurity regions 108 is positioned between the channel formation region 106 and each of the high-concentration impurity regions 110. That is, the channel formation region 106 is positioned between the pair of high-concentration impurity regions 110 and between the pair of low-concentration impurity regions 108, and is in contact with the pair of low-concentration impurity regions 108. The concentration of an impurity element which provides one conductivity type added into the high-concentration impurity regions 110 is higher than that of the low-concentration impurity regions 108. By provision of each of the low-concentration impurity regions 108 between the channel formation region 106 and each of the high-concentration impurity regions 110 in the semiconductor layer 105, an electric field in the periphery of the drain region can be relaxed, and therefore, occurrence of a hot carrier can be suppressed. Occurrence of a hot carrier causes fluctuation of threshold voltage, which may drastically reduce operating characteristics or reliability. In particular, if an element is miniaturized, i.e., the channel length (the length in the direction parallel to a direction for carrier flow in a channel formation region (a direction from source region to drain region)) is decreased, the problem of generating a high electric field in the periphery of the drain region becomes prominent, and therefore, formation of the low-concentration impurity regions which function as LDD regions is very effective.

The channel formation region 106 is formed in the locally thinned region (concave portion) of the semiconductor layer 105. That is, the thickness of the channel formation region 106 is 0.5 to 30 nm, and preferably 10 to 25 nm. By thinning the semiconductor layer 105 in the region for forming the channel formation region 106 to preferably a thickness of 10 to 25 nm, the subthreshold factor (S value) can be decreased and the threshold voltage can be decreased. Consequently, the operating characteristics of a semiconductor device can be improved. One feature of the present invention is to form the channel formation region in the locally thinned region of the semiconductor layer.

The channel formation region 106 is formed in the semiconductor layer 105 in the region which overlaps with the conductive layer 118 included in the gate electrode 119. That is, the gate electrode 119 is formed above the channel formation region 106 so as to get across the semiconductor layer 105. Further, in the channel formation region 106, an impurity element which provides one conductivity type may be added in order to control the threshold voltage of a transistor.

The low-concentration impurity regions 108 are formed in the semiconductor layer 105 in the regions which overlap with the conductive layer 116 and do not overlap with the conductive layer 118 included in the gate electrode 119. The high-concentration impurity regions 110 are at least partially formed in the non-thinned region of the semiconductor layer 105. Further, the high-concentration impurity regions 110 are formed in the semiconductor layer 105 in the regions which do not overlap with the conductive layers 116 and 118 included in the gate electrode 119.

Further, the high-concentration impurity regions 110 are electrically connected to the conductive layers 122 which function as source and drain electrodes through the insulating layers 114 and 120. In this time, part of the high-concentration impurity regions 110 is formed in the non-thinned region of the semiconductor layer 105, and the conductive layers 122 which function as source and drain electrodes are formed so as to be electrically connected to the non-thinned region. By thus doing, when openings in which the conductive layers 122 are formed are formed in the insulating layers 114 and 120, the semiconductor layer (the high-concentration impurity regions) in the periphery of the openings can be prevented from being removed.

Note that, although the example in which the low-concentration impurity regions which function as LDD regions are formed in the semiconductor layer 105 is shown in FIGS. 1A to 1C, the present invention is not limited thereto, and the LDD regions are not necessarily formed. In the case where an LDD region is not formed, it is preferable to employ the structure in which a channel formation region is formed in contact with and between a pair of impurity regions which function as a source and drain region. In this case, when a gate electrode is formed of a stacked-layer structure in which the lower conductive layer has a width which is larger than that of the upper conductive layer as shown in FIGS. 1A and 1B, the channel formation region is preferably formed in the region which roughly overlaps with the upper conductive layer having a smaller width and the impurity regions which function as a source and drain region are preferably formed in the regions which do not roughly overlap with the upper conductive layer. On the other hand, when a gate electrode is formed of a single layer structure or a stacked-layer structure in which the width of the layers is almost equal to each other, the channel formation region is preferably formed in the region which roughly overlaps with the gate electrode and the impurity regions which function as a source and drain region are preferably formed in the regions which do not roughly overlap with the gate electrode.

Further, an LDD region may be formed in the semiconductor layer either in the region which does not overlap with a conductive layer included in a gate electrode or in the region where part of the region overlaps with the conductive layer included in the gate electrode and in the region where part of the region does not overlap with the conductive layer included in the gate electrode. Further, a sidewall insulating layer may be formed in contact with the side surface of a gate electrode and an LDD region may be formed in a semiconductor layer in the region which overlaps with the sidewall insulating layer. Note that, although the example in which the low-concentration impurity regions 108 which function as LDD regions are formed in the locally thinned region of the semiconductor layer is shown in FIG. 1B, they may be formed in the non-thinned region of the semiconductor layer 105 or may be formed so as to be included in both the thinned region and the non-thinned region of the semiconductor layer 105.

Figure 5A:
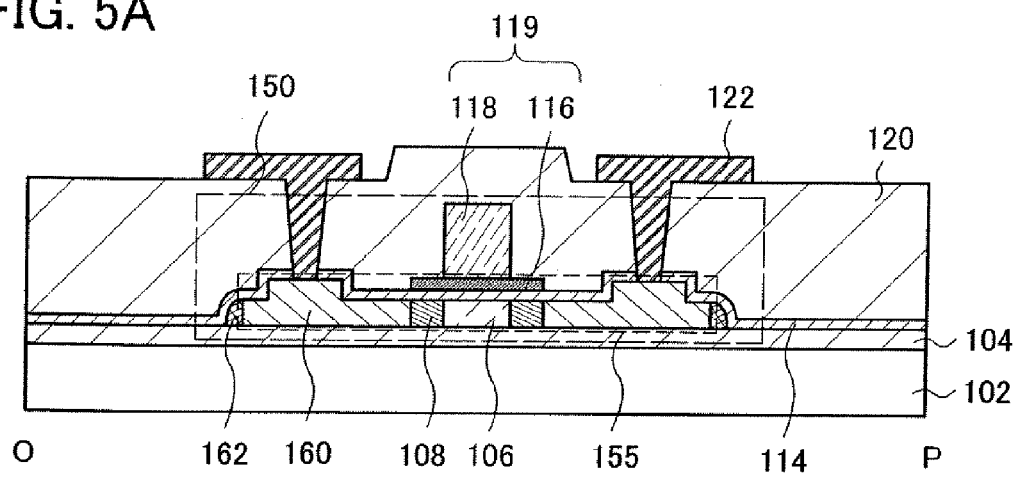
FIGS. 5A to 5C are diagrams showing an example of each of a main structure and a manufacturing method of a semiconductor device of the present invention.

Further, the example in which the high-concentration impurity regions 110 which function as a source and drain region are thin on the sides which are in contact with the low-concentration impurity regions 108 in the region other than the regions which are in contact with the conductive layers 122 to be electrically connected to each other is shown in FIG. 1B; however, the present invention is not limited thereto. For example, as shown in FIG. 5A, high-concentration impurity regions 160 formed in a semiconductor layer 155 may be thin except in the regions which are in contact with the conductive layers 122 to be electrically connected to each other and the periphery thereof. Further alternatively, high-concentration impurity regions may be formed only in the non-thinned region of a semiconductor layer.

The insulating layer 112 (hereinafter, also called side-surface insulating layer 112) is formed in contact with the side surface of the island-shaped semiconductor layer 105. On one surface of the semiconductor layer 105 and so as to be in contact with the side-surface insulating layer 112, the insulating layer 114 is formed. The insulating layer 114 functions as a gate insulating layer of the thin film transistor 100.

The thickness of the insulating layer 114 which functions as the gate insulating layer is 1 to 50 nm, preferably 1 to 20 nm, and more preferably 1 to 10 nm. Thinning of the gate insulating layer is preferable in that a transistor can be operated fast with a low voltage.

The insulating layer 114 is formed so as to cover the semiconductor layer 105 and the side-surface insulating layer 112 which is in contact with the side surface of the semiconductor layer 105. Therefore, the edge of the semiconductor layer 105 can be covered enough with the side-surface insulating layer 112 and the insulating layer 114. Accordingly, a defect caused by insufficiency of coverage with the gate insulating layer at the edge of the semiconductor layer, in particular, a defect caused by insufficiency of coverage with the gate insulating layer in the region where the gate electrode and the edge of the semiconductor layer overlap with each other (the region where the gate electrode goes up the edge of the semiconductor layer) can be prevented. For example, short-circuiting between the semiconductor layer and the gate electrode layer, occurrence of a leakage current, electrostatic breakdown, or the like can be prevented. Consequently, the reliability of a semiconductor device to be completed can be improved.

Here, the surface of the side-surface insulating layer 112, which is not in contact with the side surface of the semiconductor layer 105 is curved. It is preferable that the side-surface insulating layer 112 be provided with a curvature. Further, it is preferable that the side-surface insulating layer 112 be formed such that the thickness is increased downwards (toward the side which is in contact with the insulating layer 104). The side-surface insulating layer 112 having the shape as shown in FIGS. 1A to 1C is also called a sidewall.

Figure 12A:
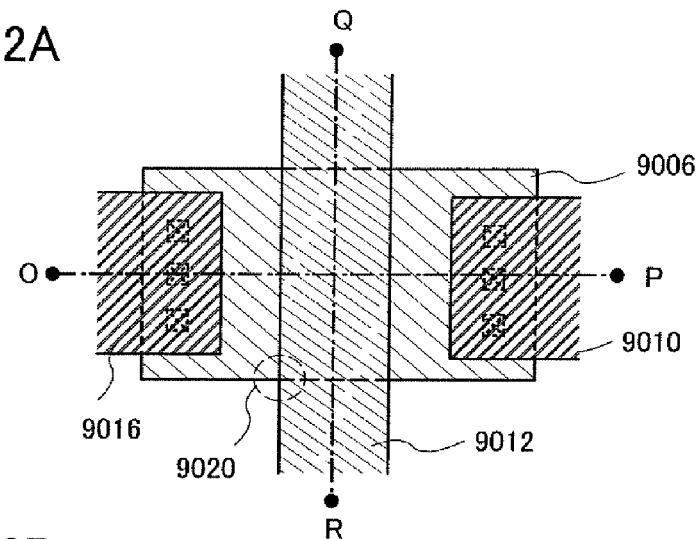
FIGS. 12A to 12C are diagrams showing an example of a structure of a conventional semiconductor device.
Figure 12B:
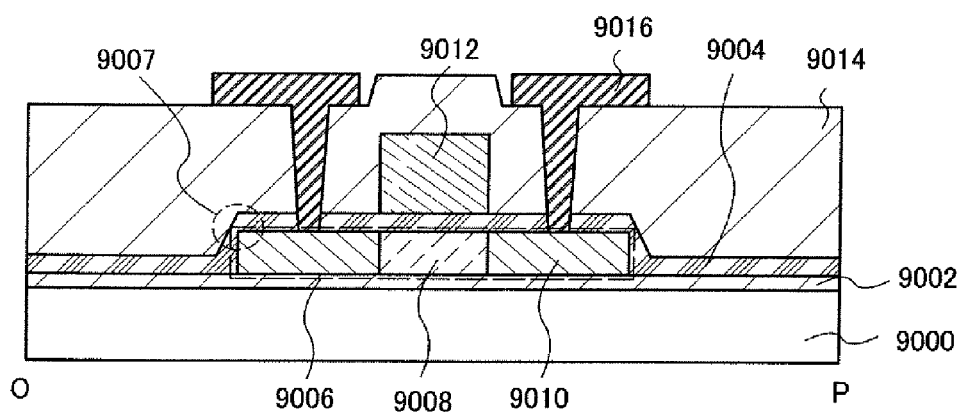
Figure 12C:
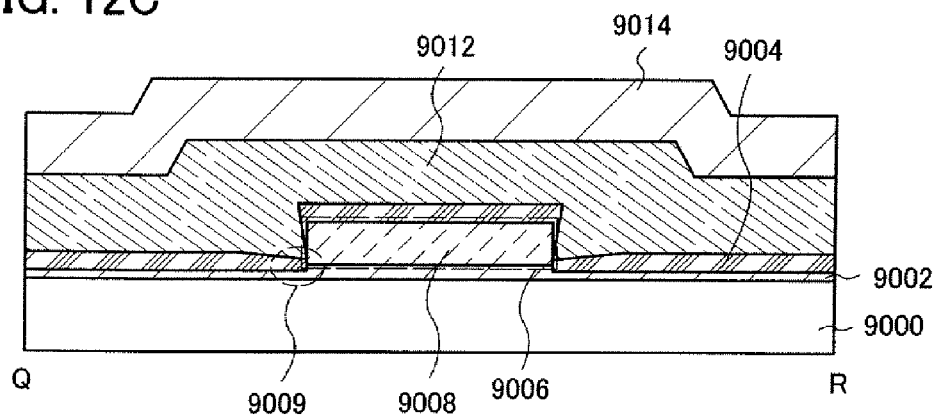

Further, in this embodiment mode, the side-surface insulating layer 112 is formed in contact with the side surface of the semiconductor layer 105 so as to surround the island-shaped semiconductor layer 105. Note that, when the semiconductor layer is formed into an island shape, a defect tends to occur particularly in the region where the gate electrode and the edge of the semiconductor layer overlap with each other (the region where the gate electrode goes up the edge of the semiconductor layer). As causes thereof, the following can be given: the gate insulating layer tends to be locally thin in the region where the gate electrode and the edge of the semiconductor layer overlap with each other; forming process of the semiconductor layer or the gate electrode (the conductive layer) tends to adversely affect the edge of the semiconductor layer and the gate electrode; and the like. For example, as shown by a dashed line 9007 in FIG. 12B, a gate insulating layer 9004 locally becomes thin at the edge of a semiconductor layer 9006. Further, as shown by a dashed line 9009 in FIG. 12C, due to an effect of an etching process, a cleaning process using hydrofluoric acid or the like, or the like in shaping the semiconductor layer 9006 into an island shape, an insulating layer 9002 provided under the semiconductor layer 9006 may be removed and coverage with the gate insulating layer 9004 may decrease. In this case, etching in forming the gate electrode tends to adversely affect in the region denoted by a dashed line 9020. Such an adverse effect of a forming process tends to be prominent as reduction in thickness of the semiconductor layer proceeds in accordance with miniaturization of an element. Therefore, at least in the region where the gate electrode and the edge of the semiconductor layer overlap with each other (the region where the gate electrode goes up the edge of the semiconductor layer), it is preferable to form the insulating layer so as to be in contact with the side surface of the semiconductor layer. One feature of the present invention is to form a side-surface insulating layer so as to be in contact with the side surface of a semiconductor layer.

Note that, it is preferable that the total thickness of the side-surface insulating layer 112 which is formed in contact with the side surface of the semiconductor layer 105 and the insulating layer 114 be larger than that of the insulating layer 114 over the one surface of the semiconductor layer 105. Further, it is also preferable that the dielectric constant of the side-surface insulating layer 112 which is in contact with the side surface of the semiconductor layer 105 be lower than that of the insulating layer 114 over the one surface of the semiconductor layer 105. By controlling the thickness, the dielectric constant, and the like of the insulating layer formed in contact with the semiconductor layer, an electric field applied to the edge of the semiconductor layer 105 can be effectively relaxed and occurrence of a leakage current or the like can be prevented. Accordingly, high-yield manufacturing of semiconductor devices can be realized and the reliability of the semiconductor device can be improved.

Next, one example of a manufacturing method of the semiconductor device shown in FIGS. 1A to 1C is described below using drawings.

Figure 2A:
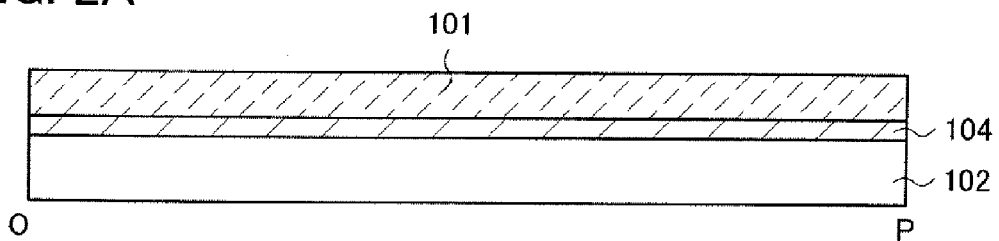
FIGS. 2A to 2E are diagrams showing an example of a manufacturing method of a semiconductor device of the present invention.

A semiconductor layer 101 is formed over the substrate 102 with the insulating layer 104 interposed therebetween (see FIG. 2A).

As the substrate 102, a glass substrate, a quartz substrate, a sapphire substrate, a ceramic substrate, a metal substrate on which an insulating surface is formed, a semiconductor substrate such as a silicon substrate, or the like can be used.

The insulating layer 104 is formed by a CVD method, a sputtering method, an ALD method, or the like using silicon oxide, silicon nitride, silicon oxynitride, silicon nitride oxide, or the like. The insulating layer 104 functions as a base insulating layer. Specifically, the insulating layer 104 functions as a blocking layer for preventing diffusion of an alkali metal or the like from the substrate 102 into the semiconductor layer so that contamination of the semiconductor layer can be prevented. Moreover, the insulating layer 104 also functions as a planarizing layer when the surface of the substrate 102 has roughness. Note that the insulating layer 104 is not necessarily formed if an impurity diffusion from the substrate 102 or roughness of the surface of the substrate 102 does not come to an issue. Further, although the base insulating layer is formed of a single layer structure in this embodiment mode, a stacked-layer structure may be used as well. For example, in the case where the base insulating layer is formed of a stacked-layer structure including two layers, a silicon nitride oxide layer may be formed as the first layer and a silicon oxynitride layer may be formed as the second layer; or a silicon nitride layer may be formed as the first layer and a silicon oxide layer may be formed as the second layer.

The semiconductor layer 101 is preferably formed of a single crystalline semiconductor or a crystalline semiconductor. Further, the semiconductor layer 101 is formed to a thickness in the range of 10 to 200 nm, and preferably in the range of 30 to 50 nm.

For example, the semiconductor layer 101 is preferably formed as follows; a semiconductor layer (e.g., an amorphous semiconductor layer) is formed over an entire surface of the substrate 102 by a CVD method or a sputtering method and then crystallized. As a semiconductor material for forming the semiconductor layer 101, a material containing silicon as its main component is preferably used; specifically, silicon, silicon germanium, or the like can be used Further, germanium may be used as well. As the method for crystallizing the semiconductor layer, a laser crystallization method, a thermal crystallization method using RTA (rapid thermal annealing) or an annealing furnace, a crystallization method using a metal element that promotes crystallization, a method in which a plurality of these methods is combined, or the like can be used.

In the case where a laser crystallization method is used, a laser beam emitted from either a continuous wave laser (hereinafter, also called a CW laser) or a pulsed laser can be used. As a laser that can be used here, there are gas lasers such as an Ar laser, a Kr laser, an excimer laser, a copper vapor laser, and a gold vapor laser; solid lasers such as a laser in which single-crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ is doped with at least one medium selected from among Nd, Yb, Cr, Ti, Ho, Er, Tm, and Ta as dopant, a glass laser, an alexandrite laser, a ruby laser, and a Ti:sapphire laser; and the like. In the case of using the solid laser, any of the fundamental wave to fourth harmonic thereof can be selected as appropriate for irradiation. For example, the second harmonic (532 nm) or the third harmonic (355 nm) of an Nd:YVO$_4$ laser (the fundamental wave: 1064 nm) can he used. At this time, a laser power density of about 0.01 to 100 MW/cm$^2$ (preferably, 0.1 to 10 MW/cm$^2$) is required, and irradiation is conducted with a scanning rate of about 10 to 2000 cm/sec. Note here that the second harmonic (532 nm) is preferably used; this is because the second harmonic is superior in energy efficiency to the harmonics higher than this.

When a laser crystallization method is performed with a CW laser, energy can be continuously applied to the semiconductor layer; therefore, once the semiconductor layer is in a melted state, the melted state can be continued. Moreover, a solid-liquid interface of the semiconductor layer can be moved by scanning the CW laser, and crystal grains which are long in one direction along this moving direction can be formed. At this time, a solid-state laser is preferable because highly stable output and stable processing can he expected as compared with a gas laser or the like. Note that, with not only a CW laser but also a pulsed laser with a repetition rate of greater than or equal to 10 MHz, an effect which is similar to that of the CW laser can be obtained. With a pulsed laser having a high repetition rate, when the pulse interval of the laser is shorter than a period for solidifying the melted semiconductor layer, the semiconductor layer can constantly be in the melted state, which enables the semiconductor layer to have crystal grains that are long in one direction by the movement of the solid-liquid interface. Further, oscillation of a laser beam in TEM$_{00}$ (a single transverse mode) for irradiation is suitable because the energy uniformity of a linear beam spot on the irradiated surface can be increased.

In this embodiment mode, an amorphous silicon layer is formed and then crystallized by a laser crystallization method so that a crystalline silicon layer with a thickness of 50 nm is formed as the semiconductor layer 101.

Note that, although the example on which the semiconductor layer 101 is formed using a crystallization method is described in this embodiment mode, an SOI substrate in which a single crystalline semiconductor layer is provided over an insulating surface may be used as well instead of performing such a thin-film process. In this case, the single crystalline semiconductor layer provided over the insulating surface corresponds to the semiconductor layer 101.

Figure 2B:
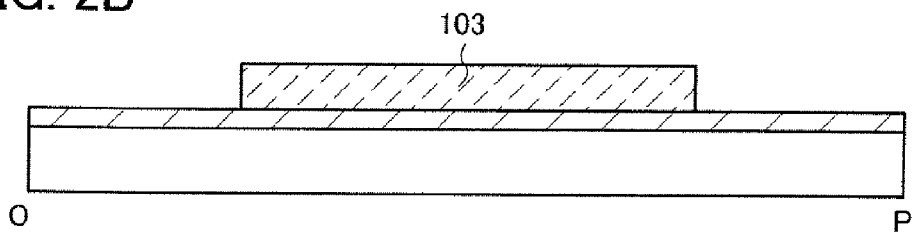
Figure 4A:
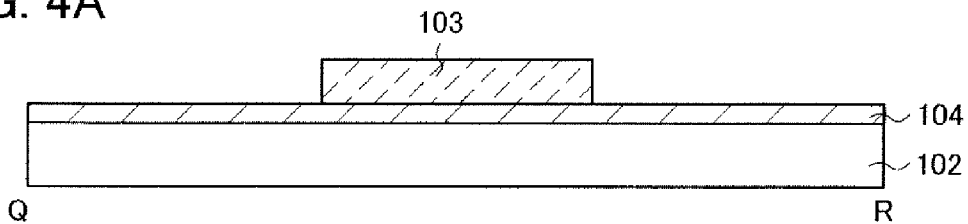
FIGS. 4A to 4E are diagrams showing an example of a manufacturing method of a semiconductor device of the present invention.
Figure 6A:
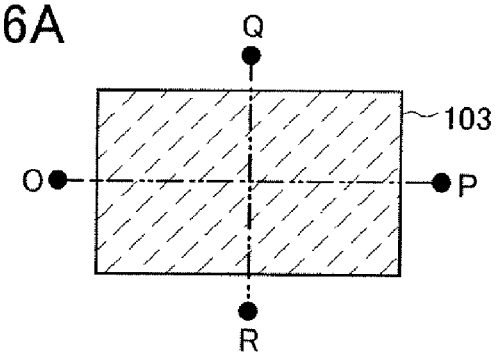
FIGS. 6A to 6D are diagrams showing an example of a manufacturing method of a semiconductor device of the present invention.

Next, the semiconductor layer 101 is selectively etched to form an island-shaped semiconductor layer 103 (see FIGS. 2B, 4A, and 6A).

The semiconductor layer 103 is formed into an island shape by selectively covering the semiconductor layer 101 with a resist mask and etching the portion of the semiconductor layer 101 which is not covered with the resist mask. After formation of the island-shaped semiconductor layer 103, the resist mask is removed.

As the method for forming the island-shaped semiconductor layer 103 by etching the semiconductor layer 101, dry etching or wet etching can be used. In the case of performing dry etching, an etching gas which can provide high etching selection ratio with respect to the base insulating layer is used. That is, an etching gas which can provide low etching rate with respect to the insulating layer 104 whereas can provide high etching rate with respect to the semiconductor layer 101 is preferably used here. As the etching gas, a chlorine-based gas such as Cl$_2$, BCl$_3$, or SiCl$_4$, a fluorine-based gas such as CF$_4$, NF$_3$, or SF$_6$, or an HBr gas can be used. Furthermore, an inert gas such as He, Ar, or Xe may be added as needed. Further, an O$_2$ gas may be added to a fluorine-based gas as appropriate.

Note that the semiconductor layer 103 may be formed such that the edge is either near-perpendicularly tapered or gently tapered. For example, the edge may be tapered at a taper angle of 45° or more and less than 95°, and preferably 60° or more and less than 95°, or may be gently tapered at a taper angle of less than 45°. The shape of edge of the semiconductor layer 103 can be selected as appropriate by changing the etching condition or the like.

Figure 2C:
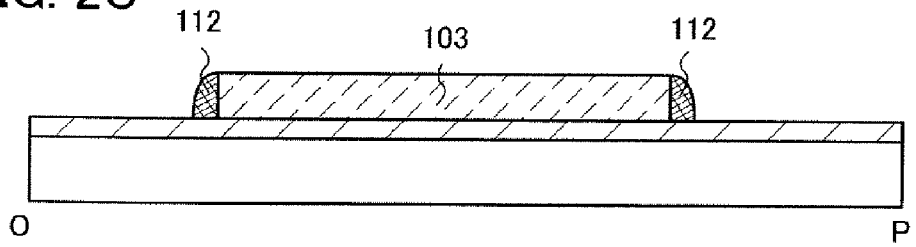
Figure 4B:
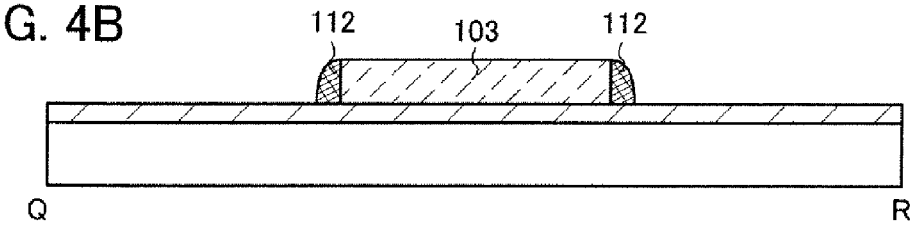
Figure 6B:
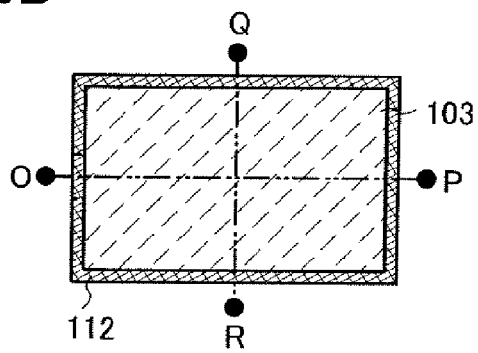

Next, an insulating layer is formed to envelop the semiconductor layer 103 and is selectively etched by anisotropic etching mainly in a perpendicular direction to form the side-surface insulating layer 112 which is in contact with the side surface of edge of the semiconductor layer 103 (see FIGS. 2C, 4B, and 6B).

The side-surface insulating layer 112 is formed as follows; an insulating layer is formed of a material such as silicon oxide, silicon nitride, silicon oxynitride, silicon nitride oxide, SiOF, SiOC, DLC, porous silica, or the like by a CVD method or a sputtering method, and then selectively etched. At this time, the insulating layer formed so as to envelop the semiconductor layer is formed with a thickness which is large enough to cover at least edge of the island-shaped semiconductor layer 103. Specifically, the thickness of the insulating layer is preferably in the range of 1.5 to 3 times as large as that of the semiconductor layer 103.

Further, the etching for forming the side-surface insulating layer 112 is preferably performed by anisotropic etching mainly in a perpendicular direction. For example, dry etching such as reactive ion etching (RIE) can be used. The reactive ion etching is classified depending on a plasma generation method into a parallel-plate type, a magnetron type, a dual-frequency type, an ECR type, a helicon type, an ICP type, or the like. As an etching gas used at this time, a gas which can provide high etching selection ratio of the insulating layer for forming the side-surface insulating layer 112 with respect to the semiconductor layer 103 is used. In the case where the side-surface insulating layer 112 is formed of an insulating layer containing silicon, for example, a fluorine-based gas such as $CHF_3$, $CF_4$, $C_4F_8$, $C_2F_6$, or the like can be used. Further, an inert gas such as He, Ar, or Xe, an $O_2$ gas, or an $H_2$ gas may be added as needed.

The shape of the side-surface insulating layer 112 can be changed by the material for forming the thin film, the etching condition, or the like being controlled as appropriate. In this embodiment mode, the side-surface insulating layer 112 is formed such that the surface thereof which is not in contact with the side surface of the semiconductor layer 103 is curved. There is no particular limitation on the shape of the side-surface insulating layer 112; however, it is preferably a rounded shape. Further, it is preferable that the side-surface insulating layer 112 be formed such that the thickness is increased downwards (toward the side which is in contact with the insulating layer 104). Preferably, the surface of the side-surface insulating layer 112, which is not in contact with the semiconductor layer 103 has a gentle curve so that the coverage with a layer formed thereover (here, the insulating layer 114) can be improved. Note that the etching condition refers to an amount of electric power which is applied to an electrode provided with a substrate, the temperature of the electrode provided with a substrate, the pressure in a chamber, and the like in addition to the kind of etching gas and a gas flow rate.

Figure 2D:
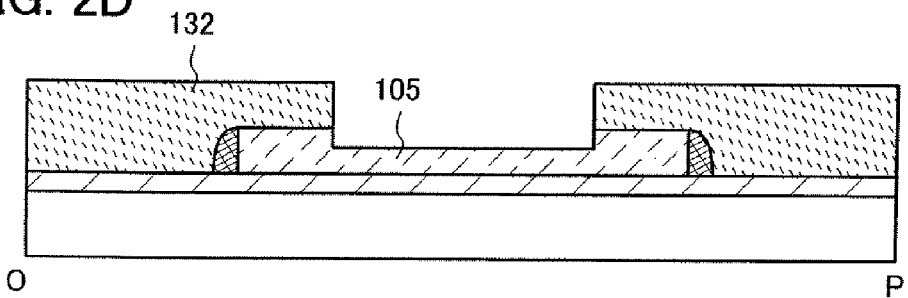
Figure 4C:
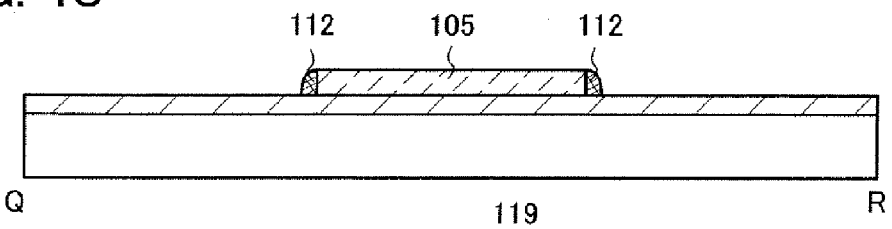
Figure 6C:
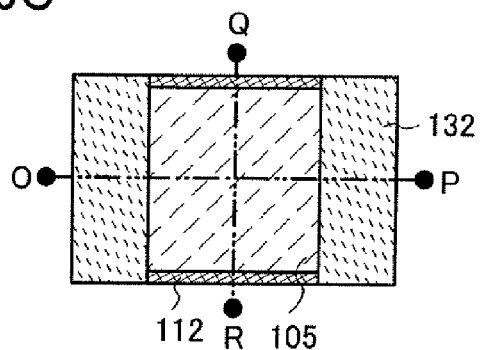

Next, the semiconductor layer 103 is locally thinned to form the semiconductor layer 105 (see FIGS. 2D, 4C, and 6C).

The semiconductor layer 105 is locally thinned by selective etching of the semiconductor layer 103. Specifically, the semiconductor layer 103 is selectively covered with a resist mask 132 and the semiconductor layer 103 in the region which is not covered with the resist mask 132 is etched so that the semiconductor layer 103 is locally thinned. At this time, the etching condition is controlled such that the semiconductor layer with a desired thickness is left in the region which is not covered with the resist mask 132. The etching of the semiconductor layer 103 is preferably performed mainly in a perpendicular direction from the side of the semiconductor layer 103 on which the resist mask 132 is formed to the side which is in contact with the insulating layer 104. After the etching, the formed semiconductor layer 105 has a depression and the depression corresponds to a thinned region. After the semiconductor layer 105 having a desired shape is formed, the resist mask 132 is removed.

As the method for thinning the semiconductor layer 103, dry etching or wet etching can be performed. For example, in the case of dry etching, a chlorine-based gas such as $Cl_2$, $BCl_3$, or $SiCl_4$, a fluorine-based gas such as $CF_4$, $NF_3$, or $SF_6$, or an HBr gas can be used. Further, an inert gas such as He, Ar, or Xe may be added as needed. Further, an $O_2$ gas may be added into a fluorine-based gas as well. Alternatively, the quality of the semiconductor layer 103 in the region which is not covered with the resist mask 132 is partially changed and the quality-changed region can be selectively etched. Quality change of the semiconductor layer refers to oxidation treatment, nitridation treatment, or the like of the semiconductor layer, and the quality of the region to be etched is changed by a desired treatment.

The thickness of the semiconductor layer 105 is in the range of 0.5 to 200 nm, and preferably in the range of 10 to 50 nm. Further, the thickness of the semiconductor layer 105 in the thinned region is 0.5 to 30 nm, and preferably in the range of 10 to 25 nm. In this embodiment mode, the semiconductor layer 105 in the non-thinned region which is covered with the resist mask 132 is 50 nm thick and the semiconductor layer 105 in the thinned region is 10 nm thick.

Note that, in thinning the semiconductor layer 103, the etching is preferably performed such that the perpendicular height from the bottom surface (the surface which is in contact with the insulating layer 104) is almost the same in the semiconductor layer 105 and the side-surface insulating layer 112 in the region which is not covered with the resist mask 132. That is, the semiconductor layer 103 and the side-surface insulating layer 112 may be etched by the etching condition in which the etching rates thereof are almost the same as each other, that is, the etching selection ratio is close to 1; this can be realized, for example, by addition of an $O_2$ gas into a fluorine-based etching gas as needed. Further, instead of the etching gas in which an $O_2$ gas is added into a fluorine-based gas, an HBr gas or a mixed gas of HBr and $Cl_2$ may be used. In this case, an inert gas such as He or Ar may be added into the etching gas as needed.

Figure 2E:
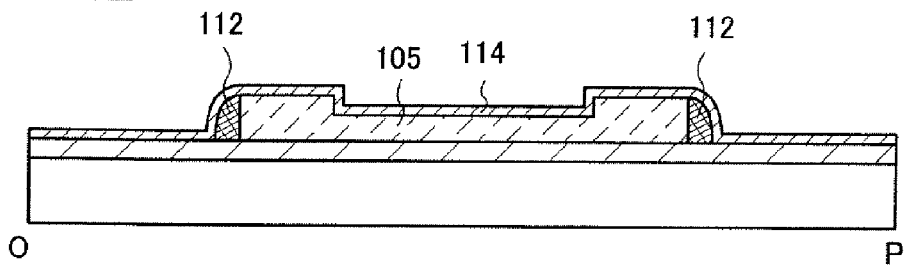

Next, an insulating layer 114 is formed over the semiconductor layer 105 and the side-surface insulating layer 112 (see FIG. 2E).

The insulating layer 114 is formed by a CVD method, a sputtering method, an ALD method, or the like to have a single layer structure or a stacked-layer structure using silicon oxide, silicon nitride, silicon oxynitride, silicon nitride oxide, aluminum nitride, or the like. The insulating layer 114 is formed to have a thickness of 1 to 50 nm, preferably 1 to 20 nm, and more preferably 1 to 10 nm. In this embodiment mode, a silicon oxynitride layer is formed with a thickness of 5 nm as the insulating layer 114.

Further, the insulating layer 114 can be formed by solid phase oxidation or solid phase nitridation with plasma treatment as well. For example, the semiconductor layer 105 and the side-surface insulating layer 112 may be oxidized or nitrided by plasma treatment to form the insulating layer 114. By oxidizing or nitriding the semiconductor layer 105 and the side-surface insulating layer 112 with plasma treatment, the dense and highly reliable insulating layer 114 in which the withstand voltage is high can be formed.

In the solid phase oxidation treatment or solid phase nitridation treatment by plasma treatment, plasma which is excited by high-frequency waves such as microwaves (typically, 2.45 GHz) and has an electron density of $1 \times 10^{11}$ cm$^{-3}$ or more and $1\times10^{13}$ cm$^{-3}$ or less and electron temperatures of 0.5 eV or more and 1.5 eV or less is preferably used. This is because, in the solid phase oxidation treatment or solid phase nitridation treatment at temperatures of 500° C. or less, a dense insulating layer is formed and a practical reaction speed is obtained.

When the surfaces of the semiconductor layer 105 and the side-surface insulating layer 112 are oxidized by plasma treatment, the plasma treatment is performed in an atmosphere containing oxygen (e.g., an atmosphere containing oxygen ($O_2$), ozone ($O_3$), dinitrogen monoxide ($N_2O$), nitric monoxide (NO), or nitrogen dioxide ($NO_2$), and a rare gas (at least one of helium (He), neon (Ne), argon (Ar), krypton (Kr), and xenon (Xe)), or an atmosphere containing oxygen ($O_2$), ozone ($O_3$), dinitrogen monoxide ($N_2O$), nitric monoxide (NO), or nitrogen dioxide ($NO_2$), hydrogen ($H_2$), and a rare gas). On the other hand, when the surfaces of the semiconductor layer 105 and the side-surface insulating layer 112 are nitrided by plasma treatment, the plasma treatment is performed in an atmosphere containing nitrogen (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may be used as well.

Figure 14:
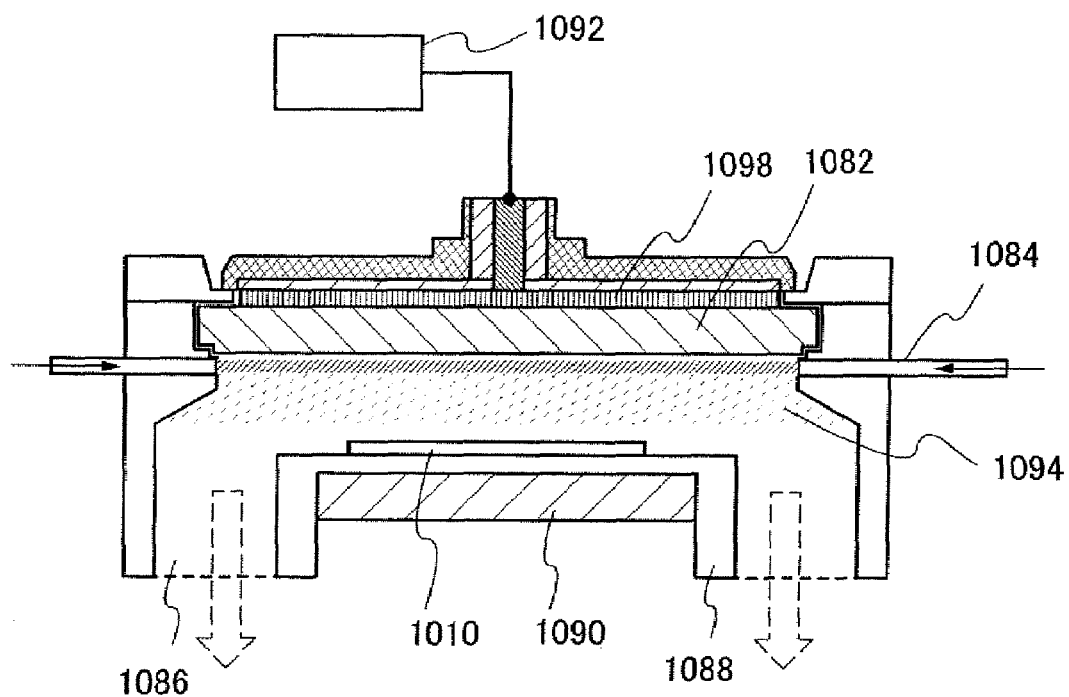
FIG. 14 is a diagram showing an example of a structure of plasma processing equipment.

FIG. 14 shows an example of structure of plasma processing equipment 1080 for performing plasma process. The plasma processing equipment 1080 includes a support 1088, a gas supplying portion 1084 for supplying a gas, an exhaust port 1086 connected to a vacuum pump for exhausting a gas, an antenna 1098, a dielectric plate 1082, and a high-frequency wave supplying portion 1092 for supplying high-frequency waves for plasma generation. An object to be processed 1010 is held by the support 1088. In addition, by provision of a temperature controlling portion 1090 for the support 1088, the temperature of the object to be processed 1010 can also be controlled. The object to be processed 1010 is a body to which plasma treatment is performed, and corresponds to a stack in which the insulating layer 104, the island-shaped semiconductor layer 105, and the side-surface insulating layer 112 which is in contact with the side surface of the island-shaped semiconductor layer 105 are stacked in order over the substrate 102 in this embodiment mode.

Hereinafter, a specific example in which an insulating layer is formed on the surface of the semiconductor layer with the plasma processing equipment 1080 shown in FIG. 14 is described. Note that plasma treatment includes, in its category, oxidation treatment, nitridation treatment, oxynitridation treatment, hydrogenation treatment, and surface modification treatment performed to a substrate, a semiconductor layer, an insulating layer, and a conductive layer. For such a treatment, a gas supplied from the gas supplying portion 1084 may be selected in accordance with an intended purpose.

First, a processing chamber of the plasma processing equipment 1080 shown in FIG. 14 is made in vacuum and a gas containing a rare gas and oxygen or nitrogen is supplied from the gas supplying portion 1084. The object to be processed 1010 is heated at room temperature or at temperatures of 100° C. or more and 550° C. or less by the temperature controlling portion 1090. The distance between the object to be processed 1010 and the dielectric plate 1082 (hereinafter, also called an electrode interval) is approximately 20 mm or more and 200 mm or less (preferably 20 mm or more and 60 mm or less).

Next, high-frequency waves are supplied from the high-frequency wave supplying portion 1092 to the antenna 1098. Here, microwaves (frequency: 2.45 GHz) are input as the high-frequency waves. Then, the microwaves are introduced from the antenna 1098 into the processing chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated by the gas supplied.

When the plasma 1094 is generated by introducing high-frequency waves such as microwaves, plasma which has the low electron temperature (3 eV or lower, preferably 1.5 eV or lower) and the high electron density ($1\times10^{11}$ cm$^{-3}$ or more) can be generated. Specifically, plasma which has electron temperatures of 0.5 eV or more and 1.5 eV or less and an electron density of $1\times10^{11}$ cm$^{-3}$ or more and $1\times10^{13}$ cm$^{-3}$ or less is preferably generated. Note that, in this specification, plasma which has low electron temperature and high electron density generated by introducing microwaves is also called high-density plasma. Further, plasma treatment utilizing high-density plasma is also called high-density plasma treatment.

With the oxygen radicals (containing an OH radical in some cases) and/or nitrogen radicals (containing an NH radical in some cases) generated by the plasma 1094, the surface of the semiconductor layer formed in the object to be processed 1010 is oxidized or nitrided, whereby an insulating layer is formed. In this case, if the rare gas such as argon is mixed in the gas supplied, oxygen radicals or nitrogen radicals can be generated efficiently by excited species of the rare gas. Note that, in the case where the rare gas is used in the gas supplied, the rare gas may be contained in the insulating layer formed. By effective use of active radicals excited by plasma, oxidation or nitridation by a solid phase reaction can be performed at low temperatures of 500° C. or less.

As one preferable example of the insulating layer 114 formed by high-density plasma treatment using the equipment shown in FIG. 14, a silicon oxide layer is formed on one surface of the semiconductor layer 105 to have a thickness of 3 to 6 nm by plasma treatment in an atmosphere containing oxygen, and the surface of the silicon oxide layer is treated with nitridation plasma in an atmosphere containing nitrogen to form a nitrogen-plasma-treated layer (a silicon nitride layer). Specifically, first, a silicon oxide layer is formed on one surface of the semiconductor layer 105 by plasma treatment in an atmosphere containing oxygen to have a thickness of 3 to 6 nm. Then continuously, the plasma treatment in an atmosphere containing nitrogen is performed, whereby a nitrogen-plasma-treated layer with high nitrogen concentration is provided on the surface of the silicon oxide layer or in the periphery of the surface. Note that the "periphery of the surface" refers to a region in a depth of approximately 0.5 to 1.5 nm from the top surface of the silicon oxide layer For example, by performing plasma treatment in an atmosphere containing nitrogen, the structure in which nitrogen is contained at a rate of 20 to 50 at. % in a region of the silicon oxide layer in a depth of approximately 1 nm in a perpendicular direction from the top surface thereof is obtained. Further, the high-density plasma treatment can also oxidize or nitride the surface of the insulating layer 114.

For example, by oxidizing the surface of a silicon layer, which is formed as the semiconductor layer 105, with plasma treatment, a dense oxide layer which is not distorted in the interface can be formed. Further, by nitriding the oxide layer with plasma treatment, by which oxygen is substituted for nitrogen in the top most surface layer portion to form a nitride layer, further densification can be performed. In this manner, an insulating layer in which the withstand voltage is high can be formed.

In either case, by the solid phase oxidation or solid phase nitridation with plasma treatment as described above, an insulating layer which is equivalent to a thermally-oxidized film which is formed at temperatures of 950° C. to 1050° C. can be obtained even if a glass substrate in which the allowable temperature limit is 700° C. or lower. That is, a highly reliable insulating layer can be formed as an insulating layer which functions as a gate insulating film in a semiconductor element, in particular, a thin film transistor or a nonvolatile memory element.

Further, the insulating layer 114 may be formed of a high-permittivity material as well. By using a high-permittivity material for the insulating layer 114, leakage current can be reduced. As the high-permittivity material, zirconium dioxide, hafnium oxide, titanium dioxide, tantalum pentoxide, or the like can be used. Further, an insulating layer is formed of a high-permittivity material, and then a silicon oxide layer may be stacked by solid-phase oxidation by plasma treatment.

The insulating layer 114 formed as above functions as a gate insulating layer By thus forming the side-surface insulating layer 112 which is in contact with the side surface of the semiconductor layer, coverage with the gate insulating layer at the edge of the semiconductor layer can be improved. Further, even in the case where the insulating layer under the edge of the semiconductor layer and in the periphery thereof (the base insulating layer) is removed by cleaning using fluorinated acid or the like accompanied with etching or various steps for processing the semiconductor layer into an island shape, the semiconductor layer can be sufficiently covered. Accordingly, short-circuiting between the semiconductor layer and the gate electrode layer, occurrence of a leakage current, electro-static discharge, or the like due to insufficiency of coverage with the gate insulating layer at the edge of the semiconductor layer can be prevented.

Figure 3A:
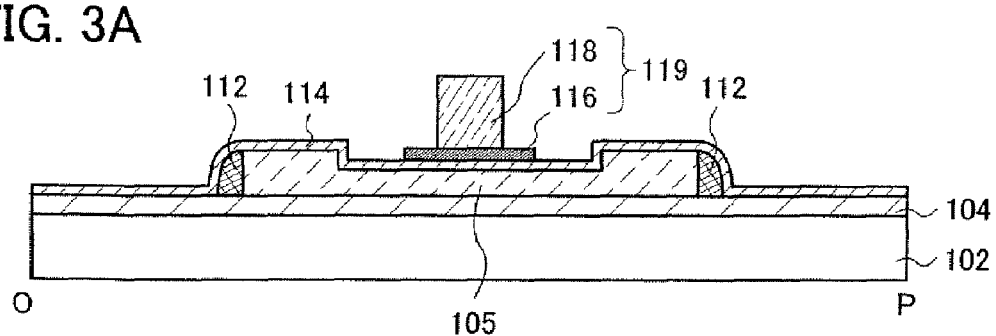
FIGS. 3A to 3D are diagrams showing an example of a manufacturing method of a semiconductor device of the present invention.
Figure 4D:
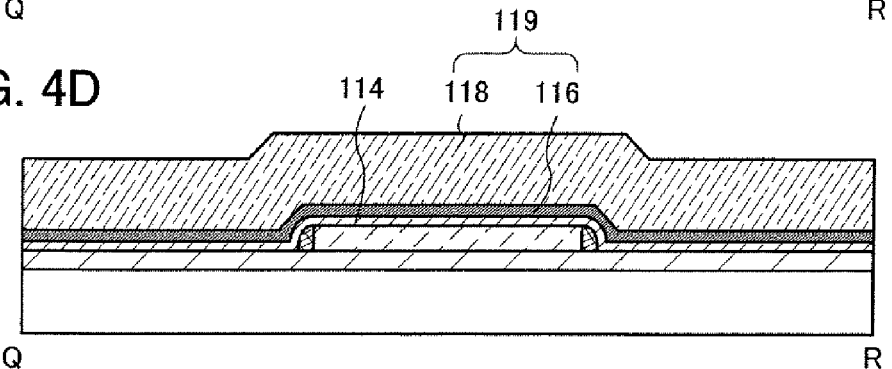
Figure 6D:
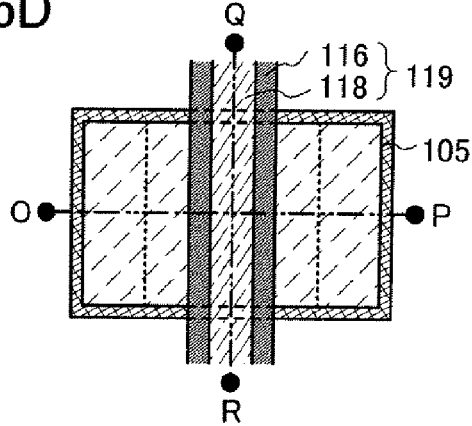

Next, the conductive layers 116 and 118 which function as the gate electrode 119 are formed over the semiconductor layer 105 with the insulating layer 114 interposed therebetween (see FIGS. 3A, 4D, and 6D). The gate electrode 119 is formed above the semiconductor layer 105 in the locally thinned region. That is, the gate electrode 119 is formed so as to get across the semiconductor layer 105 over the channel formation region 106.

Each of the conductive layers included in the gate electrode 119 is formed as follows; a conductive layer is formed over an entire surface of the substrate by using a conductive material by a CVD method or a sputtering method, and then processed into a desired shape by selective etching of the conductive layer. As the conductive material, a metal element such as tantalum (Ta), tungsten (W), titanium (Ti), molybdenum (Mo), chromium (Cr), aluminum (Al), copper (Cu), or niobium (Nb), or an alloy material or a compound material containing the above-described metal element can be used. Further, a semiconductor material typified by polycrystalline silicon to which an impurity element which provides one conductivity type, such as phosphorus has been added can be used as well. The gate electrode 119 is formed of at least one of the above materials to have a single layer structure or a stacked-layer structure. The gate electrode 119 is formed to have a thickness of 50 to 1000 nm, preferably 100 to 800 nm, and more preferably 200 to 500 nm.

In this embodiment mode, the conductive layers 116 and 118 included in the gate electrode 119 are formed to have a stacked-layer structure of a tantalum nitride layer with a thickness of 20 nm and a tungsten layer with a thickness of 370 nm. Further, the gate electrode 119 is formed such that the width of the lower conductive layer 116 (the tantalum nitride layer) is larger than that of the upper conductive layer 118 (the tungsten layer). Note that the width of the conductive layers may be almost equal to each other, and the side surface of the conductive layer may be tapered. Further, a sidewall insulating layer may also be formed in contact with the side surface of the gate electrode.

The gate electrode 119 is formed above the semiconductor layer 105 in the locally thinned region. Therefore, it is preferable that the thinned region be large because of easiness of formation of the gate electrode.

Figure 3B:
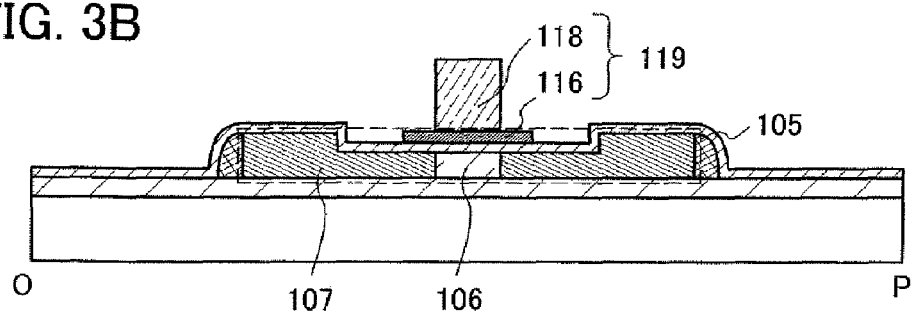
Figure 7A:
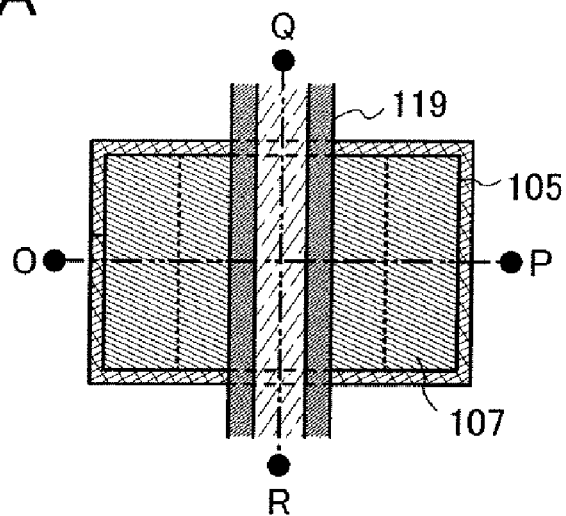
FIGS. 7A to 7C are diagrams showing an example of a manufacturing method of a semiconductor device of the present invention.

Next, an impurity element which provides one conductivity type is selectively added into the semiconductor layer 105 at a first concentration, whereby a pair of low-concentration impurity regions 107 and the channel formation region 106 are formed (see FIGS. 3B and 7A). Here, the impurity element is added with the conductive layer 118 as a mask so that the pair of low-concentration impurity regions 107 and the channel formation region 106 positioned between the pair of low-concentration impurity regions 107 are formed in a self-aligned manner. Part of the low-concentration impurity regions 107 formed at this time forms LDD regions later. As the impurity element which provides one conductivity type, an element which provides a p-type conductivity such as boron (B), aluminum (Al), or gallium (Ga) or an element which provides an n-type conductivity such as phosphorus (P) or arsenic (As) can be used. In this embodiment mode, as the impurity element, phosphorus that is an element which provides an n-type conductivity can be added to be contained at a peak concentration of about $1 \times 10^{18}$ cm$^{-3}$.

Figure 3C:
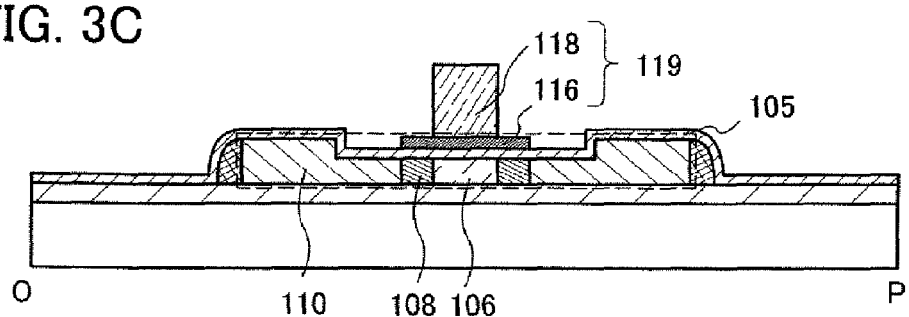
Figure 7B:
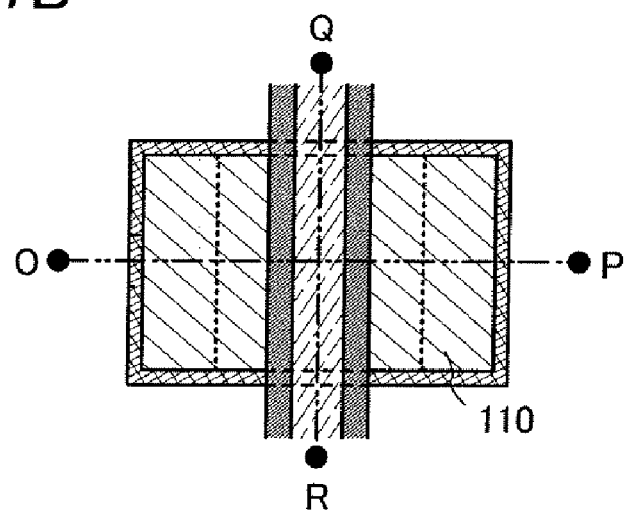

Next, an impurity element which provides one conductivity type is selectively added into the semiconductor layer 105 at a second concentration, whereby the pair of high-concentration impurity regions 110 and the pair of low-concentration impurity regions 108 are formed (see FIGS. 3C and 7B). Here, the impurity element is added with the conductive layers 116 and 118 as masks so that the pair of high-concentration impurity regions 110 and the pair of low-concentration impurity regions 108 are formed in a self-aligned manner. The high-concentration impurity regions 110 formed at this time function as a source and drain region, and the low-concentration impurity regions 108 function as LDD regions. As the impurity element which provides one conductivity type, an impurity element which provides the same conductivity type as the element which is added for forming the above-described low-concentration impurity regions 107 can be used. Note that, when the impurity elements are added, the second concentration is set to be higher than the first concentration. Therefore, the concentration of the impurity element in the high-concentration impurity regions 110 is higher than that of the low-concentration impurity regions 108. In this embodiment mode, as the impurity element, phosphorus which provides an n-type conductivity is added to be contained at a peak concentration of about $1 \times 10^{21}$ cm$^{-3}$.

Through the above, the channel formation region 106, the pair of low-concentration impurity regions 108, and the pair of high-concentration impurity regions 110 are formed in the semiconductor layer 105. The channel formation region 106 is positioned between the pair of high-concentration impurity regions 110, and each of the low-concentration impurity regions 108 is formed in contact with and between each of the high-concentration impurity regions 110 and the channel formation region 106. The channel formation region 106 is formed in the semiconductor layer 105 in the region which overlaps with the conductive layer 118. The low-concentration impurity regions 108 are formed in the semiconductor layer 105 in the regions which overlap with the conductive layer 116 but do not overlap with the conductive layer 118+ The high-concentration impurity regions 110 are formed in the semiconductor layer 105 in the regions which do not overlap with the conductive layers 116 and 118 (see FIGS. 3C and 7B).

In the present invention, the channel formation region is formed in the thinned region of the island-shaped semiconductor layer. By thinning the semiconductor layer in the region for forming the channel formation region, the subthreshold characteristics ($I_D$-$V_G$ characteristics where the gate voltage is equal to or lower than the threshold voltage) can be improved, the subthreshold factor (S value) can be decreased, and the threshold voltage of a transistor can be decreased. Consequently, the operating characteristics can be improved.

Further, in order to control the threshold voltage of a transistor, an impurity element which provides one conductivity type may be added into the channel formation region 106. By addition of the impurity element at a certain concentration into the channel formation region 106, the threshold voltage of a transistor can be shifted forcibly to a desired threshold voltage. As the impurity element which provides one conductivity type, an element which provides a p-type conductivity such as boron (B), aluminum (Al), or gallium (Ga) or an element which provides an n-type conductivity such as phosphorus (P) or arsenic (As) can be used. The element which provides a p-type conductivity can be used in this embodiment mode, and for example, boron can be added so as to be contained at concentrations of about $1 \times 10^{16}$ cm$^{-3}$ or more to $1 \times 10^{18}$ cm$^{-3}$ or less. Note that addition of the impurity element into the channel formation region 106 may be performed before the gate electrode 119 is formed Note that, after the impurity element which provides one conductivity type is added into the semiconductor layer 105, thermal treatment is preferably performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 650° C. Further, the thermal treatment is preferably performed in a nitrogen atmosphere. For example, activation can be performed by heating at 550° C. for 4 hours.

Further, when the side-surface insulating layer 112 is formed, the semiconductor layer becomes amorphous partially in some cases depending on the etching condition or the material, the thickness, or the like of each thin film In this case, by performing thermal treatment, recrystallization of the semiconductor layer can be performed together with activation.

Figure 3D:
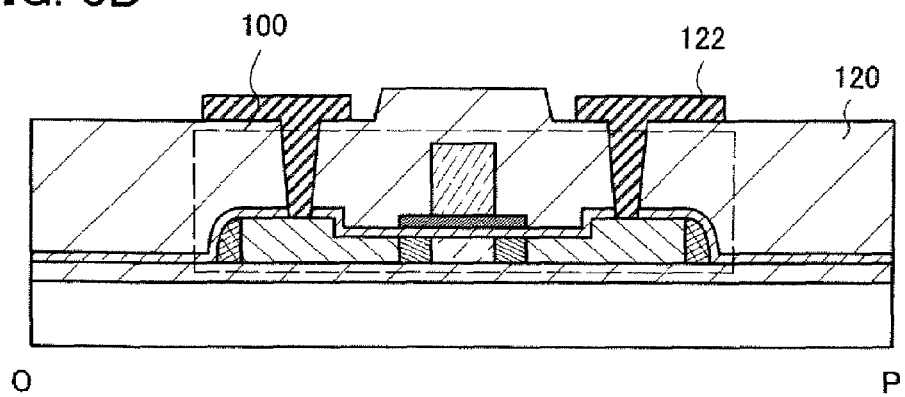
Figure 4E:
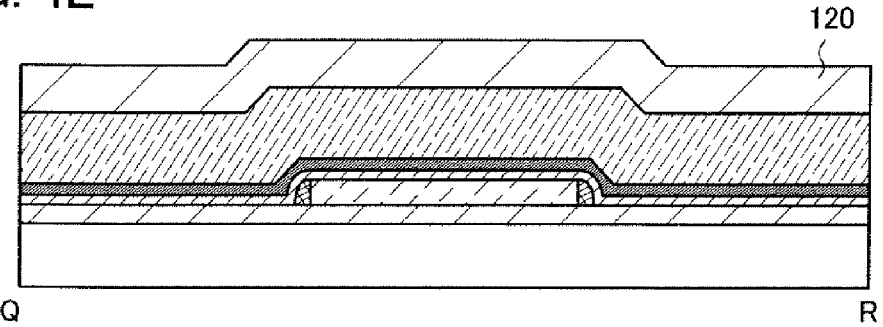
Figure 7C:
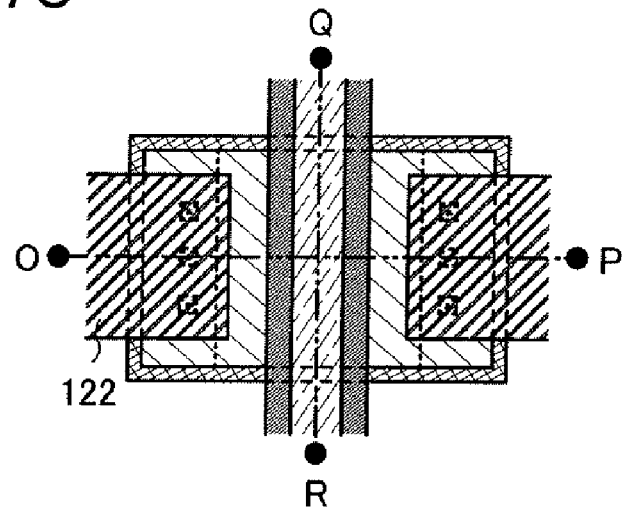

Next, the insulating layer 120 is formed so as to cover the insulating layers, the conductive layers, and the like provided over the substrate 102, and the conductive layers 122 which are electrically connected to the high-concentration impurity regions 110 formed in the semiconductor layer 105 through the insulating layer 120 are formed (see FIGS. 3D, 4E, and 7C). The conductive layers 122 function as source and drain electrodes Further, the conductive layers 122 are formed so as to be in contact with and electrically connected to the non-thinned regions of the semiconductor layer 105.

The insulating layer 120 is formed by a CVD method, a sputtering method, an ALD method, a coating method, a method in which a plurality of the above-described methods is combined, or the like, using an inorganic insulating material such as silicon oxide, silicon nitride, silicon oxynitride, silicon nitride oxide, or the like; an insulating material containing carbon such as DLC (Diamond-Like Carbon); an organic insulating material such as epoxy, polyimide, polyamide, polyvinyl phenol, benzocyclobutene, acrylic, or the like; or a siloxane material such as a siloxane resin. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or an aromatic hydrocarbon) is used. Alternatively, a fluoro group, or a fluoro group and an organic group containing at least hydrogen can be used as a substituent. Further, the insulating layer 120 may also be formed by forming an insulating layer with a CVD method, a sputtering method, an ALD method, or the like and then performing high-density plasma treatment thereto in an oxygen atmosphere or a nitrogen atmosphere. Note that, although a single layer structure of the insulating layer 120 is formed over the gate electrode 119 and the like in this embodiment mode, the present invention may employ a stacked-layer structure including two or more layers as well. In the case where a stacked-layer structure is employed for the insulating layer, the lower insulating layer (the insulating layer which is in contact with the gate electrode or the like) is preferably formed of an inorganic insulating material.

Each of the conductive layers 122 which form source and drain electrodes is formed by a CVD method or a sputtering method, using a metal element selected from aluminum (Al), tungsten (W), titanium (Ti), tantalum (Ta), molybdenum (Mo), nickel (Ni), platinum (Pt), copper (Cu), gold (Au), silver (Ag), manganese (Mg), and neodymium (Nd), or an alloy material or a compound material containing the metal element, to have a single layer structure or a stacked-layer structure. As examples of an alloy material containing aluminum, a material containing aluminum as its main component and nickel and an alloy material containing aluminum as its main component, nickel, and at least one of carbon and silicon can be given Each of the conductive layers 122 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum. Aluminum and aluminum silicon which have low resistance and are inexpensive are suitable for forming the conductive layers 122. Further, generation of hillocks of aluminum or aluminum silicon can be prevented by provision of upper and lower barrier layers.

In this embodiment mode, each of the conductive layers 122 employs a stacked-layer structure of a 60-nm-thick titanium layer, a 40-nm-thick titanium nitride layer, a 300-nm-thick aluminum layer, and a 100-nm-thick titanium layer.

Though the above, the thin film transistor 100 to which the present invention is applied can be formed. Note that the structure of the transistor described in this embodiment mode is just an example, and the present invention is not limited to the shown structure.

For example, the structure shown in FIG. 5A which is described above may be employed as well. In a thin film transistor 150 shown in FIG. 5A, the high-concentration impurity regions 160 formed in the semiconductor layer 155 may be thin except in the regions which are in contact with the conductive layers 122 to be electrically connected to each other and the periphery thereof An example of a method for manufacturing the semiconductor layer 155 is described below.

Figure 5B:
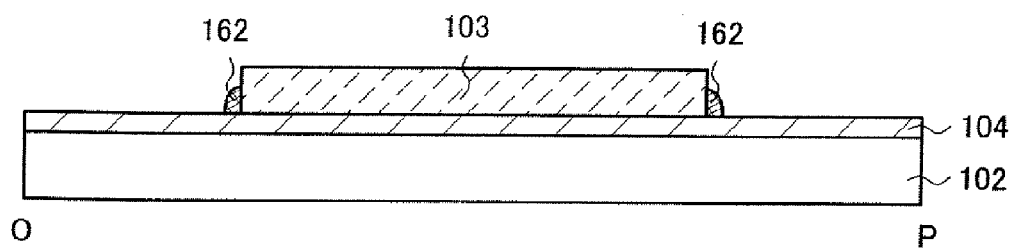

A side-surface insulating layer 162 is formed in contact with the side surface of the island-shaped semiconductor layer 103 formed over the substrate 102 with the insulating layer 104 interposed therebetween (see FIG. 5B).

The etching condition is controlled such that the perpendicular height from the bottom surface (the surface which is in contact with the insulating layer 104) is smaller in the side-surface insulating layer 162 than in the semiconductor layer 103. Preferably, it is set such that the side-surface insulating layer 162 becomes the same height as the perpendicular height from the bottom surface of the semiconductor layer 103 in the thinned region when the semiconductor layer 103 is thinned later. For example, in the case where the semiconductor layer 103 is partially thinned to 10 nm, the side-surface insulating layer 162 is formed to be 10 nm in height. The material, forming method, and the like of the side-surface insulating layer 162 may be similar to those of the above-described side-surface insulating layer 122.

Figure 5C:
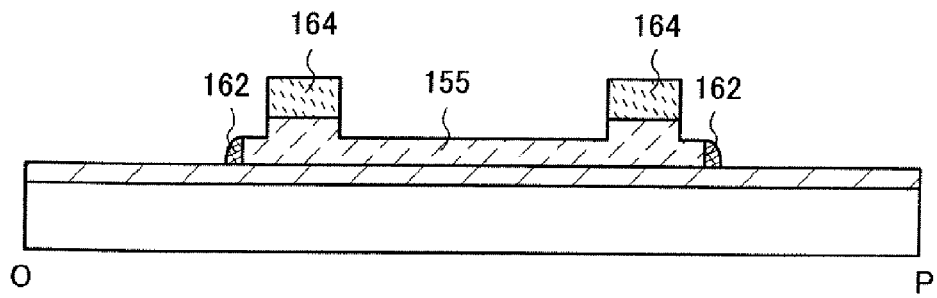

Next, the semiconductor layer 103 is locally thinned to form the semiconductor layer 155 (see FIG. 5C).

The semiconductor layer 155 is formed by locally thinning the semiconductor layer 103 with selective etching In this time, the semiconductor layer 155 shown in FIGS. 5A to 5C is different from the above-described semiconductor layer 105 shown in FIGS. 1A to 1C in the thickness of the semiconductor layer in the region which is in contact with the side-surface insulating layer in the cross-sectional diagram along a line O-P. The edge of the semiconductor layer 105 in the cross-sectional diagram along a line O-P is not thinned and the perpendicular height from the bottom surface (the surface which is in contact with the insulating layer 104) is almost the same in the side-surface insulating layer and the non-thinned region of the semiconductor layer 105 in FIGS. 1A to 1C, meanwhile the edge of the semiconductor layer 155 in the cross-sectional diagram along a line O-P is thinned and the perpendicular height from the bottom surface (the surface which is in contact with the insulating layer 104) is almost the same in the side-surface insulating layer and the thinned region of the semiconductor layer 155 in FIG. 5A. Note that, at least the semiconductor layer 155 in the regions which are in contact with and connected to the conductive layers 122 forming a source and drain electrode is not thinned. By thus doing, when openings in which the conductive layers 122 are formed are formed in the insulating layer 120, the semiconductor layer (the high-concentration impurity regions) in the periphery of the openings can be prevented from being removed.

The semiconductor layer 155 is formed as follows; the semiconductor layer 103 is selectively covered with a resist mask 164 and the semiconductor layer 103 in the region which is not covered with the resist mask 164 is etched so that the semiconductor layer 103 is locally thinned. At this time, the etching condition is controlled such that the semiconductor layer with a desired thickness is left in the region which is not covered with the resist mask 164. The method for thinning is similar to the method for forming the above-described semiconductor layer 105. After the etching, the formed semiconductor layer 155 has a depression and the depression corresponds to a thinned region. The region other than the depression is the region which is covered with the resist mask and is not etched, which is in contact with the conductive layers 122. After the semiconductor layer 155 having a desired shape is formed, the resist mask 164 is removed. Note that the thickness of the semiconductor layer 155 is in the range of 0.5 to 200 nm, and preferably in the range of 10 to 50 nm; and the thickness of the semiconductor layer 155 in the thinned region is 0.5 to 30 nm, and preferably 10 to 25 nm.

After that, the process including and after formation of the insulating layer 114 over the semiconductor layer 155 and the side-surface insulating layer 162 is similar to that described using FIGS. 1A to 1C, 2A to 2E, 3A to 3D, and 4A to 4E, or the like.

Note that the method for manufacturing the thin film transistor 150 shown in FIG. 5A is not limited to the above one. The semiconductor layer 155 shown in FIG 5C can be formed as well by the following; the island-shaped semiconductor layer 103 and the side-surface insulating layer 112 which is in contact with the side surface of the semiconductor layer 103 are formed as shown in FIG. 2C, and the semiconductor layer 103 and the side-surface insulating layer 112 are locally thinned by the etching condition in which the etching rates thereof are almost the same as each other For example, by using an etching gas in which an $O_2$ gas is added into a fluorine-based gas as needed, the semiconductor layer and the side-surface insulating layer can be etched by the etching condition in which the etching selection ratio is close to 1.

In a semiconductor device manufactured by applying the present invention, a semiconductor layer is locally thinned and a channel formation region is formed in the thinned region. Accordingly, the subthreshold factor (S value) can be reduced, the threshold voltage of a transistor can be reduced, and operating characteristics of a semiconductor device can be improved. Further, a defect due to the edge of a semiconductor layer can be reduced, so that a highly reliable semiconductor device can be manufactured. Thus, higher performance of a semiconductor device can be realized.

Note that this embodiment mode can be combined with another embodiment mode described in this specification as needed.

Embodiment Mode 2

In this embodiment mode, an example of a semiconductor device having a structure which is different from those described in the above embodiment mode is described using drawings. Note that description is made here while simplifying and partially omitting the same structure components as Embodiment Mode 1.

Figure 8A:
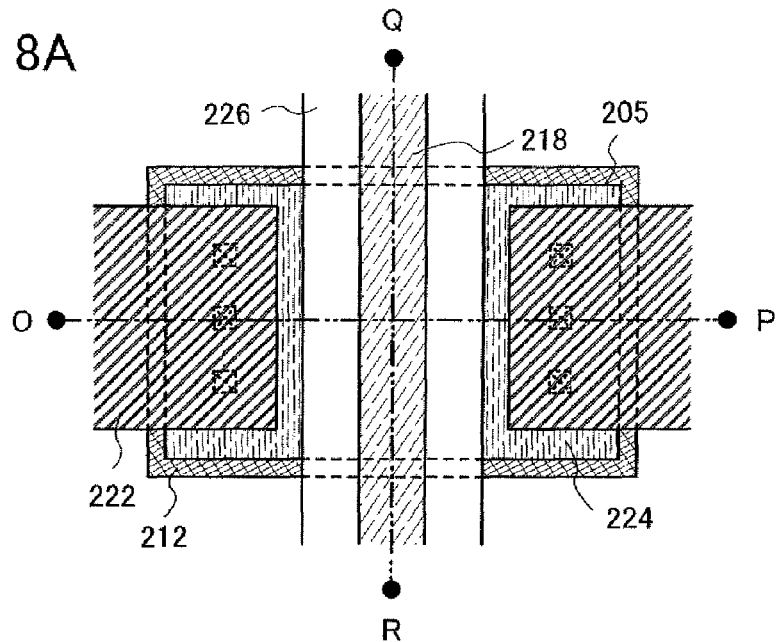
FIGS. 8A to 8C are diagrams showing an example of a main structure of a semiconductor device of the present invention.
Figure 8B:
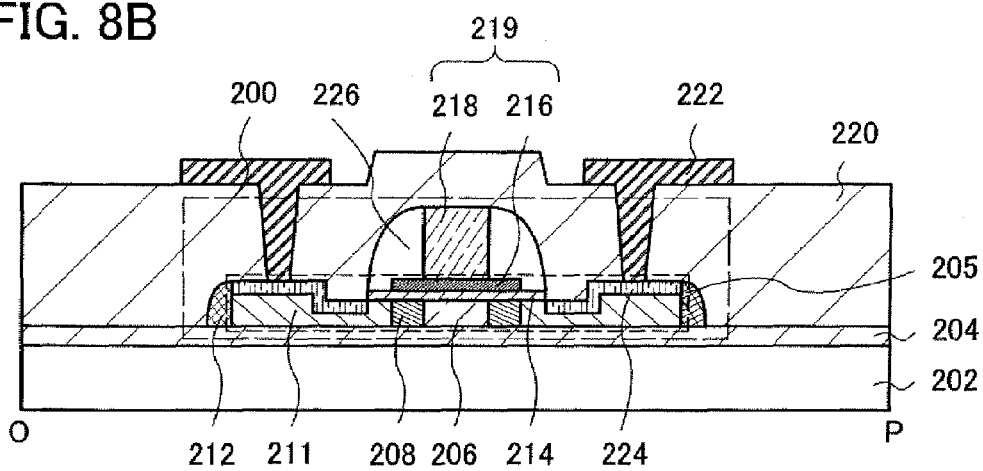
Figure 8C:
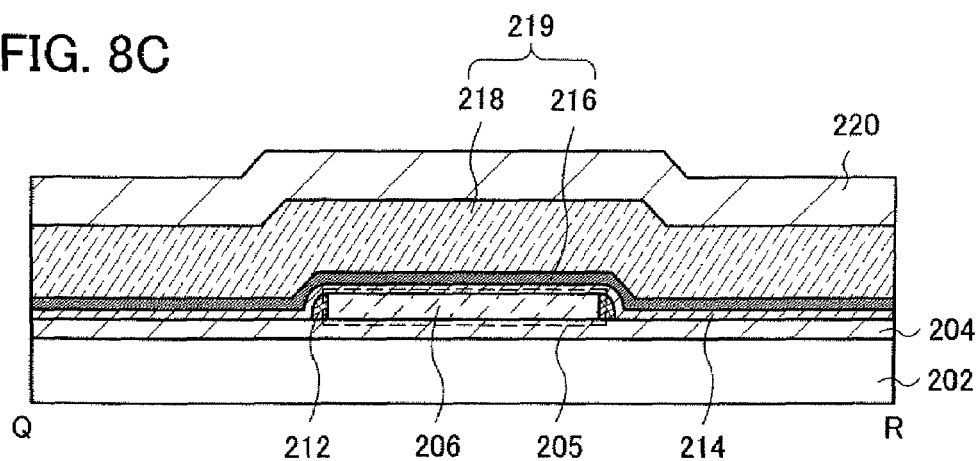

FIG. 8A is a top diagram and FIGS. 8B and 8C are cross-sectional diagrams for describing a main structure of a semiconductor device according to this embodiment mode. FIGS. 8A to 8C particularly show a structure of a thin film transistor; FIG. 8A is a top diagram, FIG. 8B is a cross-sectional diagram along a one-dotted dashed line O-P in FIG. 8A, and FIG. 8C is a cross-sectional diagram along a one-dotted dashed line O-R in FIG. 8A. Note that a thin film and the like are partially omitted in FIG. 8A.

A semiconductor device shown in FIGS. 8A to 8C includes a thin film transistor 200 which is provided over a substrate 202 with an insulating layer 204 interposed therebetween. The thin film transistor 200 includes an island-shaped semiconductor layer 205; a side-surface insulating layer 212 which is provided in contact with the side surface of the semiconductor layer 205; an insulating layer 214 which is provided over one surface of the semiconductor layer 205; conductive layers 216 and 218 which are provided over the semiconductor layer 205 with the insulating layer 214 interposed therebetween; a sidewall insulating layer 226 which is provided in contact with the side surfaces of the conductive layers 216 and 218; and conductive layers 222 which form source and drain electrodes, provided over the semiconductor layer 205 with an insulating layer 220 interposed therebetween. The conductive layers 222 are electrically connected to the semiconductor layer 205 through the insulating layer 220.

A gate electrode 219 is, similarly to the gate electrode 119 in Embodiment Mode 1, formed of a stacked-layer structure of the conductive layers 216 and 218. Further, in this embodiment mode, the sidewall insulating layer 226 is formed in contact with the side surface of the gate electrode 219. Note that the gate electrode in this embodiment mode is not limited thereto. For example, the gate electrode may employ a single layer structure or a stacked-layer structure including three or more layers. Further, the side surface of the conductive layer included in a gate electrode may be tapered. Further, the gate electrode may employ a stacked-layer structure including two or more conductive layers, and the taper angle may be different in the layers. When the gate electrode is formed of a stacked-layer structure of conductive layers, the width (the length in the direction parallel to a direction for carrier flow in a channel formation region (a direction from source region to drain region)) of the layers may be almost equal to each other, or the width of the lower conductive layer may be larger than that of the upper conductive layer. Note that, regardless of the structure of the gate electrode, the sidewall insulating layer which is in contact with the side surface of the gate electrode is formed.

The island-shaped semiconductor layer 205 includes a locally thinned region. The semiconductor layer 205 includes a channel formation region 206, a pair of low-concentration impurity regions 208 which function as LDD regions, a pair of high-concentration impurity regions 211 which function as a source and drain region, and silicide regions 224 which are formed on the high-concentration impurity regions 211. Note that it can also be said that the silicide regions 224 are formed in part of the high-concentration impurity regions 210.

The thickness of the semiconductor layer 205 is 0.5 to 200 nm, and preferably 10 to 50 nm. Further, the thickness of the thinned region of the semiconductor layer 205 is 0.5 to 30 nm, and preferably 10 to 25 nm. Further, the edge of the semiconductor layer 205 may be tapered similarly to the semiconductor layer 105 in Embodiment Mode 1.

At least part of the silicide regions 224 are formed in the semiconductor layer 205 in the non-thinned regions. Further, the silicide regions 224 are formed in the semiconductor layer 205 in the regions which are on the high-concentration impurity regions 211 and do not overlap with the sidewall insulating layer 226 and the gate electrode 219. Note that the insulating layer 214 which functions as a gate insulating layer is formed only in the semiconductor layer 205 in the region which overlaps with the sidewall insulating layer 226 and the gate electrode 219. Further, the conductive layers 222 which function as source and drain electrodes are in contact with the silicide regions 224 and electrically connected to the high-concentration impurity regions 211 with the silicide regions 224 interposed therebetween. In the semiconductor layer 205, by employing the structure in which the silicide regions 224 are interposed between the conductive layers 222 functioning as source and drain electrodes and the high-concentration impurity regions 211 which are electrically connected to each other, contact resistance (contact resistance between semiconductor layer and conductive layer) can be reduced. As an element is miniaturized, the problem of increase of contact resistance becomes prominent; thus, suppressing increase of contact resistance by formation of the silicide regions 224 is very effective. Such reduction of contact resistance can prevent signal delay and reduce power consumption of a semiconductor device. Further, by formation of the silicide regions, the resistance of the impurity regions which function as a source and drain region can be reduced. Therefore, reduction in on-current can be suppressed and operating characteristics of a semiconductor device can be prevented from being deteriorated.

The channel formation region 206 is positioned between the pair of high-concentration impurity regions 211 and each of the low-concentration impurity regions 208 is positioned between the channel formation region 206 and each of the high-concentration impurity regions 211. That is, the channel formation region 206 is positioned between the pair of high-concentration impurity regions 211 and between the pair of low-concentration impurity regions 208, and is in contact with the pair of low-concentration impurity regions 208. The concentration of an impurity element which provides one conductivity type added into the high-concentration impurity regions 211 is higher than that of the low-concentration impurity regions 208. By provision of the low-concentration impurity regions 208 in the semiconductor layer 205, occurrence of a hot carrier can be suppressed.

The channel formation region 206 is formed in the locally thinned region of the semiconductor layer 205. That is, the thickness of the channel formation region 206 is 0.5 to 30 nm, and preferably 10 to 25 nm. By thinning the semiconductor layer 205 in the region for forming the channel formation region 206, the subthreshold factor (S value) can be decreased and the threshold voltage can be decreased. Consequently, the operating characteristics of a semiconductor device can be improved. Further, the channel formation region 206 is formed in the semiconductor layer 205 in the region which overlaps with the conductive layer 218. That is, the gate electrode 219 is formed above the channel formation region 206 so as to get across the semiconductor layer 205. In the channel formation region 206, an impurity element which provides one conductivity type may be added in order to control the threshold voltage of a transistor.

The low-concentration impurity regions 208 are formed in the semiconductor layer 205 in the regions which overlap with the conductive layer 216. The high-concentration impurity regions 210 are at least partially formed in the non-thinned regions of the semiconductor layer 205. Further, the high-concentration impurity regions 210 are formed in the semiconductor layer 205 in the regions which do not overlap with the conductive layers 216 and 218.

Note that, LDD regions are not necessarily formed in the semiconductor layer 205. In the case where an LDD region is not formed, it is preferable to employ the structure in which a channel formation region is formed in contact with and between a pair of impurity regions which function as a source and drain region. In this case, when a gate electrode is formed of a stacked-layer structure in which the lower conductive layer has a width which is larger than that of the upper conductive layer as shown in FIGS. 8A to 8C, the channel formation region is preferably formed in the region which roughly overlaps with the upper conductive layer having a smaller width and the impurity regions which function as a source and drain region are preferably formed in the regions which do not roughly overlap with the upper conductive layer. On the other hand, when a gate electrode is formed of a single layer structure or a stacked-layer structure in which the width of the layers is almost equal to each other, the channel formation region is preferably formed in the region which roughly overlaps with the gate electrode and the impurity regions which function as a source and drain region are preferably formed in the regions which do not roughly overlap with the gate electrode. Further, LDD regions may be formed in the regions which do not overlap with the gate electrode, or in the semiconductor layer in the regions which partially overlap with the gate electrode.

Further, the high-concentration impurity regions 211 are electrically connected to the conductive layers 222 which function as source and drain electrodes through the silicide regions 224. In this time, part of the high-concentration impurity regions 211 is formed in the non-thinned regions of the semiconductor layer 205, and the conductive layers 222 which function as source and drain electrodes are formed so as to be electrically connected to the non-thinned regions. By thus doing, when openings in which the conductive layers 222 are formed are formed in the insulating layer 220, the semiconductor layer (the high-concentration impurity regions) in the periphery of the openings can be prevented from being removed, and reduction of a yield can be prevented.

Figure 10A:
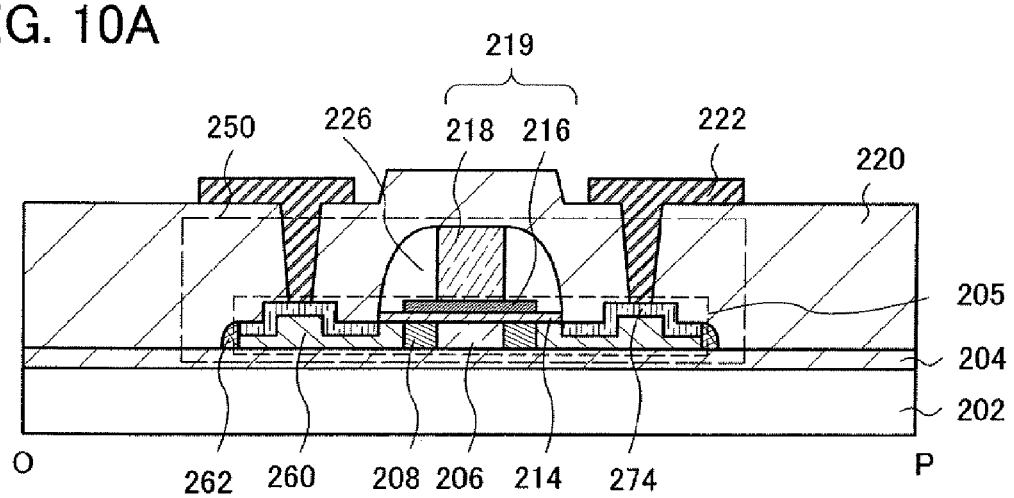
FIGS. 10A to 10C are diagrams showing an example of each of a main structure and a manufacturing method of a semiconductor device of the present invention.

Further, the example in which the edge of the semiconductor layer 205 including the high-concentration impurity regions 211 and the silicide regions 224 formed thereon is thinned on the side on which the low-concentration impurity regions 208 are formed, except in the regions which are in contact with the conductive layers 222 is shown in FIGS. 8A to 8C; however, the present invention is not limited thereto. For example, as shown in FIG. 10A, a semiconductor layer 255 including high-concentration impurity regions 260 and silicide regions 274 formed thereon may be thinned except in the regions which are in contact with the conductive layers 222 and the periphery thereof. Further, the silicide regions 274 may be formed only in the non-thinneds region of a semiconductor layer as well.

The side-surface insulating layer 212 is formed in contact with the side surface of the island-shaped semiconductor layer 205. As shown in FIGS. 8A and 8C, in the region where the gate electrode 219 gets across the semiconductor layer 205 (the region where the gate electrode 219 goes up the edge of the semiconductor layer 205), the insulating layer 214 which functions as a gate insulating layer is formed over the semiconductor layer 205 and the side-surface insulating layer 212 formed in contact with the side surface of the semiconductor layer 205. Accordingly, a defect caused by insufficiency of coverage with the gate insulating layer at the edge of the semiconductor layer 205, in particular, in the region where the gate electrode 219 and the edge of the semiconductor layer 205 overlap with each other (the region where the gate electrode 219 goes up the edge of the semiconductor layer 205) can be prevented. For example, short-circuiting between the semiconductor layer and the gate electrode, occurrence of a leakage current, electrostatic breakdown, or the like can be prevented. Consequently, the reliability of a semiconductor device to be completed can be improved.

The surface of the side-surface insulating layer 212, which is not in contact with the side surface of the semiconductor layer 205 is curved. It is preferable that the side-surface insulating layer 212 be provided with a curvature.

Further, the side-surface insulating layer 212 may be formed so as to surround the semiconductor layer 205 as shown in FIG. 8A, or may be formed only in the region where the gate electrode and the edge of the semiconductor layer overlap with each other.

Next, one example of a manufacturing method of the semiconductor device shown in FIGS. 8A to 8C is described below using drawings.

An island-shaped semiconductor layer is formed over the substrate 202 with the insulating layer 204 interposed therebetween, and then the side-surface insulating layer 212 is formed in contact with the side surface of the semiconductor layer. Next, the island-shaped semiconductor layer is locally thinned to form the semiconductor layer 205, and the insulating layer 214 is formed over the semiconductor layer 205 and the side-surface insulating layer 212. Next, the conductive layers 216 and 218 which function as the gate electrode 219 are formed over the semiconductor layer 205 with the insulating layer 214 interposed therebetween. Next, an impurity element which provides one conductivity type is added at a first concentration with the conductive layer 218 as a mask, and then an impurity element is added at a second concentration with the conductive layers 216 and 218 as masks, whereby the pair of high-concentration impurity regions 210, the pair of low-concentration impurity regions 208, and the channel formation region 206 are formed in a self-aligned manner. Here, as the impurity elements at the first and second concentrations, impurity elements which provide the same conductivity type are added; for example, an impurity element which provides a p-type conductivity such as boron (B), aluminum (Al), or gallium (Ga) or an impurity element which provides an n-type conductivity such as phosphorus (P) or arsenic (As) can be used. Further, the second concentration is set to be higher than the first concentration (see FIG. 9A). The process up to formation of the channel formation region 206, the low-concentration impurity regions 208, and the high-concentration impurity regions 210 in the semiconductor layer after formation of the gate electrode 219 can refer to the description of the substrate 102, the insulating layer 104, the semiconductor layer 105, the side-surface insulating layer 112, the insulating layer 114, the conductive layers 116 and 118, and the like described in Embodiment Mode 1, and therefore, the description thereof is omitted.

Figure 9A:
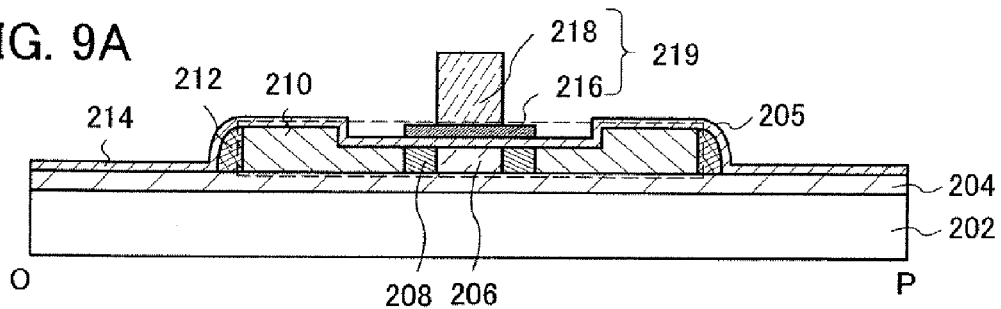
FIGS. 9A to 9E are diagrams showing an example of a manufacturing method of a semiconductor device of the present invention.

Further, in order to control the threshold voltage of a transistor, an impurity element which provides one conductivity type may be added into the channel formation region 206 in FIG. 9A. Addition of the impurity element into the channel formation region 206 may be performed before the gate electrode 219 is formed.

Further, after the impurity element which provides one conductivity type is added, thermal treatment may be performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 650° C. Further, the thermal treatment is preferably performed in a nitrogen atmosphere.

Figure 9B:
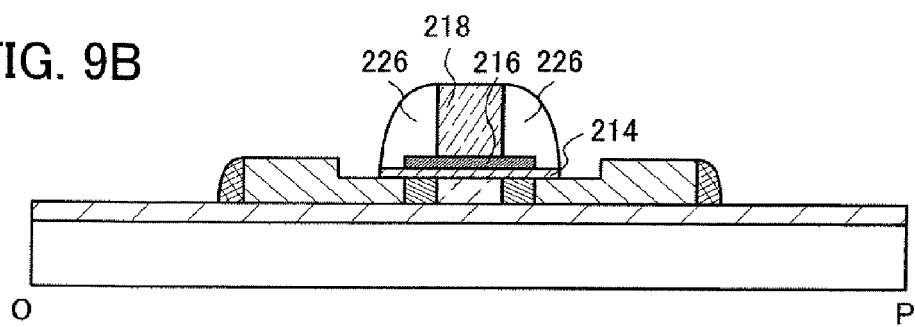

Next, the sidewall insulating layer 226 which is in contact with the side surfaces of the conductive layers 216 and 218 is formed (see FIG. 9B).

The sidewall insulating layer 226 is formed as follows; an insulating layer is formed to envelop the conductive layers 216 and 218 and is selectively etched by anisotropic etching mainly in a perpendicular direction. Specifically, the sidewall insulating layer 226 can be formed as follows; an insulating layer is formed of an inorganic material such as silicon oxide, silicon nitride, silicon oxynitride, or silicon nitride oxide, or an organic material such as an organic resin by a CVD method or a sputtering method to have a single layer structure or a stacked-layer structure, and then selectively etched. The sidewall insulating layer 226 is used as a silicide mask in forming silicide regions later. In this embodiment mode, the surface of the sidewall insulating layer 226, which is not in contact with the side surfaces of the conductive layers 216 and 218 is curved. Note that the sidewall insulating layer 226 is formed to entirely cover the side surfaces of the conductive layers 216 and 218 forming the gate electrode 219.

Further, the etching for forming the sidewall insulating layer 226 also etches the insulating layer 214 under the sidewall insulating layer 226 to selectively expose part of the semiconductor layer 205. Specifically, the high-concentration impurity regions 210 in the regions which do not overlap with the sidewall insulating layer 226 are exposed. Note that, depending on the etching condition, the upper portion of the high-concentration impurity regions 210 may also be etched to reduce the thickness (it is called film thickness loss).

Figure 9C:
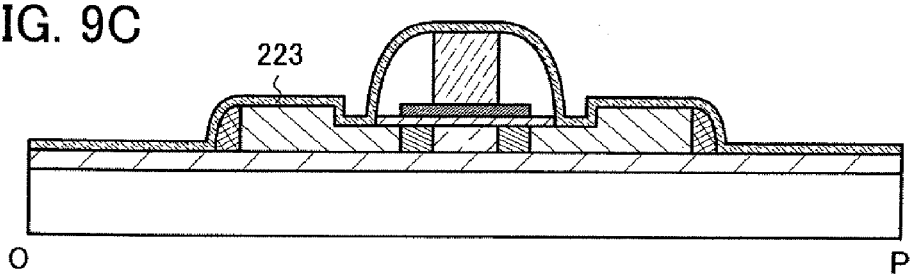

Next, a metal layer 223 is formed on the exposed semiconductor layer 205 (see FIG. 9C).

The metal layer 223 is formed at least on the exposed semiconductor layer 205. That is, the metal layer 223 is formed on the semiconductor layer 205 in the region which does not overlap with the sidewall insulating layer 226. In this embodiment mode, the metal layer 223 is formed over an entire surface of the substrate. The metal layer 223 is formed of a material which reacts with a semiconductor layer to form silicide. For example, a metal element such as nickel (Ni), titanium (Ti), cobalt (Co), or platinum (Pt), or an alloy material containing the metal element can be used. The metal layer 223 is formed of such a material by a sputtering method, a vapor deposition method, a plating method, or the like. The thickness of the metal layer 223 is needed to be selected as appropriate in accordance with the thickness of a silicide region to be formed. In this embodiment mode, a 10 nm-thick nickel layer is formed as the metal layer 223. Note that, if a natural oxide layer has been formed on the exposed semiconductor layer 205 when the metal layer 223 is formed, the metal layer 223 is formed after the natural oxide layer is removed.

Figure 9D:
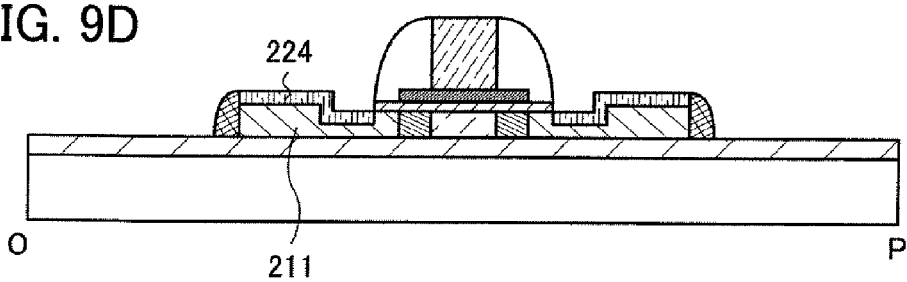

Next, the silicide regions 224 are formed in part of the semiconductor layer 205 (see FIG. 9D).

The silicide regions 224 are formed by reaction of the region in which the semiconductor layer 205 and the metal layer 223 are in contact with each other with thermal treatment. Further, the silicide regions 224 are formed by making part of the semiconductor layer 205 in the region which is in contact with the metal layer 223 silicide. At this time, the region of the high-concentration impurity regions 210 is reduced to he the high-concentration impurity regions 211 since part of the high-concentration impurity regions 210 is made silicide. Note that, it can be said that the silicide regions are formed in pan of the high-concentration impurity regions. For example, when a nickel layer is used as the metal layer 223, nickel silicide is formed as the silicide regions 224. Similarly, when a titanium layer, a cobalt layer, or a platinum layer is formed as the metal layer 223, titanium silicide, cobalt silicide, or platinum silicide is formed as the silicide regions 224.

The thermal treatment can be performed using RTA or an annealing furnace. Specifically, the thermal treatment may be performed at temperatures of 300° C. to 700° C., for 10 seconds to 1 hour, and preferably for 20 seconds to 30 minutes. In this embodiment mode, thermal treatment for 30 seconds at 550° C. is performed to form the silicide regions 224 made of nickel silicide.

In FIG. 9D, the silicide regions 224 are formed to have a thickness less than that of the semiconductor layer 205 in the thinned region. Specifically, in the semiconductor layer 205 in the region which does not overlap with the sidewall insulating layer 226, the high-concentration impurity regions 211 are formed on the side which is in contact with the insulating layer 204 and the silicide regions 224 are formed on the high-concentration impurity regions 211.

Figure 11A:
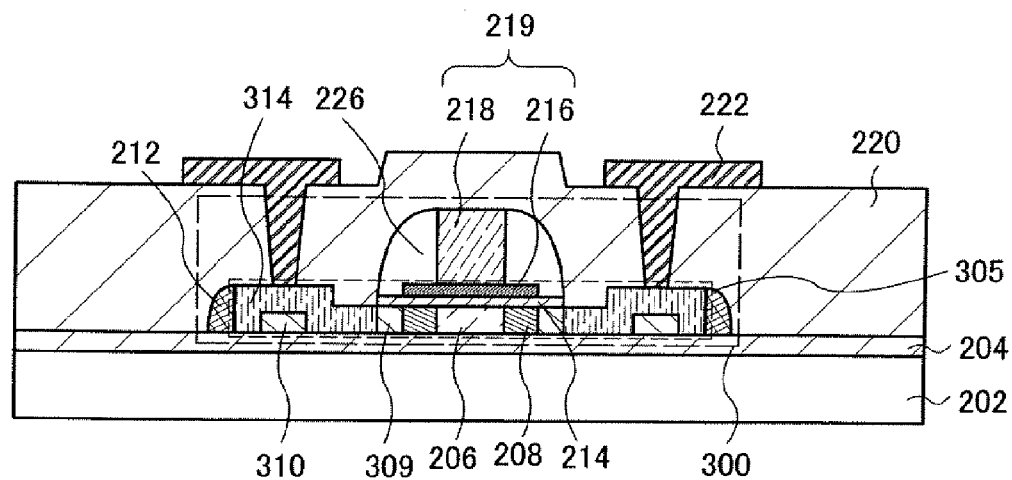
FIGS. 11A and 11B are diagrams showing an example of a main structure of a semiconductor device of the present invention.

Note that the shape, thickness, and the like of the silicide regions 224 can be selected by the thickness, temperature of thermal treatment, period of time for thermal treatment, and the like of the metal layer 223 which reacts with, being controlled as appropriate. For example, as shown in FIG. 11A, in the semiconductor layer 305 in the region which does not overlap with the sidewall insulating layer 226, either partially or entirely, silicide regions 314 which are formed by making the semiconductor layer 305 from top surface to bottom surface silicide may be formed. The top surface here means the surface of the semiconductor layer 305 on the side on which a metal layer for silicide reaction is formed and the bottom surface means the surface on the side which is in contact with the insulating layer 204. Further, although the example in which high-concentration impurity regions 310 are formed under the silicide regions 314 is shown in FIG. 11A, the entire semiconductor layer 305 in the region which does not overlap with the sidewall insulating layer 226 can be made a silicide region as well. High-concentration impurity regions are formed under the sidewall insulating layer 226. Note that the present invention is not limited thereto; the silicide region may extend to the semiconductor layer 305 in the region just under the sidewall insulating layer 226 (except the channel formation region 206).

Figure 11B:
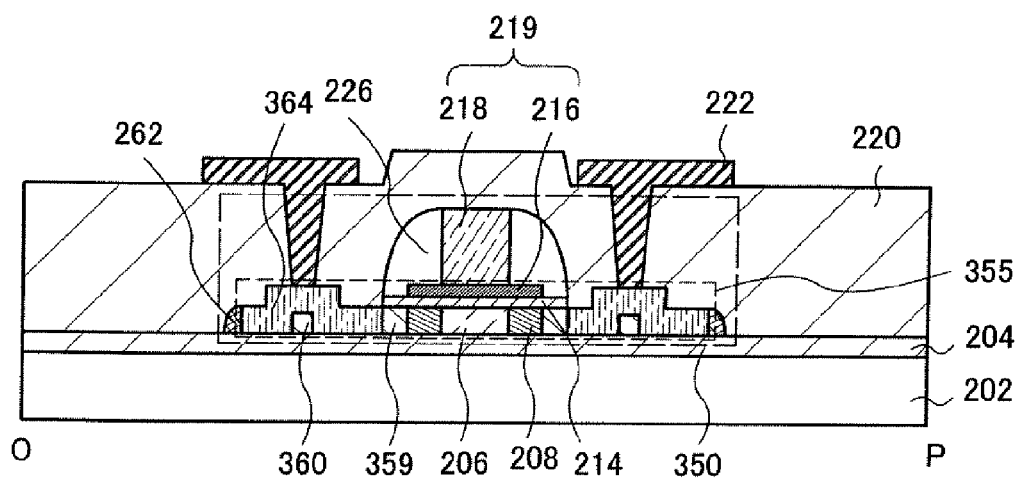

Further, also in the case where the high-concentration impurity regions 260 formed in the semiconductor layer 255 and the silicide regions 274 formed thereon are thinned except in the regions which are in contact with the conductive layers 222 and the periphery thereof as shown in FIG. 10A, in a semiconductor layer 355 in the region which does not overlap with the sidewall insulating layer 226, either partially or entirely, silicide regions 364 which are formed by making the semiconductor layer 355 from top surface to bottom surface silicide may be formed as shown in FIG. 11B. FIG. 11B shows the example in which high-concentration impurity regions 360 are formed under the silicide regions 364 and high-concentration impurity regions 359 are formed under the sidewall insulating layer 226.

Further, in the case where the metal layer 223 which has not reacted remains, the metal layer 223 is removed after the silicide regions 224 are formed by thermal treatment. Specifically, the metal layer 223 formed above the side-surface insulating layer 212, the sidewall insulating layer 226, the conductive layer 218, and the insulating layer 204 is removed. Further, in the case where the metal layer which has not reacted remains above the silicide regions 224, the remaining metal layer is also removed. For removal of the metal layer which has not reacted, wet etching or dry etching can be used. At this time, it is necessary for an etching gas or an etching solution to provide enough high etching selection ratio of the metal layer which has not reacted, with respect to other layers (e.g., the side-surface insulating layer 212, the sidewall insulating layer 226, the conductive layer 218, the insulating layer 204, and the silicide regions 224). That is, it is necessary that the etching rate with respect to the metal layer is high and the etching rate with respect to another layer is low. For example, in the case where the metal layer 223 is formed of nickel, it can be removed by wet etching using a solution in which hydrochloric acid (HCl), nitric acid ($HNO_3$), and pure water ($H_2O$) are mixed; for example, the mixture ratio of the solution can be set to HCl:$HNO_3$:$H_2O$=3:2:1.

Note that one feature of the present invention is to form a side-surface insulating layer so as to be in contact with the side surface of edge of a semiconductor layer. By formation of the side-surface insulating layer, etching of the side surface of the semiconductor layer can also be prevented upon removing the metal layer which has not reacted by etching.

Note that, in the case where the silicide region is formed, it is necessary that the silicide region and the gate electrode are not in contact with each other. This is because, if the silicide region and the gate electrode are in contact with each other, the gate electrode and the source or drain region are shorted and an on/off ratio can not be obtained, so that operation as a semiconductor device cannot be provided. Therefore, in this embodiment mode, the width of the conductive layers 216 and 218 forming the gate electrode 219 is smaller than that of the insulating layer 214 which functions as a gate insulating layer and the edge of the sidewall insulating layer 226 and the edge of the insulating layer 214 are almost aligned with each other.

Figure 9E:
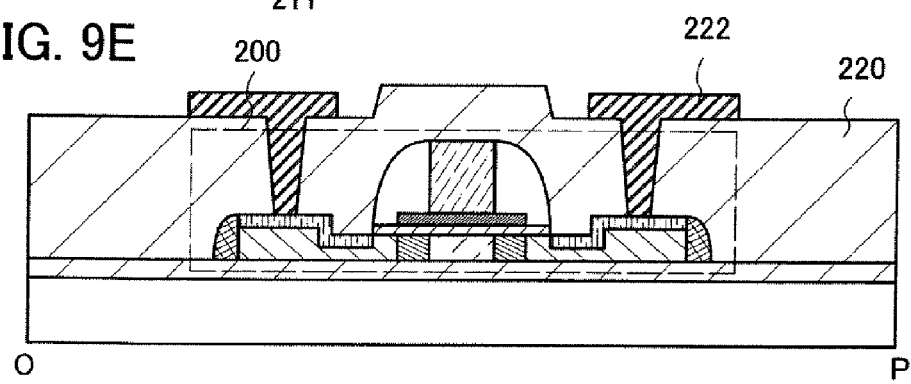

Next, the insulating layer 220 is formed so as to cover the insulating layers, the conductive layers, and the like provided over the substrate 202, and the conductive layers 222 which are electrically connected to the high-concentration impurity regions 211 formed in the semiconductor layer 205 through the silicide regions 224 are formed (see FIG. 9E). The conductive layers 222 function as source and drain electrodes. The insulating layer 220 and the conductive layers 222 may be formed similarly to the insulating layer 120 and the conductive layers 122 described in Embodiment Mode 1.

Note that the conductive layers 222 are formed so as to be in contact with the silicide regions 224 formed in the semiconductor layer 205 in the non-thinned regions. Therefore, the semiconductor layer in the periphery of openings can be prevented from being removed upon forming the openings in which the conductive layers 222 are to be formed in the insulating layer 220. Consequently, reduction in an yield in a manufacturing process can be prevented. Further, in this embodiment mode, the structure in which the silicide regions are interposed between the conductive layers functioning as source and drain electrodes and the semiconductor layer which are electrically connected to each other is employed. Accordingly, contact resistance can be reduced, so that lower power consumption and higher performance can be realized.

Though the above, the thin film transistor 200 to which the present invention is applied can be formed. Note that the structure of the transistor described in this embodiment mode is just an example, and the present invention is not limited to the shown structure.

Figure 10B:
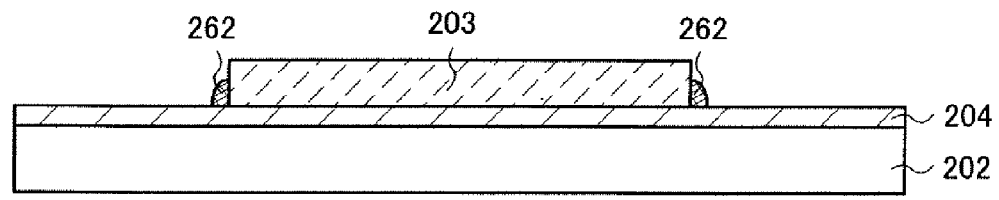

For example, in the above-described thin film transistor shown in FIG. 10A, the semiconductor layer 255 in the regions in which the high-concentration impurity regions 260 and the silicide regions 274 are formed is thinned except in the regions which are in contact with the conductive layers 222 and the periphery thereof. An example of a method for manufacturing the semiconductor layer 255 is described below A side-surface insulating layer 262 is formed in contact with the side surface of an island-shaped semiconductor layer 203 formed over the substrate 202 with the insulating layer 204 interposed therebetween (see FIG. 10B).

The etching condition is controlled such that the perpendicular height from the bottom surface (the surface which is in contact with the insulating layer 204) is smaller in the side-surface insulating layer 262 than in the semiconductor layer 203. Preferably, it is set such that the side-surface insulating layer 262 becomes the same height as the perpendicular height from the bottom surface of the semiconductor layer 203 in the thinned region when the semiconductor layer 203 is thinned later. For example, in the case where the semiconductor layer 203 is partially thinned to 10 nm, the side-surface insulating layer 262 is formed to be 10 nm in height. The material, forming method, and the like of the side-surface insulating layer 262 may be similar to those of the above-described side-surface insulating layer 112 described in Embodiment Mode 1. Further, the method for forming the semiconductor layer 203 also refers to the description of the semiconductor layer 103 described in Embodiment Mode 1.

Figure 10C:
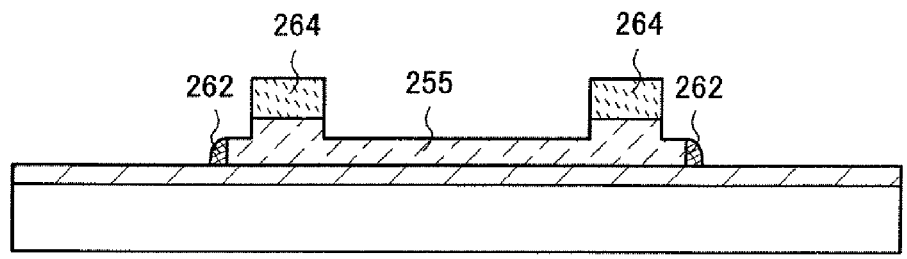

Next, the semiconductor layer 203 is locally thinned to form the semiconductor layer 255 (see FIG. 10C).

The semiconductor layer 255 is formed by locally thinning the semiconductor layer 203 with selective etching. In this time, the semiconductor layer 255 shown in the cross-sectional diagram along a line O-P in FIG. 10A is different from the above-described semiconductor layer 205 shown in the cross-sectional diagram along a line O-P in FIG. 8B in the thickness of the semiconductor layer in the region which is in contact with the side-surface insulating layer. The edge of the semiconductor layer 205 in the cross-sectional diagram along a line O-P in FIG. 8B is not thinned and the perpendicular height from the bottom surface (the surface which is in contact with the insulating layer 204) is almost the same in the side-surface insulating layer and the non-thinneds region of the semiconductor layer 205, meanwhile the edge of the semiconductor layer 255 in the cross-sectional diagram along a line O-P in FIG. 10A is thinned and the perpendicular height from the bottom surface (the surface which is in contact with the insulating layer 204) is almost the same in the side-surface insulating layer and the thinned region of the semiconductor layer 255. Note that, at least the semiconductor layer 255 in the regions which are in contact with the conductive layers 222 forming a source and drain electrode is not thinned.

The semiconductor layer 255 is formed as follows; the semiconductor layer 203 is selectively covered with a resist mask 264 and the semiconductor layer 203 in the region which is not covered with the resist mask 264 is etched so that the semiconductor layer 203 is locally thinned. At this time, the etching condition is controlled such that the semiconductor layer with a desired thickness is left in the region which is not covered with the resist mask 264. The method for thinning is similar to the method for forming the above-described semiconductor layer 105 in Embodiment Mode 1. After the etching, the formed semiconductor layer 255 has a depression and the depression corresponds to a thinned region. The region other than the depression is the region which is covered with the resist mask 264 and is not thinned, where the conductive layers 222 are in contact with later. After the semiconductor layer 255 having a desired shape is formed, the resist mask 264 is removed. Note that the thickness of the semiconductor layer 255 is in the range of 0.5 to 200 nm, and preferably in the range of 10 to 50 nm; and the thickness of the semiconductor layer 255 in the thinned region is 0.5 to 30 nm, and preferably 10 to 25 nm.

After that, the process including and after formation of the insulating layer 214 over the semiconductor layer 255 is similar to that shown in FIGS. 9A to 9E.

Note that the method for manufacturing a thin film transistor 250 shown in FIG. 10A is not limited to the above one. The semiconductor layer 255 shown in FIG. 10C can be formed as well by the following; the island-shaped semiconductor layer 203 and the side-surface insulating layer which is in contact with the side surface of the semiconductor layer 203 and has almost the same perpendicular height from the bottom surface (the surface which is in contact with the insulating layer 204) as the side surface of the semiconductor layer are formed, and the semiconductor layer 203 and the side-surface insulating layer are locally thinned by the etching condition in which the etching rates thereof are almost the same as each other.

In a semiconductor device manufactured by applying the present invention, a semiconductor layer is locally thinned and a channel formation region is formed in the thinned region. Accordingly, the subthreshold factor (S value) can be reduced, the threshold voltage of a transistor can be reduced, and operating characteristics of a semiconductor device can be improved. Further, a defect due to the edge of a semiconductor layer can be reduced, so that a highly reliable semiconductor device can be manufactured. Thus, higher performance of a semiconductor device can be realized.

Further, the structure in which silicide regions are interposed between high-concentration impurity regions which function as a source and drain region and conductive layers forming a source and drain electrode, which are electrically connected to each other, is employed. Consequently, contact resistance can be reduced, so that power consumption of a semiconductor device can be reduced.

Note that this embodiment mode can be combined with another embodiment mode described in this specification as needed.

Embodiment Mode 3

In this embodiment mode, an example of a semiconductor device having a structure which is different from those described in the above embodiment modes is described using drawings. Specifically, the example in which a sidewall insulating layer is formed in contact with the side surface of a gate electrode and the sidewall insulating layer is used as a doping mask for forming LDD regions is described. Note that description is made here while simplifying and partially omitting the same structure components as Embodiment Modes 1 and 2.

Figure 13A:
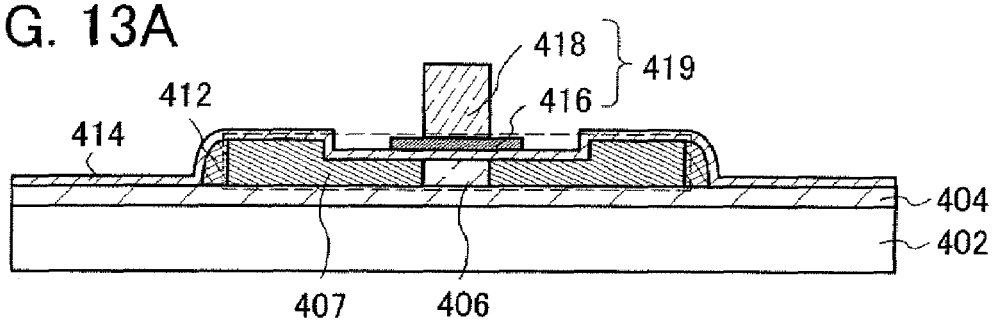
FIGS. 13A to 13D are diagrams showing an example of a manufacturing method of a semiconductor device of the present invention.

An island-shaped semiconductor layer is formed over a substrate 402 with an insulating layer 404 interposed therebetween, and a side-surface insulating layer 412 is formed in contact with the side surface of the semiconductor layer. Next, the island-shaped semiconductor layer is locally thinned to form a semiconductor layer 405, and an insulating layer 414 is formed over the semiconductor layer 405 and the side-surface insulating layer 412. Next, conductive layers 416 and 418 which function as a gate electrode 419 are formed over the semiconductor layer 405 with the insulating layer 414 interposed therebetween. Next, an impurity element which provides one conductivity type is selectively added at a first concentration into the semiconductor layer 405, whereby a pair of low-concentration impurity regions 407 and a channel formation region 406 are formed (see FIG. 13A). In this embodiment mode, with the conductive layer 418 as a mask, the pair of low-concentration impurity regions 407 and the channel formation region 406 which is positioned between the pair of low-concentration impurity regions 407 are formed in a self-aligned manner.

The process including and from formation of the gate electrode 419 up to formation of the pair of low-concentration impurity regions 407 refers to the description of the substrate 102, the insulating layer 104, the semiconductor layer 105, the side-surface insulating layer 112, the insulating layer 114, the conductive layers 116 and 118, the channel formation region 106, and the low-concentration impurity regions 107, and the like, and therefore, the description thereof is omitted.

Figure 13B:
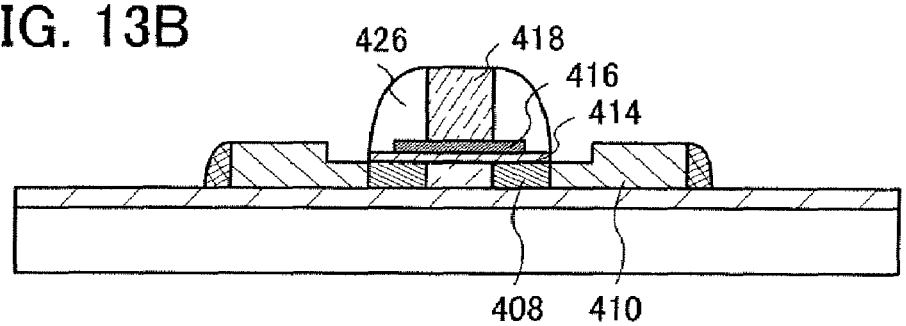

Next, a sidewall insulating layer 426 which is in contact with the side surfaces of the conductive layers 416 and 418 is formed. Then, an impurity element is selectively added at a second concentration into the semiconductor layer 405, whereby low-concentration impurity regions 408 which function as LDD regions and high-concentration impurity regions 410 which function as a source and drain region are formed (see FIG. 13B). In this embodiment mode, with the sidewall insulating layer 426 and the gate electrode 419 as masks, the low-concentration impurity regions 408 which function as LDD regions and the high-concentration impurity regions 410 which function as a source and drain region are formed in a self-aligned manner. Here, as the impurity elements at the first and second concentrations, impurity elements which provide the same conductivity type are added; for example, impurity elements which provide a p-type conductivity such as boron (B), aluminum (Al), or gallium (Ga) or impurity elements which provide an n-type conductivity such as phosphorus (P) or arsenic (As) can be used. Further, the second concentration is set to be higher than the first concentration. That is, the impurity concentration of the high-concentration impurity regions 410 is higher than that of the low-concentration impurity regions 407.

At this time, the impurity element is added with the sidewall insulating layer 426 and the gate electrode 419 as masks. Therefore, the low-concentration impurity regions 408 which function as LDD regions are formed in the semiconductor layer 405 in the regions which overlap with the sidewall insulating layer 426 and the conductive layer 416 but do not overlap with the conductive layer 418. Further, the high-concentration impurity regions 410 are formed in the semiconductor layer 405 in the regions which do not overlap with the sidewall insulating layer 426 and the gate electrode 419.

The low-concentration impurity regions 408 which function as LDD regions can relax an electric field in the periphery of the drain region. Therefore, occurrence of a hot carrier can be suppressed.

Note that, in order to control the threshold voltage of a transistor, an impurity element which provides one conductivity type may be added into the channel formation region 406. Addition of the impurity element into the channel formation region 406 may be performed before the gate electrode 419 is formed.

Further, after the impurity element which provides one conductivity type is added, thermal treatment may be performed to activate the impurity element added. The thermal treatment can be performed by laser beam irradiation, RTA, or using an annealing furnace, and may be performed at temperatures of 400° C. to 700° C., and preferably 500° C. to 650° C. Further, the thermal treatment is preferably performed in a nitrogen atmosphere.

Further, the etching for forming the sidewall insulating layer 426 also etches the insulating layer 414 under the sidewall insulating layer 426 to selectively expose part of the semiconductor layer 405, specifically, the regions which do not overlap with the sidewall insulating layer 426 are exposed. At this time, depending on the etching condition, the upper portion of the semiconductor layer 405 may also be etched to reduce the thickness.

Figure 13C:
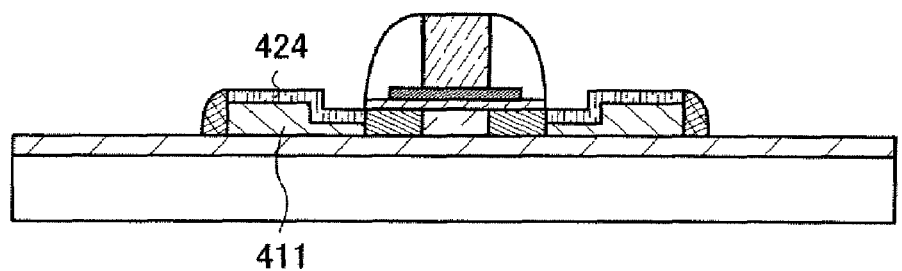

Next, a metal layer is formed on the exposed semiconductor layer 405 and then subjected to thermal treatment, whereby silicide regions 424 are formed (see FIG. 13C).

The silicide regions 424 can be formed by forming the metal layer on at least the exposed semiconductor layer 405 and then performing thermal treatment. Here, the metal layer is formed of a material which reacts with a semiconductor layer to form silicide, for example, a metal element such as nickel (Ni), titanium (Ti), cobalt (Co), or platinum (Pt), or an alloy material containing the metal element, by a sputtering method or the like. By thermal treatment, the region in which the semiconductor layer 405 and the metal layer are in contact with each other is reacted, so that part of the semiconductor layer 405 of the region is made silicide to form the silicide regions 424. At this time, the high-concentration impurity regions 410 formed in the semiconductor layer 405 is reduced to be partially made silicide and become high-concentration impurity regions 411. Note that it can also be said that the silicide regions are formed in part of the high-concentration impurity regions. The thermal treatment may be performed by using RTA or an annealing furnace. Further, if a natural oxide layer has been formed on the exposed semiconductor layer 405, the metal layer is formed after the natural oxide layer is removed.

Note that the shape, thickness, and the like of the silicide regions 424 can be selected by the thickness, temperature of thermal treatment, period of time for thermal treatment, and the like of the metal layer which reacts with, being controlled as appropriate. In this embodiment mode, the example in which the silicide regions 424 have a thickness which is smaller than that of the thinned region of the semiconductor layer 405 is described. It is needless to say that, in the semiconductor layer 405, the entire region which does not overlap with the sidewall insulating layer 426 and the gate electrode 419 may be made silicide to be a silicide region as well. Further, the silicide region may extend to the semiconductor layer 405 in the region just under the sidewall insulating layer 426 as well. Note that the metal layer which has not reacted is removed by wet etching or dry etching after the silicide regions 424 are formed. In addition, since the side-surface insulating layer is formed in contact with the side surface of the semiconductor layer, etching of the side surface of the semiconductor layer can also be prevented upon removing the metal layer which has not reacted by etching.

Figure 13D:
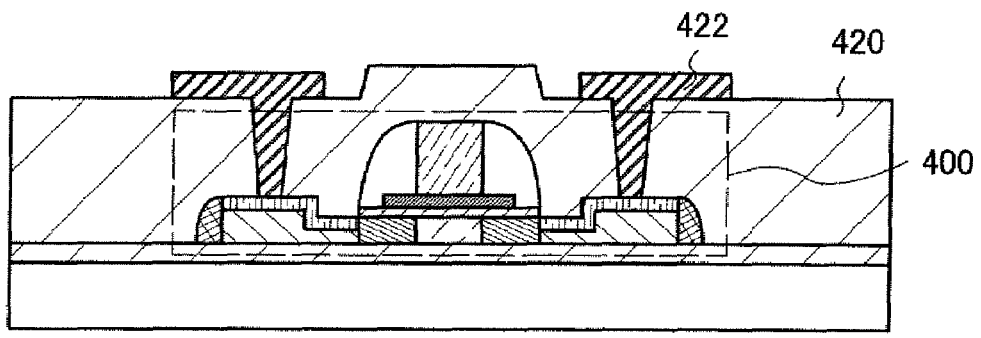

Next, an insulating layer 420 is formed so as to cover the insulating layers, the conductive layers, and the like provided over the substrate 402, and conductive layers 422 which are electrically connected to the high-concentration impurity regions 411 formed in the semiconductor layer 405 through the silicide regions 424 are formed (see FIG. 13D). The conductive layers 422 function as source and drain electrodes. The insulating layer 420 and the conductive layers 422 may be formed similarly to the insulating layer 120 and the conductive layers 122 described in Embodiment Mode 1.

Note that the conductive layers 422 are formed so as to be in contact with the silicide regions 424 formed in the semiconductor layer 405 in the non-thinned regions. Therefore, the semiconductor layer in the periphery of openings can be prevented from being removed upon forming the openings in which the conductive layers 422 are formed in the insulating layer 420, and increasement in contact resistance can be prevented. Consequently, reduction in an yield in a manufacturing process can be prevented, and higher performance of a semiconductor device can be achieved. Further, in this embodiment mode, the structure in which the silicide regions are interposed between the conductive layers functioning as source and drain electrodes and the semiconductor layer which are electrically connected to each other is employed. Accordingly, contact resistance can be reduced, so that lower power consumption and higher performance can be realized. Further, by formation of the silicide regions, low resistance of the impurity regions which function as a source and drain region can be achieved. Therefore, reduction in on-current can be suppressed and operating characteristics of a semiconductor device can be prevented from being deteriorated.

Though the above, a thin film transistor 400 to which the present invention is applied can be formed. Note that the structure of the transistor described in this embodiment mode is just an example, and the present invention is not limited to the shown structure.

In a semiconductor device manufactured by applying the present invention, a semiconductor layer is locally thinned and a channel formation region is formed in the thinned region. Accordingly, the subthreshold factor (S value) can be reduced, the threshold voltage of a transistor can be reduced, and operating characteristics of a semiconductor device can be improved. Further, since the regions which are connected to the conductive layers forming a source and drain electrode are not thinned, a defect such as elimination of a semiconductor layer upon forming the contact openings can be prevented. Further, since silicide regions are interposed between high-concentration impurity regions which function as a source and drain region and conductive layers forming a source and drain electrode, contact resistance can be reduced, and power consumption of a semiconductor device can be reduced. Further, by formation of a side-surface insulating layer so as to be in contact with the edge of a semiconductor layer, a defect due to the shape of the semiconductor layer can be reduced, so that a highly reliable semiconductor device can be manufactured. Thus, higher performance of a semiconductor device can be realized.

Note that this embodiment mode can be combined with another embodiment mode described in this specification as needed.

Embodiment Mode 4

In this embodiment mode, an example of a semiconductor device having a structure which is different from those described in the above embodiment modes is described using drawings. Specifically, the example in which an impurity element which provides one conductivity type is added for controlling the threshold voltage of a transistor is described. Note that description is made here while simplifying and partially omitting the same structure components as Embodiment Modes 1 to 3.

Figure 29A:
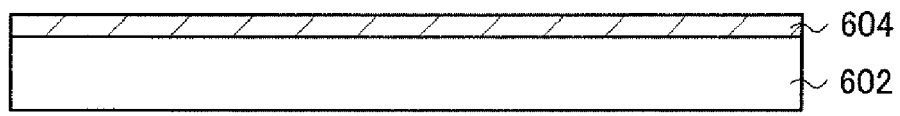
FIGS. 29A to 29D are diagrams showing an example of a manufacturing method of a semiconductor device of the present invention.

A first insulating layer 604 is formed over a substrate 602 (see FIG. 29A).

As the substrate 602, a glass substrate, a quartz substrate, a sapphire substrate, a ceramic substrate, a metal substrate in which an insulating layer is formed on its surface, a semiconductor substrate such as a silicon substrate, or the like can be used.

The first insulating layer 604 is formed by a CVD method, a sputtering method, an ALD method, or the like using silicon oxide, silicon nitride, silicon oxynitride, silicon nitride oxide, or the like. The first insulating layer 604 functions as a base insulating layer. Specifically, the first insulating layer 604 functions as a blocking layer for preventing diffusion of an alkali metal or the like from the substrate 602 into a semiconductor layer so that contamination of the semiconductor layer can be prevented Moreover, the first insulating layer 604 can also function as a planarizing layer when the surface of the substrate 602 has roughness. Further, the first insulating layer 604 which functions as a base insulating layer may employ either a single layer structure or a stacked-layer structure including two or more layers.

Figure 29B:
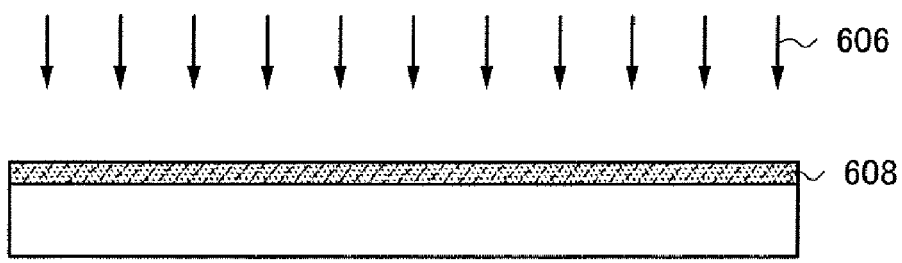

Next, an impurity element 606 which provides one conductivity type is added into the first insulating layer 604, whereby a second insulating layer 608 is formed (see FIG. 29B). The second insulating layer 608 corresponds to the first insulating layer 604 containing the added impurity element 606.

As the impurity element 606 which provides one conductivity type, an element which provides a p-type conductivity such as boron (B), aluminum (Al), or gallium (Ga) or an element which provides an n-type conductivity such as phosphorus (P) or arsenic (As) can be used. The impurity element 606 may be added using a doping method such as an ion implantation method, a thermal diffusion method, or the like. Note that the impurity element 606 may also be added into the substrate 602 under the first insulating layer 604 when being added into the first insulating layer 604.

Figure 29C:
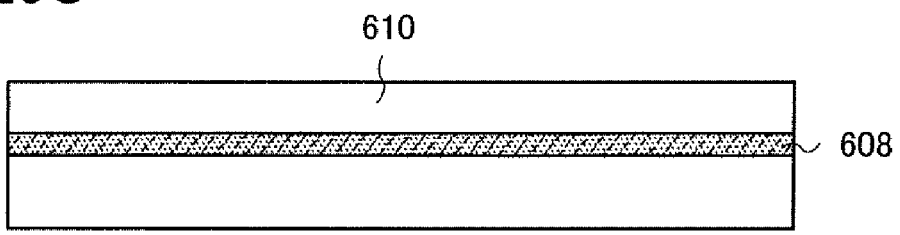

A semiconductor layer 610 is formed over the second insulating layer 608 (see FIG. 29C). In this embodiment mode, an amorphous semiconductor layer is formed as the semiconductor layer 610. The semiconductor layer 610 is preferably formed of a material containing silicon as its main component; specifically, the semiconductor layer 610 can be formed of silicon, silicon-germanium, or the like by a CVD method or a sputtering method. Further, germanium may be used as well.

Figure 29D:
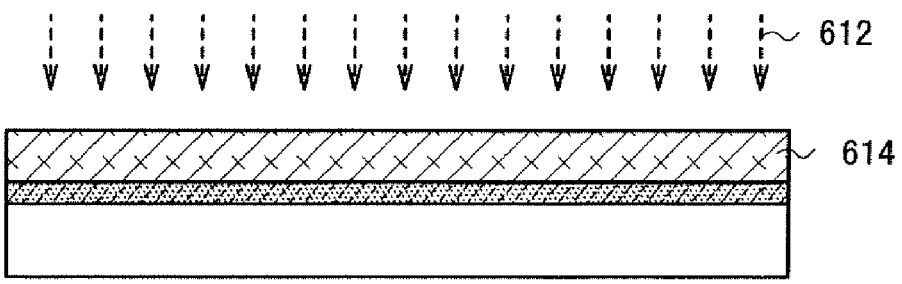

Next, the semiconductor layer 610 is crystallized to form a semiconductor layer 614 having crystalline properties. Into the semiconductor layer 614, the impurity element 606 contained in the second insulating layer 608 is diffused by thermal treatment at the time of the crystallization (see FIG. 29D). As the method for crystallizing the semiconductor layer, a laser crystallization method, a thermal crystallization method using RTA (rapid thermal anneal) or an annealing furnace, a crystallization method using a metal element that promotes crystallization, a method in which a plurality of these methods is combined, or the like is used. As for the detailed explanation on the crystallization method, Embodiment Mode 1 is referred to. For example, in this embodiment mode, crystallization can be performed using a CW laser. In this case, by irradiation with a laser beam 612, the impurity element 606 contained in the second insulating layer 608 is diffused into the semiconductor layer 610, whereby the semiconductor layer 614 having crystalline properties is formed. The semiconductor layer 614 contains the impurity element 606 diffused from the second insulating layer 608 so that the threshold voltage can be controlled by the impurity element.

The concentration of the impurity element contained in the semiconductor layer 614 is different in accordance with a desired threshold voltage. For example, an impurity element which provides a p-type conductivity is preferably contained so as to be contained at concentrations of about $1 \times 10^{16}$ cm$^{-3}$ or more to $1 \times 10^{18}$ cm$^{-3}$ or less. By addition of the impurity element at a certain concentration into the semiconductor layer 614 in part of which a channel formation region is formed later, the threshold voltage of a transistor can be shifted forcibly to a desired threshold voltage.

Note that the impurity element 606 contained in the second insulating layer 608 is diffused into the semiconductor layer by the thermal treatment for crystallization. Therefore, the concentration of the impurity element contained in the second insulating layer 608 after the crystallization of the semiconductor layer is reduced.

The crystalline semiconductor layer 614 obtained through the above is processed into a desired shape, so that the crystalline semiconductor layer 614 can be used as a semiconductor layer in the semiconductor device described in each of Embodiment Modes 1 to 3.

According to this embodiment mode, an impurity element is added into a base insulating layer and the impurity element can be added indirectly into a semiconductor layer with the use of crystallization. Therefore, direct addition of an impurity element into a semiconductor layer by a doping method or the like is not needed, and therefore, a defect and the like at the time of doping can be prevented and crystalline properties of a semiconductor layer can be prevented from being affected. Further, activation of the impurity element can also be performed by the thermal treatment for crystallization.

Note that this embodiment mode can be combined with another embodiment mode described in this specification as needed.

Embodiment Mode 5

In this embodiment mode, an example of a semiconductor device which is different from those described in the above embodiment modes and a manufacturing method thereof is described using FIGS. 15A to 15C, 16A to 16D, 17A to 17D, 18A and 18B, 19A to 19C, 20A to 20E, 21A to 21D, and 22A and 22B. Specifically, an example of a semiconductor device having thin film transistors having different conductivity types is described.

Figure 15A:
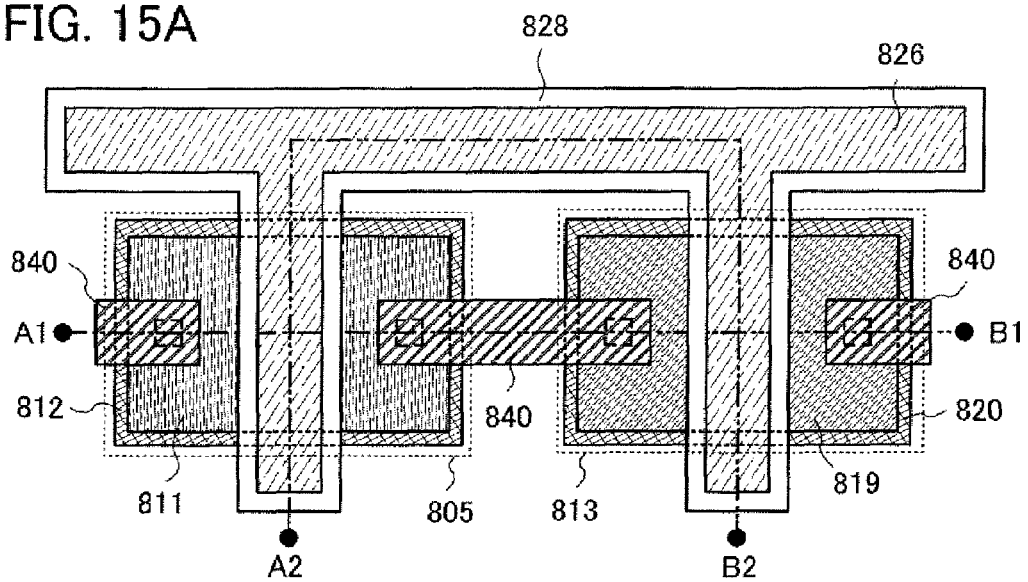
FIGS. 15A to 15C are diagrams showing an example of a main structure of a semiconductor device of the present invention.
Figure 15B:
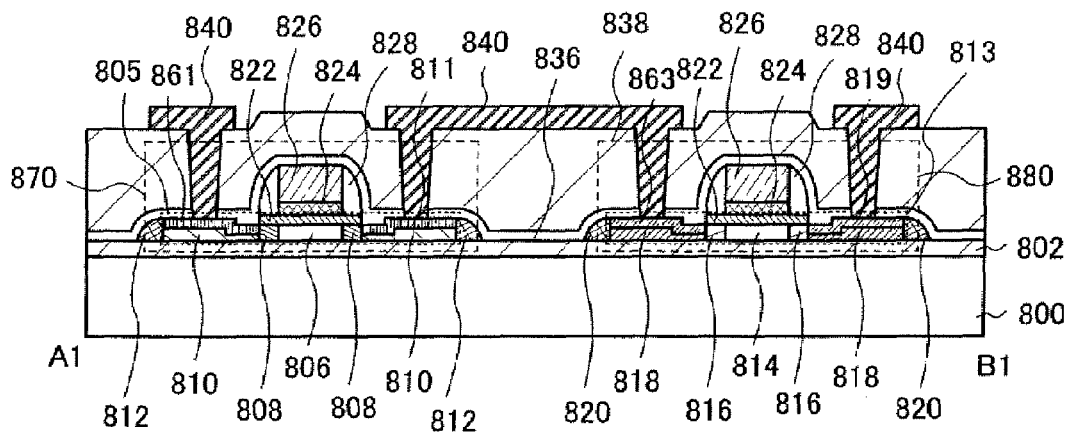
Figure 15C:
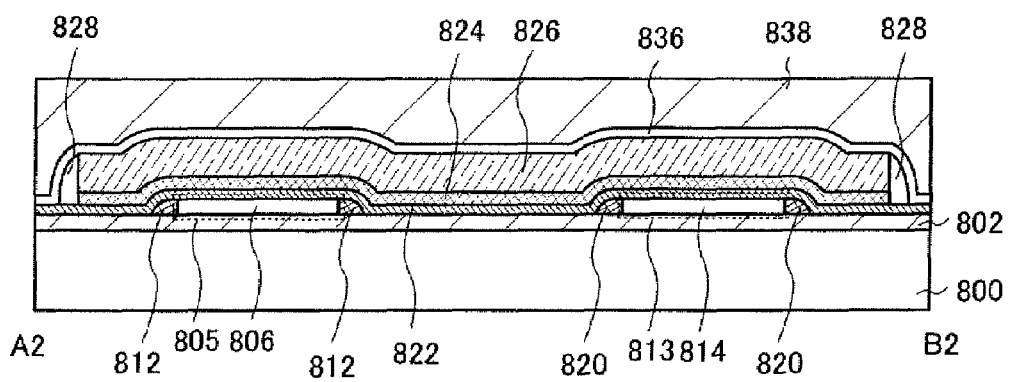

FIG. 15A is a top diagram and FIGS. 15B and 15C are cross-sectional diagrams for describing a structure of a semiconductor device having a plurality of transistors, of this embodiment mode. FIG. 15A is a top diagram, FIG. 15B is a cross-sectional diagram along a one-dotted dashed line A1-B1 in FIG. 15A, and FIG. 15C is a cross-sectional diagram along a one-dotted dashed line A2-B2 in FIG. 15A. Note that component elements such as a thin film and the like are partially omitted in FIG. 15A.

A semiconductor device shown in FIGS. 15A to 15C includes island-shaped semiconductor layers 805 and 813 which are provided over a substrate 800 with an insulating layer 802 interposed therebetween, conductive layers 824 and 826 which form gate electrodes, provided over the semiconductor layers 805 and 813 with an insulating layer 822 interposed therebetween, and conductive layers 840 which form source and drain electrodes, provided over the conductive layer 826 with insulating layers 836 and 838 interposed therebetween (see FIGS. 15A to 15C).

Each of the gate electrodes is formed of a stacked-layer structure of the conductive layers 824 and 826. The conductive layers 824 and 826 are provided so as to get across the island-shaped semiconductor layers 805 and 813. Further, a side-wall insulating layer 828 is provided in contact with the side surfaces of the conductive layers 824 and 826. Note that, although the example in which the gate electrode is formed of the two-layer-stacked structure of the conductive layers 824 and 826 is described in this embodiment mode, the present invention is not limited thereto; the gate electrode may employ a single layer structure or a stacked-layer structure including three or more layers. When the gate electrode is formed to have a stacked-layer structure of conductive layers, the width of the lower conductive layer may be larger than that of the upper conductive layer. Further, the side surface of the conductive layer included in a gate electrode may be tapered. Further, the gate electrode may employ a stacked-layer structure including two or more conductive layers, and the taper angle may be different in the layers. Further, in the case where silicide regions are not to be formed later, the sidewall insulating layer 828 is not necessarily formed.

The island-shaped semiconductor layer 805 includes a locally thinned region. The semiconductor layer 805 includes a channel formation region 806, a pair of low-concentration impurity regions 808 which function as LDD regions, a pair of high-concentration impurity regions 810 which function as a source and drain region, and silicide regions 861 which are in contact with the high-concentration impurity regions 810. The channel formation region 806 is formed in the semiconductor layer 805 in the region which overlaps with the conductive layers 824 and 826 with the insulating layer 822 interposed therebetween. In addition, the channel formation region 806 is formed in the semiconductor layer 805 in the locally thinned region. The low-concentration impurity regions 808 are formed in the semiconductor layer 805 in the regions which overlap with the sidewall insulating layer 828 with the insulating layer 822 interposed therebetween. The high-concentration impurity regions 810 are formed in the semiconductor layer 805 in the regions which do not overlap with the conductive layers 824 and 826 and the sidewall insulating layer 828 with the insulating layer 822 interposed therebetween. Further, in the semiconductor layer 805, the silicide regions 861 are formed in the regions which do not overlap with the conductive layers 824 and 826 and the sidewall insulating layer 828 with the insulating layer 822 interposed therebetween and so as to be in contact with the high-concentration impurity regions 810. It can also be said that the silicide regions 861 are part of the high-concentration impurity regions.

The silicide regions 861 are at least partially formed in the non-thinned regions of the semiconductor layer 805. Note that, although the example in which the silicide regions 861 are formed to have a thickness less than that of the semiconductor layer 805 in the thinned region is described in this embodiment mode, the present invention is not limited thereto. For example, in the semiconductor layer 805 in the region which does not overlap with the sidewall insulating layer 828, either partially or entirely, silicide regions which are formed by making the semiconductor layer 805 from top surface to bottom surface silicide may be formed. The top surface here means the surface of the semiconductor layer 805 on the side on which a metal layer for silicide reaction is formed and the bottom surface means the surface which is in contact with the insulating layer 802. Further, the silicide region may extend to the semiconductor layer 805 in the region just under the sidewall insulating layer 828 (except the channel formation region 806).

Further, the insulating layer 822 which functions as a gate insulating layer is formed only in the region of the semiconductor layer 805 which overlaps with the sidewall insulating layer 828 and the conductive layers 824 and 826 which form a gate electrode. Note that, in the case where the silicide regions 861 are not formed, the insulating layer 822 which functions as a gate insulating layer may be formed so as to cover the entire surface of the semiconductor layer 805. Further, the conductive layers 840 which function as source and drain electrodes are in contact with the silicide regions 861 and electrically connected to the high-concentration impurity regions 810 with the silicide regions 861 interposed therebetween.

The channel formation region 806 is positioned between the pair of high-concentration impurity regions 810 and each of the low-concentration impurity regions 808 is positioned between the channel formation region 806 and each of the high-concentration impurity regions 810. That is, the channel formation region 806 is positioned between the pair of high-concentration impurity regions 810 and between the pair of low-concentration impurity regions 808, and is in contact with the pair of low-concentration impurity regions 808. The concentration of an impurity element which provides one conductivity type added into the high-concentration impurity regions 810 is higher than that of the low-concentration impurity regions 808. Further, a side-surface insulating layer 812 is provided in contact with the side surface of the semiconductor layer 805.

Similarly, the island-shaped semiconductor layer 813 includes a locally thinned region. The semiconductor layer 813 includes a channel formation region 814, a pair of low-concentration impurity regions 816 which function as LDD regions, a pair of high-concentration impurity regions 818 which function as a source and drain region, and silicide regions 863 which are in contact with and on the high-concentration impurity regions 818. The channel formation region 814 is formed in the semiconductor layer 813 in the region which overlaps with the conductive layers 824 and 826 with the insulating layer 822 interposed therebetween. In addition, the channel formation region 814 is formed in the semiconductor layer 813 in the locally thinned region. The low-concentration impurity regions 816 are formed in the semiconductor layer 813 in the regions which overlap with the sidewall insulating layer 828 with the insulating layer 822 interposed therebetween. The high-concentration impurity regions 818 are formed in the semiconductor layer 813 in the regions which do not overlap with the conductive layers 824 and 826 and the sidewall insulating layer 828 with the insulating layer 822 interposed therebetween. Further, in the semiconductor layer 813, the silicide regions 863 are formed in the regions which do not overlap with the conductive layers 824 and 826 and the sidewall insulating layer 828 with the insulating layer 822 interposed therebetween and so as to be in contact with and on the high-concentration impurity regions 818. It can also be said that the silicide regions 863 are part of the high-concentration impurity regions.

The silicide regions 863 are at least partially formed in the non-thinned regions of the semiconductor layer 813. Note that, although the example in which the silicide regions 863 are formed to have a thickness less than that of the semiconductor layer 813 in the thinned region is described in this embodiment mode, the present invention is not limited thereto. For examples in the semiconductor layer 813 in the region which does not overlap with the sidewall insulating layer 828, either partially or entirely, silicide regions which are formed by making the semiconductor layer 813 from top surface to bottom surface silicide may be formed. The top surface here means the surface of the semiconductor layer 813 on the side on which a metal layer for silicide reaction is formed and the bottom surface means the surface which is in contact with the insulating layer 802. Further, the silicide region may extend to the semiconductor layer 813 in the region just under the sidewall insulating layer 828 (except the channel formation region 814).

Further, the insulating layer 822 which functions as a gate insulating layer is formed only in the region of the semiconductor layer 813 which overlaps with the sidewall insulating layer 828 and the conductive layers 824 and 826 which form a gate electrode. Note that, in the case where the silicide regions 863 are not formed, the insulating layer 822 which functions as a gate insulating layer may be formed so as to cover the entire surface of the semiconductor layer 813. Further, the conductive layers 840 which function as source and drain electrodes are in contact with the silicide regions 863 and electrically connected to the high-concentration impurity regions 818 with the silicide regions 863 interposed therebetween.

The channel formation region 814 is positioned between the pair of high-concentration impurity regions 818 and each of the low-concentration impurity regions 806 is positioned between the channel formation region 814 and each of the high-concentration impurity regions 818. That is, the channel formation region 814 is positioned between the pair of high-concentration impurity regions 818 and between the pair of low-concentration impurity regions 816, and is in contact with the pair of low-concentration impurity regions 816. The concentration of an impurity element which provides one conductivity type added into the high-concentration impurity regions 818 is higher than that of the low-concentration impurity regions 816. Further, a side-surface insulating layer 820 is provided in contact with the side surface of the semiconductor layer 813.

In this embodiment mode, impurity elements which provide different conductivity types are added into the semiconductor layers 805 and 813. That is, into the low-concentration impurity regions 808 and the high-concentration impurity regions 810, an impurity element which provides a conductivity type which is different from that of the low-concentration impurity regions 816 and the high-concentration impurity regions 818 is added. Further, also into the silicide regions 861, an impurity element which provides a conductivity type which is different from that of the silicide regions 863 may be added.

The insulating layer 822 is provided between each of the semiconductor layers 805 and 813 and the conductive layers 824 and 826 which form gate electrodes. The insulating layer 822 functions as a gate insulating layer. Further, the side-surface insulating layer 812 is provided in contact with the side surface of the semiconductor layer 805, and similarly, the side-surface insulating layer 820 is provided in contact with the side surface of the semiconductor layer 813. Note that, as shown in FIGS. 1SA and 15C, as for the semiconductor layer 805 in the region where the conductive layers 824 and 826 which form a gate electrode get across, the insulating layer 822 which functions as a gate insulating layer is formed over the semiconductor layer 805 and the side-surface insulating layer 812 formed in contact with the side surface of the semiconductor layer 805. Similarly, as for the semiconductor layer 813 in the region where the conductive layers 824 and 826 which form a gate electrode get across, the insulating layer 822 which functions as a gate insulating layer is formed over the semiconductor layer 813 and the side-surface insulating layer 820 formed in contact with the side surface of the semiconductor layer 813. Accordingly, a defect caused by insufficiency of coverage with the insulating layer at the edge of each of the semiconductor layers 805 and 813, in particular, in the regions where the conductive layers 824 and 826 which form a gate electrode get across each of the semiconductor layers 805 and 813 (the regions where each gate electrode goes up the edge of each semiconductor layer) can be prevented. For example, short-circuiting between the semiconductor layer and the gate electrode, occurrence of a leakage current, electrostatic breakdown, or the like can be prevented. Consequently, the reliability of a semiconductor device to be completed can be improved.

The conductive layers 840 which form source and drain electrodes are provided so as to be electrically connected to the high-concentration impurity regions 810 formed in the semiconductor layer 805 and the high-concentration impurity regions 818 formed in the semiconductor layer 813, through openings formed in the insulating layers 836 and 838. At this time, the conductive layers 840 and the high-concentration impurity regions 810 are connected to each other with the silicide regions 861 interposed therebetween. Similarly, the conductive layers 840 and the high-concentration impurity regions 818 are connected to each other with the silicide regions 863 interposed therebetween. Further, the conductive layers 840 are connected to the non-thinned regions of the semiconductor layers 805 and 813. Note that, as shown in FIGS. 15A to 15C, a CMOS circuit may be formed by electrically connecting the high-concentration impurity regions 810 formed in the semiconductor layer 805 to the high-concentration impurity regions 818 which are formed in the semiconductor layer 813 and have a conductivity type which is different from that of the high-concentration impurity regions 810.

Next, one example of a manufacturing method of the semiconductor device shown in FIGS. 15A to 15C is described below using drawings.

Figure 16A:
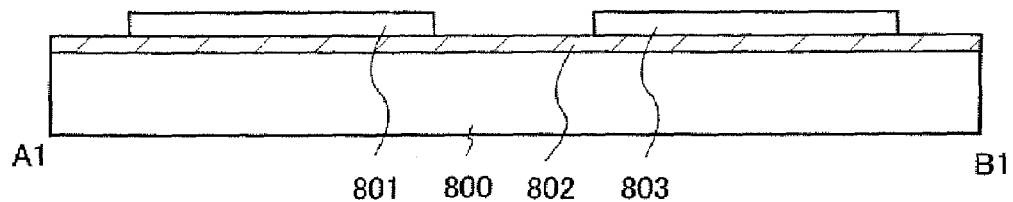
FIGS. 16A to 16D are diagrams showing an example of a manufacturing method of a semiconductor device of the present invention.
Figure 20A:
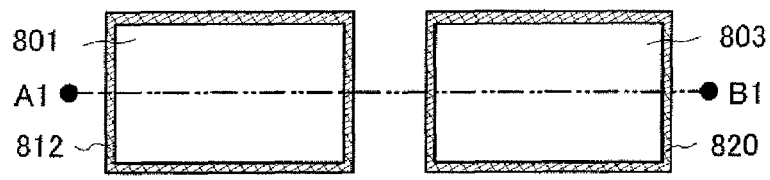
FIGS. 20A to 20E are diagrams showing an example of a manufacturing method of a semiconductor device of the present invention.
Figure 21A:
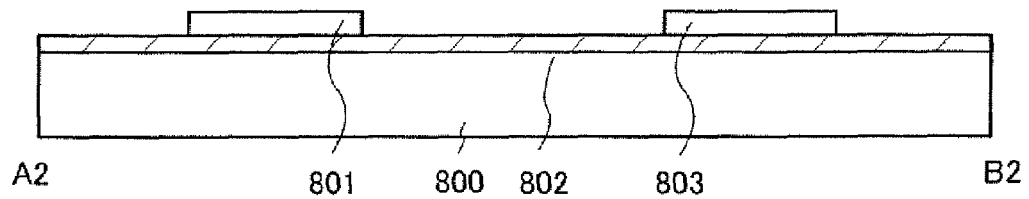
FIGS. 21A to 21D are diagrams showing an example of a manufacturing method of a semiconductor device of the present invention.

First, island-shaped semiconductor layers 801 and 803 are formed over the substrate 800 with the insulating layer 802 interposed therebetween (see FIGS. 16A, 20A, and 21A).

As the substrate 800, a substrate having an insulating surface may be used. For example, a glass substrate, a quartz substrate, a sapphire substrate, a ceramic substrate, a metal substrate in which an insulating layer is formed on its surface, or the like can be used.

The insulating layer 802 is formed by a CVD method, a sputtering method, or an ALD method, using silicon oxide, silicon nitride, silicon oxynitride, silicon nitride oxide, or the like. The insulating layer 802 functions as a blocking layer for preventing diffusion of an alkali metal or the like from the substrate 800 into the semiconductor layers 801 and 803 so that contamination of the semiconductor layers 801 and 803 can be prevented. Moreover, the insulating layer 802 can also function as a planarizing layer when the surface of the substrate 800 has roughness. Note that the insulating layer 802 is not necessarily formed if an impurity diffusion from the substrate 800 or roughness of the surface of the substrate 800 does not come to an issue. Further, although the base insulating layer employs a single layer structure in this embodiment mode, a stacked-layer structure including two or more layers may be employed as well.

The semiconductor layers 801 and 803 are preferably formed of materials containing silicon as its main component, such as silicon, germanium, or silicon-germanium by a CVD method or a sputtering method. For example, the semiconductor layers 801 and 803 can be formed as follows; amorphous semiconductor layers of materials containing silicon as its main components are formed, crystallized, and selectively etched to be island shape. As the method for crystallizing each amorphous semiconductor layer, a laser crystallization method, a thermal crystallization method using RTA or an annealing furnace, a thermal crystallization method using a metal element that promotes crystallization, a method in which a plurality of these methods is combined, or the like can be used. Note that, in the case of using a laser crystallization method, it is preferable to use a CW laser or a pulsed laser with a repetition rate of greater than or equal to 10 MHz because crystal grains which are long in one direction can be formed. Each of the semiconductor layers 801 and 803 is formed to have a thickness in the range of 10 to 200 nm, and preferably 30 to 50 nm.

Note that each of the semiconductor layers 801 and 803 may be formed such that the edge is tapered or is perpendicular to the bottom surface. The shape of edge of the semiconductor layer can be controlled by the etching condition selected as appropriate.

Note that, although the example in which the semiconductor layers 801 and 803 are formed using a crystallization method is described in this embodiment mode, an SOI substrate in which a single crystalline semiconductor layer is provided on an insulating surface may be used as well instead of performing such a thin-film process. In this case, the single crystalline semiconductor layer provided on the insulating surface corresponds to each of the semiconductor layers 801 and 803.

Figure 16B:
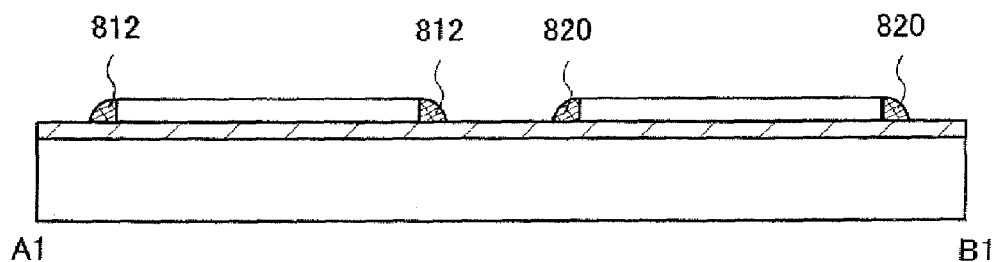
Figure 21B:
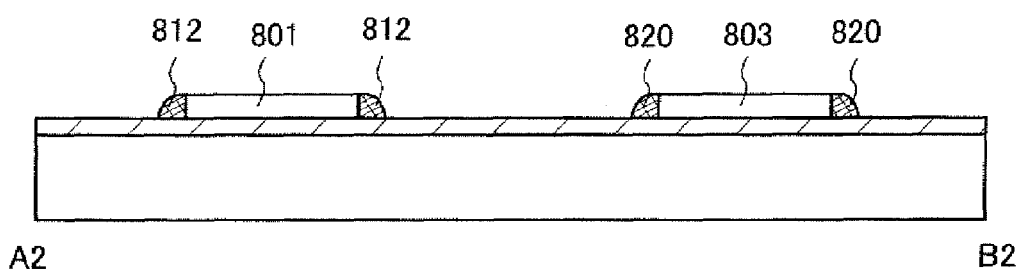

Next, the side-surface insulating layer 812 which is in contact with the side surface of the semiconductor layer 801 and the side-surface insulating layer 820 which is in contact with the side surface of the semiconductor layer 803 are formed (see FIGS. 16B, 20A, and 21B).

The side-surface insulating layers 812 and 820 can be formed as follows; an insulating layer is formed so as to cover and envelop the island-shaped semiconductor layers 801 and 803, and the insulating layer is selectively etched by anisotropic etching mainly in a perpendicular direction, so that the insulating layer is left only in regions which are in contact with the side surfaces of the semiconductor layers 801 and 803.

Specifically, an insulating layer is formed so as to envelop the semiconductor layers 801 and 803, first. The insulating layer is formed of a material such as silicon oxide, silicon nitride, silicon oxynitride, silicon nitride oxide, SiOF, SiOC, DLC, porous silica, or the like by a CVD method or a sputtering method. Preferably, the insulating layer is formed of a layer having the dielectric constant which is lower than that of the insulating layer 822 formed later over the semiconductor layers 801 and 803 because concentration of an electric field due to the shape of edge of the semiconductor layer can be relaxed. Further, the insulating layer which is formed so as to cover the semiconductor layers 801 and 803 is formed to have a thickness enough to cover at least the edges of the semiconductor layers 801 and 803. The insulating layer is preferably formed to have a thickness of 1.5 to 3 times as large as that of each of the semiconductor layers 801 and 803.

Next, the insulating layer which is formed so as to cover the semiconductor layers 801 and 803 is selectively etched by anisotropic etching mainly in a perpendicular direction, whereby the side-surface insulating layers 812 and 820 are formed. Each of the side-surface insulating layers 812 and 820 may be curved or angulated. Preferably, the corner portion of each of the side-surface insulating layers 812 and 820 is made gentle so that the coverage with a layer formed thereover can be improved.

Note that due to the etching for forming the side-surface insulating layers 812 and 820, the semiconductor layers 801 and 803 may be partially made amorphous. In this case, the amorphous regions of the semiconductor layers 801 and 803 may be selectively etched, or the semiconductor layers 801 and 803 may be recrystallized by performing thermal treatment with laser beam irradiation, RTA, or an annealing furnace. Alternatively, after impurity regions are formed by addition of impurity elements which provide conductivity types into the semiconductor layers, recrystallization may be performed together with thermal treatment for activating the impurity regions.

Figure 16C:
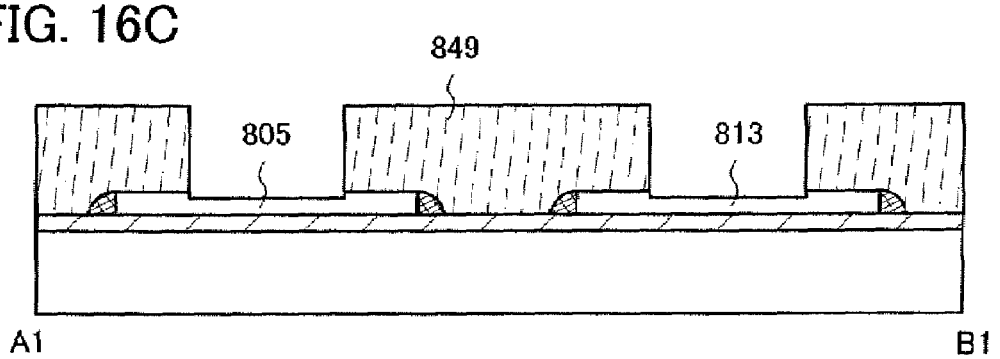
Figure 20B:
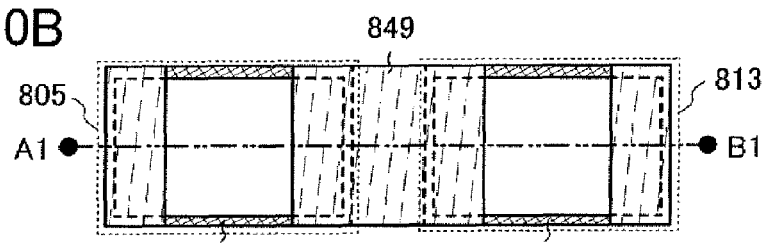
Figure 21C:
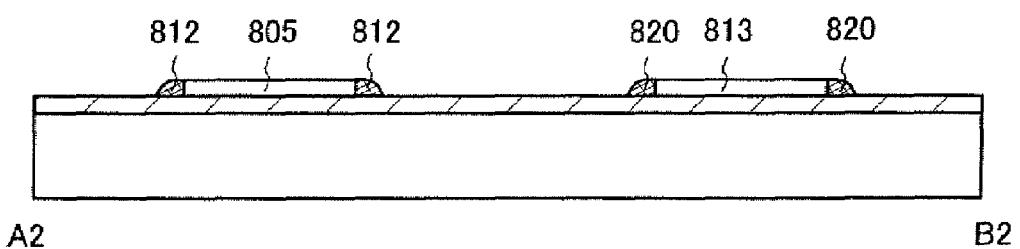

Next, the semiconductor layers 801 and 803 are locally thinned to form the semiconductor layers 805 and 813 (see FIGS. 16C, 20B, and 21C).

The semiconductor layer 805 is formed by locally thinning the semiconductor layer 801 with selective etching. Similarly, the semiconductor layer 813 is formed by locally thinning the semiconductor layer 803 with selective etching. At this time, the region not to be thinned is covered with a resist mask 849. Note that it is necessary that the etching condition is controlled such that the semiconductor layer with a desired thickness is left in the region which is not covered with the resist mask. The etching of the semiconductor layers 801 and 803 is preferably performed mainly in a perpendicular direction from the side on which the resist mask 849 is formed to the side which is in contact with the insulating layer 802. After the etching, the formed semiconductor layers 805 and 813 have depressions and the depressions correspond to thinned regions. After etching of the semiconductor layers, the resist mask 849 is removed.

The thickness of each of the semiconductor layers 805 and 813 is in the range of 0.5 to 200 nm, and preferably in the range of 10 to 50 nm. Further, the thickness of each the semiconductor layers 805 and 813 in the thinned regions is 0.5 to 30 nm, and preferably in the range of 10 to 25 nm.

Note that, in thinning the semiconductor layers 801 and 803, the etching is preferably performed such that the perpendicular height from the bottom surface (the surface which is in contact with the insulating layer 802) is almost the same in the semiconductor layers 801 and 803 and the side-surface insulating layers 812 and 820 in the regions which are not covered with the resist mask 849 (see FIGS. 21B and 21C). In this case, the semiconductor layers 801 and 803 and the side-surface insulating layers 812 and 820 may be etched by the etching condition in which the etching rates thereof are almost the same as each other, that is, the etching selection ratio is close to 1.

Further, in order to control the threshold voltage of thin film transistors, impurity elements which provide conductivity types may be added at low concentrations into the semiconductor layers 805 and 813, which results in that the impurity elements are added also in the channel formation regions of the thin film transistors. As each of the impurity elements which provide conductivity types, an impurity element which provides an n-type conductivity such as phosphorus (P) or arsenic (As), or an impurity element which provides a p-type conductivity such as boron (B), aluminum (Al), or gallium (Ga) can be used. For example, as the impurity elements, boron can be added so as to be contained at concentrations of about $1 \times 10^{16}$ cm$^{-3}$ or more to $1 \times 10^{18}$ cm$^{-3}$ or less into the semiconductor layers 805 and 813. Note that impurity elements may be added at different concentrations or impurity elements which provide different conductivity types may be added into the semiconductor layers 805 and 813.

Figure 16D:
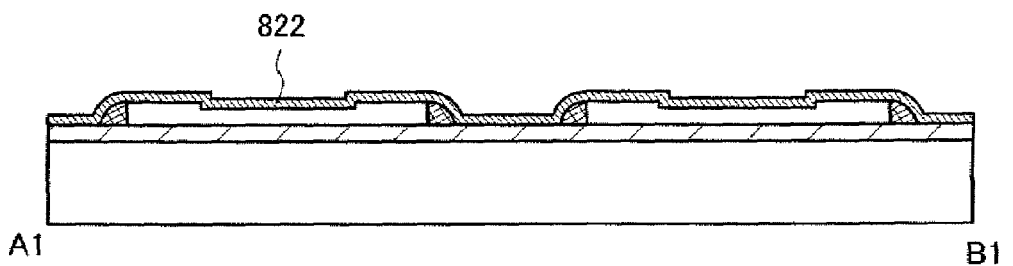
Figure 21D:
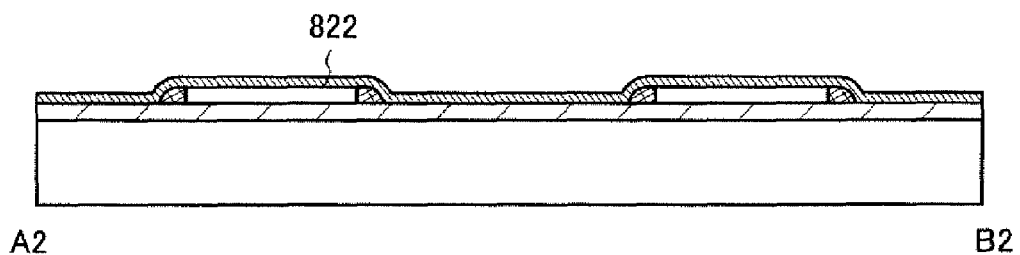

Next, the insulating layer 822 is formed over the semiconductor layer 805, the side-surface insulating layer 812 which is in contact with the side surface of the semiconductor layer 805, the semiconductor layer 813, and the side-surface insulating layer 820 which is in contact with the side surface of the semiconductor layer 813 (see FIGS. 16D and 21D).

The insulating layer 822 is formed by a CVD method, a sputtering method, or an ALD method using silicon oxide, silicon nitride, silicon oxynitride, silicon nitride oxide, aluminum nitride, or the like. The insulating layer 822 is preferably formed of a material of which dielectric constant is higher than that of the side-surface insulating layer 812 which is in contact with the side surface of the semiconductor layer 805 and the side-surface insulating layer 820 which is in contact with the side surface of the semiconductor layer 813. The insulating layer 822 is formed to have a single layer structure or a stacked-layer structure of at least one of the above materials. Further, the insulating layer 822 can also be formed by solid phase oxidation or solid phase nitridation of the semiconductor layers 805 and 813 with high-density plasma treatment. The insulating layer 822 functions as a gate insulating layer. The thickness of the insulating layer 822 is 1 to 50 nm, preferably 1 to 20 nm, and more preferably 1 to 10 nm.

Figure 17A:
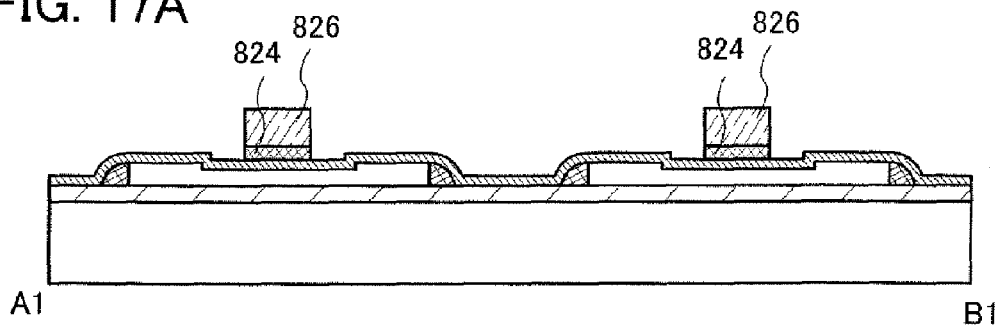
FIGS. 17A to 17D are diagrams showing an example of a manufacturing method of a semiconductor device of the present invention.
Figure 20C:
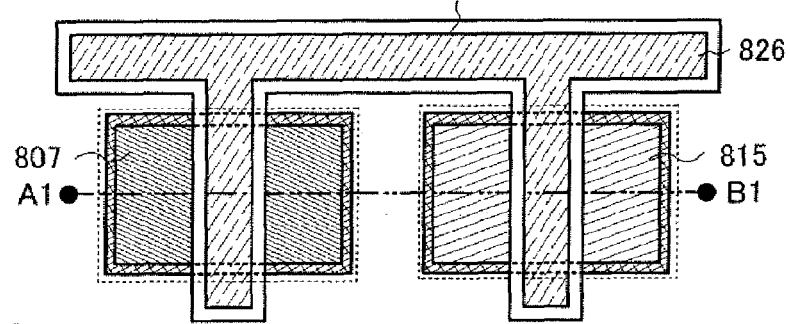
Figure 20D:
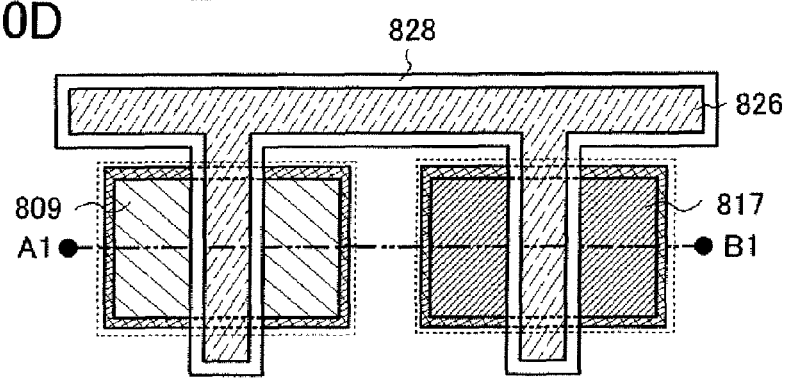
Figure 22A:
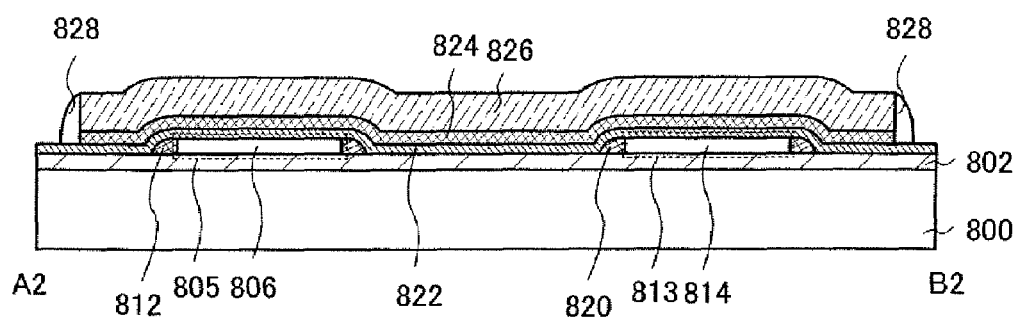
FIGS. 22A and 22B are diagrams showing an example of a manufacturing method of a semiconductor device of the present invention.

Next, the conductive layers 824 and 826 which form a gate electrode are stacked over each of the semiconductor layers 805 and 813 with the insulating layer 822 interposed therebetween (see FIGS. 17A, 20C, and 22A). Note that the conductive layers 824 and 826 which form a gate electrode are formed over the locally thinned regions of the semiconductor layers 805 and 813.

The conductive layer included in a gate electrode can be formed as follows; a conductive layer is formed over the entire surface of the substrate by a CVD method or a sputtering method, using a metal element such as tantalum (Ta), tungsten (W), titanium (Ti), molybdenum (Mo), chromium (Cr), aluminum (Al), copper (Cu), or niobium (Nb), or an alloy material or a compound material containing the above-described metal element, and then selectively etched. Further, a semiconductor material typified by polycrystalline silicon to which an impurity element which provides one conductivity type, such as phosphorus has been added can be used as well. Note that the gate electrode may employ either a single layer structure of a conductive layer or a stacked-layer structure including three or more conductive layers, as well. Further, the side surface of the gate electrode may be tapered. In the case where the gate electrode is formed to have a stacked-layer structure of conductive layers, the lower conductive layer may have a width which is larger than that of the upper conductive layer, and the side surfaces of the conductive layers may be tapered at different angles.

In this embodiment mode, each of the conductive layers 824 and 826 is formed by the following; a conductive layer is formed over the entire surface of the substrate and then selectively etched to be processed into a desired shape. Here, the etching process is performed such that each separated conductive layers get across each of the island-shaped semiconductor layers 805 and 813. At this time, the conductive layers 824 and 826 are processed such that the separated conductive layers come together in the region which does not overlap with the island-shaped semiconductor layers 805 and 813. That is, two pairs of conductive layers branching from one pair of conductive layers are formed such that one of the two pairs of conductive layers gets across the island-shaped semiconductor layer 805 and the other of the two pairs of conductive layers gets across the island-shaped semiconductor layer 813.

Figure 17B:
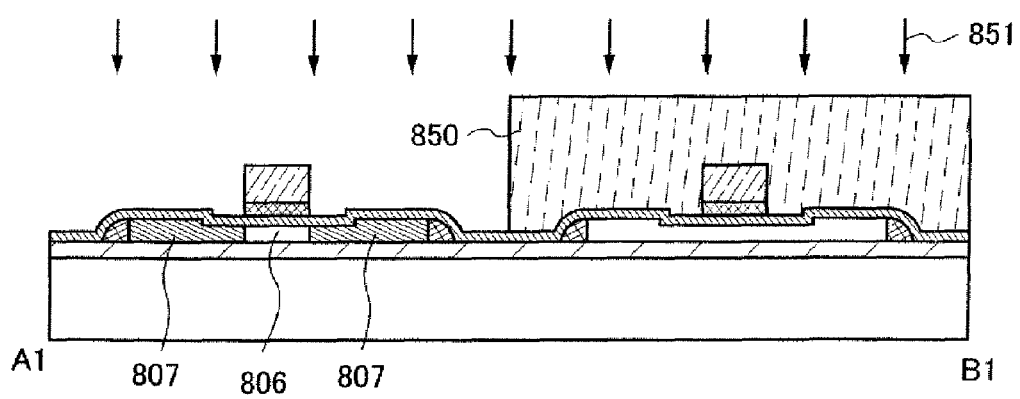

Next, a resist mask 850 is selectively formed so as to cover the semiconductor layer 813, and an impurity element 851 which provides one conductivity type is added into the semiconductor layer 805 at a first concentration with the resist mask 850 and the conductive layers 824 and 826 as masks, whereby impurity regions 807 are formed (see FIGS. 17B and 20C). In this embodiment mode, the impurity element 851 is added with the conductive layers 824 and 826 as masks, so that the pair of impurity regions 807 and the channel formation region 806 which is positioned between the pair of impurity regions 807 are formed in a self-aligned manner. As the impurity element 851, an impurity element which provides an n-type conductivity such as phosphorus (P) or arsenic (As) or an impurity element which imparts a p-type conductivity such as boron (B), aluminum (Al), or gallium (Ga) can be used. In this embodiment mode, phosphorus (P) is added as the impurity element 851. Note that the impurity regions 807 form part of low-concentration impurity regions which function as LDD regions. Further, the channel formation region 806 is formed in the semiconductor layer 805 under the conductive layers 824 and 826. Thus, the channel formation region 806 is formed in the locally thinned region of the semiconductor layer 805.

Figure 17C:
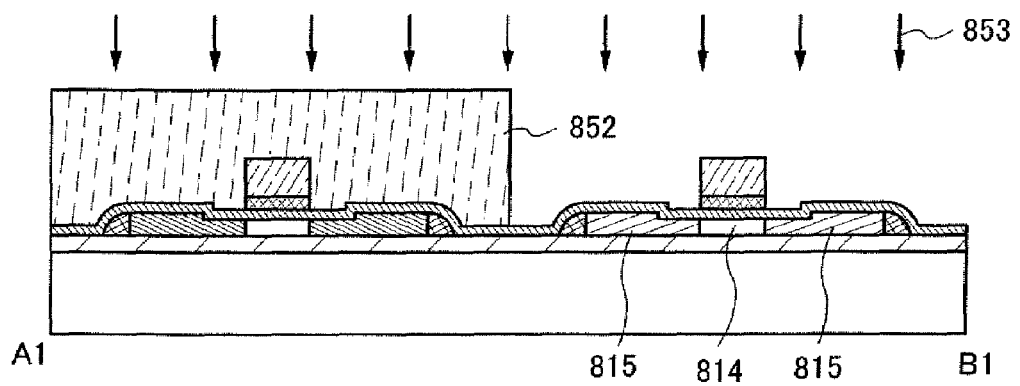

Next, a resist mask 852 is selectively formed so as to cover the semiconductor layer 805, and an impurity element 853 which provides one conductivity type is added into the semiconductor layer 813 at a second concentration with the resist mask 852 and the conductive layers 824 and 826 as masks, whereby impurity regions 815 are formed (see FIGS. 17C and 20C). In this embodiment mode, the impurity element 853 is added with the conductive layers 824 and 826 as masks, so that the pair of impurity regions 815 and the channel formation region 814 which is positioned between the pair of impurity regions 815 are formed in a self-aligned manner. As the impurity element 853, an element which provides a conductivity type which is different from that of the impurity element 851 added into the semiconductor layer 805 is added. In this embodiment mode, boron (B) is added. Note that the impurity regions 815 form part of low-concentration impurity regions which function as LDD regions. Further, the channel formation region 814 is formed in the semiconductor layer 813 under the conductive layers 824 and 826. Thus, the channel formation region 814 is formed in the locally thinned region of the semiconductor layer 813.

Figure 17D:
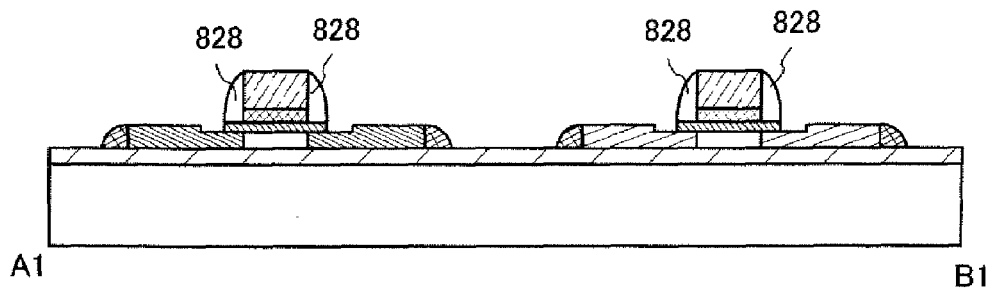
Figure 18A:
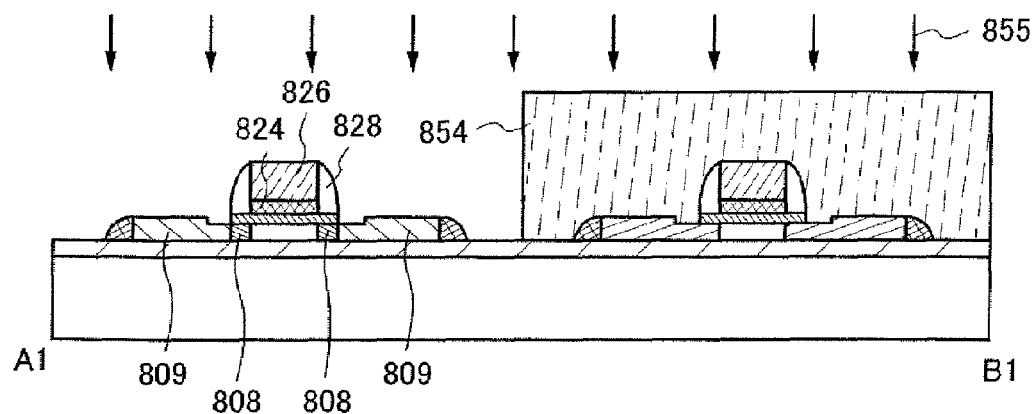
FIGS. 18A and 18B are diagrams showing an example of a manufacturing method of a semiconductor device of the present invention.
Figure 18B:
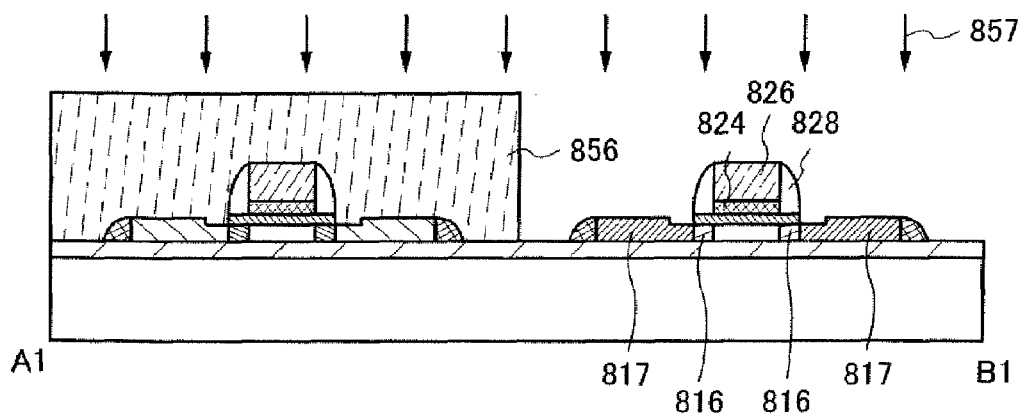

Next, the sidewall insulating layer 828 which is in contact with the side surfaces of the conductive layers 824 and 826 is formed (see FIGS. 17D, 20C, and 22A). The sidewall insulating layer 828 can be formed so as to be in contact with the side surfaces of the conductive layers 824 and 826 as follows; an insulating layer having a single layer structure or a stacked-layer structure is formed by a CVD method or a sputtering method using an inorganic material such as silicon oxide, silicon nitride, silicon oxynitride, or silicon nitride oxide, or an organic material such as an organic resin, and the insulating layer is selectively etched by anisotropic etching mainly in a perpendicular direction. In this embodiment mode, the surface of the sidewall insulating layer 828, which is not in contact with the side surfaces of the conductive layers 824 and 826 is curved. Specifically, the sidewall insulating layer 828 is formed such that an appropriate curvature is provided to curve convexly with respect to the side surfaces of the conductive layers 824 and 826 which are in contact with the sidewall insulating layer 828. It is needless to say that the present invention is not limited thereto, and the sidewall insulating layer 828 may be angulated instead of being curved. Note that the sidewall insulating layer 828 can be also used as a doping mask for forming the low-concentration impurity regions which function as LDD regions.

Further, the etching for forming the sidewall insulating layer 828 also etches the insulating layer 822 under the sidewall insulating layer 828 to selectively expose part of the semiconductor layers 805 and 813, specifically, the regions which do not overlap with the sidewall insulating layer 828 are exposed The insulating layer 822 is left in the regions where the sidewall insulating layer 828 and the conductive layers 824 and 826 overlap with each of the semiconductor layers 805 and 813. Furthermore, depending on the etching condition for forming the sidewall insulating layer 828, the upper portion of each of the semiconductor layers 805 and 813 may also be etched to reduce the thickness.

Next, a resist mask 854 is selectively formed so as to cover the semiconductor layer 813. An impurity element 855 which provides one conductivity type is added into the semiconductor layer 805 at a third concentration with the resist mask 854, the conductive layers 824 and 826, and the sidewall insulating layer 828 provided so as to be in contact with the side surfaces of the conductive layers 824 and 826, as masks (see FIGS. 18A and 20C). In this embodiment mode, the impurity element 855 is added into the semiconductor layer 805 with the conductive layers 824 and 826 and the sidewall insulating layer 828 provided so as to be in contact with the side surfaces of the conductive layers 824 and 826 as masks, so that a pair of high-concentration impurity regions 809 and the pair of low-concentration impurity regions 808 are formed in a self-aligned manner. The high-concentration impurity regions 809 function as a source and drain region and the low-concentration impurity regions 808 function as LDD regions. As the impurity element 855, an impurity element which provides the same conductivity type as the impurity element 851 added into the semiconductor layer 805 is added. In this embodiment mode, phosphorus (P) is added. Further, as for the addition of the impurity element, the third concentration is higher than the first concentration. Therefore, the concentration of the impurity element in the high-concentration impurity regions 809 is higher than that of the low-concentration impurity regions 808.

Next, a resist mask 856 is selectively formed so as to cover the semiconductor layer 805. An impurity element 857 which provides one conductivity type is added into the semiconductor layer 813 at a fourth concentration with the resist mask 856, the conductive layers 824 and 826, and the sidewall insulating layer 828 provided so as to be in contact with the side surfaces of the conductive layers 824 and 826, as masks (see FIGS. 18B and 20D). In this embodiment mode, the impurity element 857 is added into the semiconductor layer 813 with the conductive layers 824 and 826 and the sidewall insulating layer 828 provided so as to be in contact with the side surfaces of the conductive layers 824 and 826 as masks, so that a pair of high-concentration impurity regions 817 and the pair of low-concentration impurity regions 816 are formed in a self-aligned manner. The high-concentration impurity regions 817 function as a source and drain region, and the low-concentration impurity regions 816 function as LDD regions. As the impurity element 857, an impurity element which provides the same conductivity type as the impurity element 853 added into the semiconductor layer 813 is added. In this embodiment mode, boron (B) is added. Further, as for the addition of the impurity element, the fourth concentration is higher than the second concentration. Therefore, the concentration of the impurity element in the high-concentration impurity regions 817 is higher than that of the low-concentration impurity regions 816.

Through the above, the high-concentration impurity regions 809 which function as a source and drain region, the low-concentration impurity regions 808 which function as LDD regions, and the channel formation region 806 are formed in the semiconductor layer 805, and the high-concentration impurity regions 817 which function as a source and drain region, the low-concentration impurity regions 816 which function as LDD regions, and the channel formation region 814 are formed in the semiconductor layer 813. In this embodiment mode, the channel formation regions 806 and 814 can be formed in a self-aligned manner by using the conductive layers 824 and 826. Further, the low-concentration impurity regions 808 and 816 can be formed in a self-aligned manner by using the conductive layers 824 and 826 and the sidewall insulating layer 828 which is in contact with the side surfaces of the conductive layers 824 and 826.

Figure 19A:
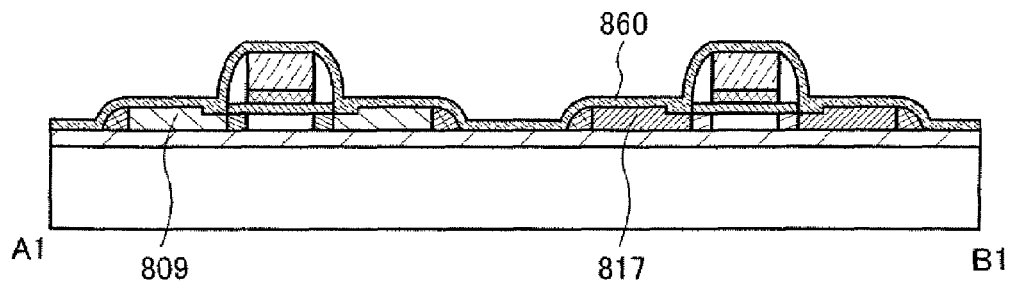
FIGS. 19A to 19C are diagrams showing an example of a manufacturing method of a semiconductor device of the present invention.

Next, a metal layer 860 is formed on the exposed semiconductor layers 805 and 813 (see FIG. 19A).

The metal layer 860 is formed at least on the exposed semiconductor layers 805 and 813. In this embodiment mode, the metal layer 860 is formed over the entire surface of the substrate. The metal layer 860 is formed of a material which reacts with a semiconductor layer to form silicide. For example, the metal layer 860 may be formed by a sputtering method or the like, using a metal element such as nickel, titanium, cobalt, platinum, or the like, or an alloy material containing the metal element. The thickness of the metal layer 860 can be selected as appropriate in accordance with the shape, thickness, and the like of a silicide region to be formed Note that, if a natural oxide layer has been formed on the exposed semiconductor layer when the metal layer 860 is formed, the metal layer 860 is formed after the natural oxide layer is removed.

Figure 19B:
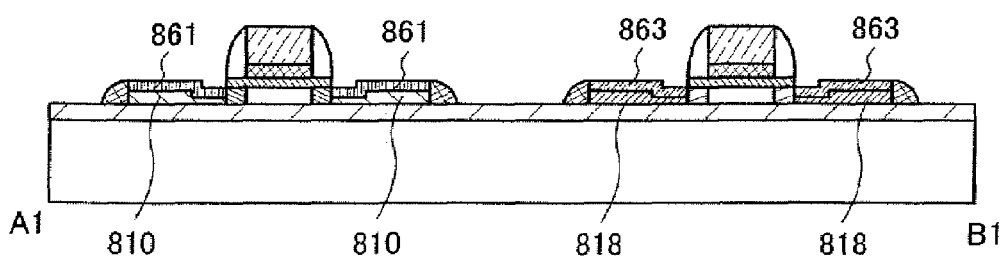
Figure 20E:
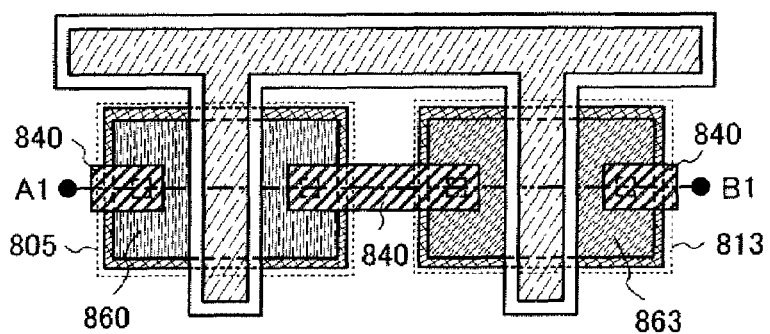

Next, the silicide regions 861 and the silicide regions 863 are formed in part of the semiconductor layer 805 and the semiconductor layer 813, respectively (see FIGS. 19B and 20E).

The silicide regions 861 and 863 are formed by reaction of the regions where the semiconductor layer 805 and the metal layer 860 are in contact with each other and the semiconductor layer 813 and the metal layer 860 are in contact with each other, with thermal treatment to make part of the semiconductor layers in the regions silicide. Note that, in this embodiment mode, the region of the high-concentration impurity regions 809 formed in the semiconductor layer 805 is reduced to be the high-concentration impurity regions 810 since part of the high-concentration impurity regions 809 is made silicide, and similarly, the region of the high-concentration impurity regions 817 formed in the semiconductor layer 813 is reduced to be the high-concentration impurity regions 818 since part of the high-concentration impurity regions 817 is made silicide. Note that, it can be said that the silicide regions are formed in part of the high-concentration impurity regions. The thermal treatment can be performed using RTA or an annealing furnace.

Note that the shape, thickness, and the like of the silicide regions 861 and 863 can be selected by the thickness, period of time for thermal treatment, temperature of thermal treatment, and the like of the metal layer 860, being controlled as appropriate. In this embodiment mode, the example in which the silicide regions 861 and 863 have thicknesses which are smaller than those of the thinned regions of the semiconductor layers 805 and 813 respectively is described. Note that, in the semiconductor layers 805 and 813, the entire region which does not overlap with the conductive layers 824 and 826 which form a gate electrode and the sidewall insulating layer 828 which is in contact with the side surfaces of the conductive layers 824 and 826 may be made silicide as well. Further, the silicide region may extend to the semiconductor layer in the region just under the sidewall insulating layer 828 as well so as not to make the channel formation region silicide.

After the desired silicide regions 861 and 863 are formed, the metal layer which has not reacted is removed by etching. For example, since the metal layer is formed over the entire surface of the substrate in this embodiment mode, the metal layer above the insulating layer 802, the side-surface insulating layers 812 and 820, the sidewall insulating layer 828, and the conductive layers 826 is removed. Further, in the case where the metal layer which has not reacted remains above the silicide regions 861 and 863, the remaining metal layer is also removed.

Figure 19C:
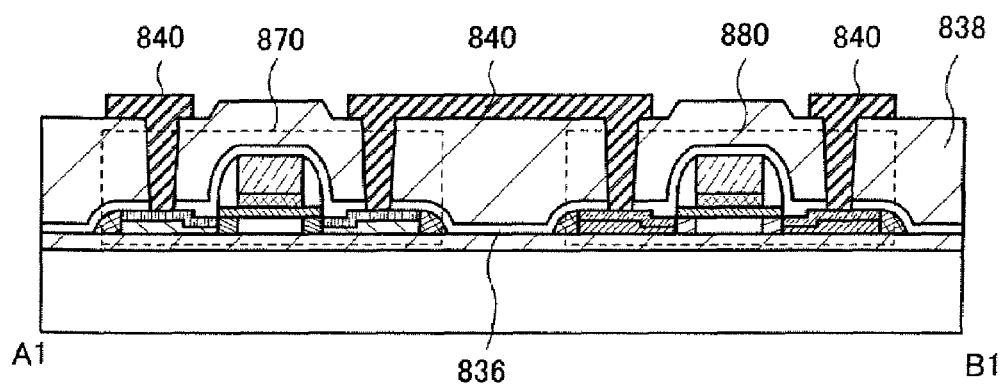
Figure 22B:
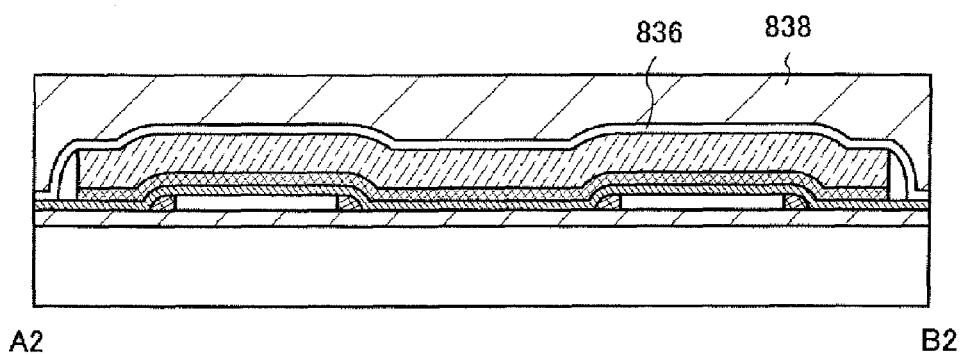

Next, the insulating layers 836 and 838 are formed so as to cover the insulating layers, the conductive layers, and the like provided over the substrate 800, and the conductive layers 840 which are electrically connected to the high-concentration impurity regions 810 formed in the semiconductor layer 805 and the high-concentration impurity regions 818 formed in the semiconductor layer 813 are formed over the insulating layer 838 (see FIGS. 19C, 20E, and 22B). The conductive layers 840 function as source and drain electrodes.

Each of the insulating layers 836 and 838 is formed by a CVD method, a sputtering method, an ALD method, a coating method, or the like, using an inorganic insulating material containing oxygen or nitrogen such as silicon oxide, silicon nitride, silicon oxynitride, silicon nitride oxide, or the like; an insulating material containing carbon such as DLC (Diamond-Like Carbon); an organic insulating material such as epoxy, polyimide, polyamide, polyvinyl phenol, benzocyclobutene, acrylic, or the like; or a siloxane material such as a siloxane resin. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or an aromatic hydrocarbon) is used. Alternatively, a fluoro group, or a fluoro group and an organic group containing at least hydrogen can be used as a substituent. Further, the insulating layers 836 and 838 may also be formed by forming an insulating layer with a CVD method, a sputtering method, or an ALD method and then performing high-density plasma treatment thereto in an oxygen atmosphere or a nitrogen atmosphere. Although the two-layer-stacked structure of the insulating layers 836 and 838 is formed over the conductive layer 826 and the like in this embodiment mode, either a single layer structure or a stacked-layer structure including three or more layers may be employed as well.

The conductive layer 840 can be formed by a CVD method or a sputtering method, using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mg), neodymium (Nd), carbon (C), or silicon (Si), or an alloy material or a compound material containing the metal element, to have a single layer structure or a stacked-layer structure. As examples of an alloy material containing aluminum, an alloy material containing aluminum as its main component and nickel and an alloy material containing aluminum as its main component, nickel, and at least one of carbon and silicon can be given. The conductive layer 840 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that the barrier layer corresponds to a thin film formed of titanium, nitride of titanium, molybdenum, or nitride of molybdenum. Aluminum and aluminum silicon which have low resistance and are inexpensive are suitable for forming the conductive layers 840. Further, generation of a hillock of aluminum or aluminum silicon can be prevented when upper and lower barrier layers are provided.

The conductive layers 840 are formed so as to be in contact with and electrically connected to the non-thinned regions of the semiconductor layer 805. Similarly, the conductive layers 840 are formed so as to be in contact with and electrically connected to the non-thinned regions of the semiconductor layer 813. By thus doing, when openings in which the conductive layers 840 are formed are formed in the insulating layers 836 and 838, the semiconductor layers 805 and 813 can be prevented from being partially removed, and reduction of the yield in the manufacturing process can be prevented. Further, since the conductive layers 840 are electrically connected to the high-concentration impurity regions 810 and the high-concentration impurity regions 818 with the silicide regions 861 and 863 interposed therebetween, respectively, contact resistance (contact resistance between conducive layer and semiconductor layer) can be reduced, so that lower power consumption can be realized.

Through the above, a semiconductor device including an n-channel transistor 870 formed using the semiconductor layer 805 and a p-channel transistor 880 formed using the semiconductor layer 813 can be manufactured. In this embodiment mode, the conductive layer 840 which is electrically connected to the high-concentration impurity region 810 formed in the semiconductor layer 805 and the conductive layer 840 which is electrically connected to the high-concentration impurity region 818 formed in the semiconductor layer 813 are electrically connected to each other so that a CMOS circuit including the n-channel transistor and the p-channel transistor is formed.

Note that, although the example of manufacturing a CMOS circuit including two thin film transistors having different conductivity types is described in this embodiment mode, the present invention is not limited thereto. For example, an nMOS circuit including a plurality of n-channel thin film transistors, a pMOS circuit including a plurality of p-channel thin film transistors, or the like can be manufactured as well. For forming such an nMOS circuit, a pMOS circuit, or the like, an impurity element to be added into a semiconductor layer may be selected as appropriate. Further, the thin film transistors included in the CMOS circuit of the present invention are not limited to have the structures of the thin film transistors described in this embodiment mode, and any thin film transistor described in any of the other embodiment modes can be used as appropriate.

In a semiconductor device manufactured by applying the present invention, the subthreshold factor (S value) can be reduced, the threshold voltage can be reduced, and operating characteristics of a semiconductor device can be improved. Further, a defect due to shape, characteristics, and the like of edge of a semiconductor layer can be prevented or reduced, so that the reliability of a semiconductor device can be improved. Further, the contact resistance between semiconductor layer and electrode (wiring) can be reduced, so that lower power consumption can be realized. Thus, higher performance of a semiconductor device can be realized.

Note that this embodiment mode can be combined with another embodiment mode described in this specification as needed.

Embodiment Mode 6

The semiconductor device according to the present invention can be applied to an integrated circuit such as a CPU (Central Processing Unit). In this embodiment mode, an example of a CPU to which the semiconductor device shown in FIGS. 15A to 15C is described below with reference to drawings.

Figure 23:
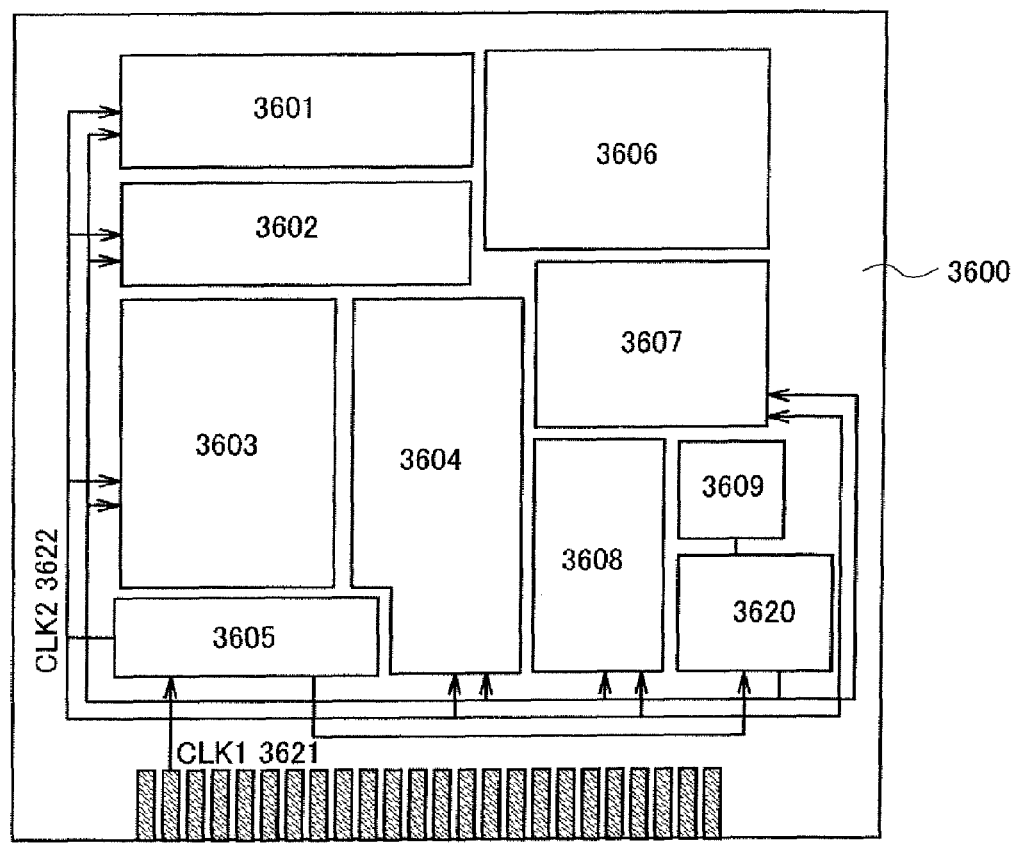
FIG. 23 is a block diagram showing an example of a semiconductor device of the present invention.

A CPU 3660 shown in FIG. 23 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, an erasable programmable ROM 3609, and a ROM interface (ROM I/F) 3620, over a substrate 3600. The ROM 3609 and the ROM interface 3620 may be provided over a different chip. Such various circuits included in the CPU 3660 can be formed by using the thin film transistor described in any of Embodiment Modes 1 to 5, or a CMOS circuit, an nMOS circuit, a pMOS circuit, or the like formed by combining the thin film transistors.

Note that the CPU 3660 shown in FIG. 23 is only an example where the structure is simplified, and an actual CPU may have various structures depending on the uses. Therefore, the structure of the CPU to which the present invention is applied is not limited to that shown in FIG. 23.

An instruction input to the CPU 3660 through the bus interface 3608 is input to the instruction decoder 3603 and decoded therein, and then input to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Specifically, the ALU controller 3602 generates a signal for controlling the drive of the ALU 3601. While the CPU 3660 is executing a program, the interrupt controller 3604 judges an interrupt request from an external input/output device or a peripheral circuit based on its priority or a mask state, and processes the request The register controller 3607 generates an address of the register 3606, and reads/writes data from/to the register 3606 in accordance with the state of the CPU.

The timing controller 3605 generates a signal for controlling a timing of drive of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the internal clock signal CLK2 to the above various circuits.

Figure 24:
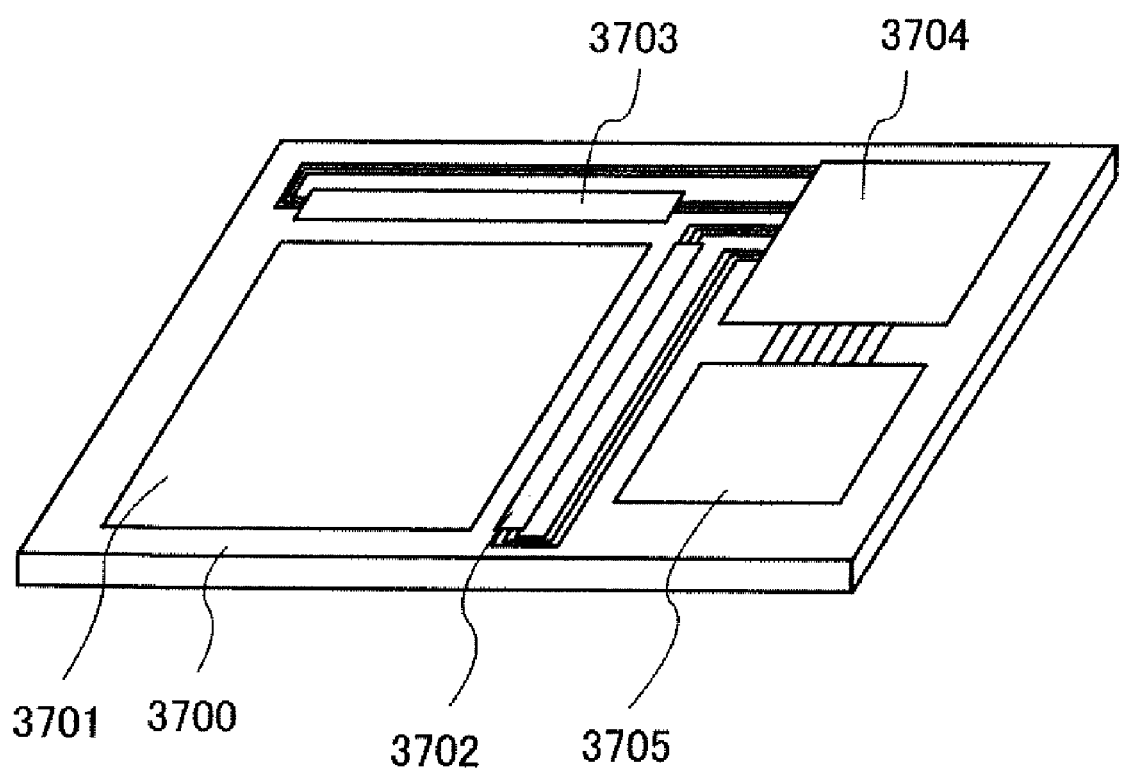
FIG. 24 is a perspective view showing an example of a semiconductor device of the present invention.
Figure 25A:
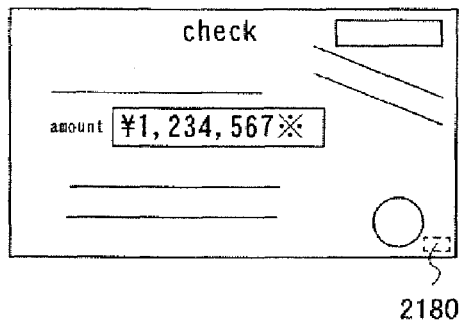
FIGS. 25A to 25H are diagrams showing examples of usage pattern of a semiconductor device of the present invention.
Figure 25B:
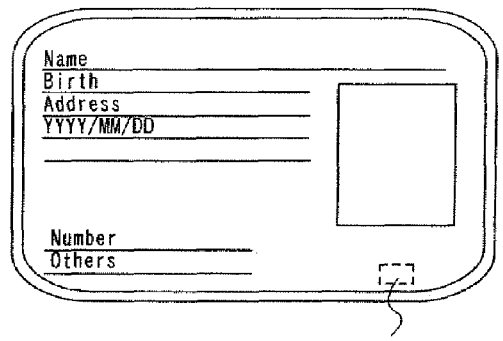
Figure 25C:
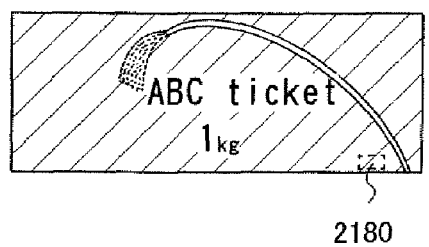
Figure 25D:
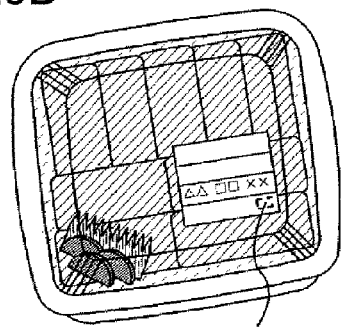
Figure 25E:
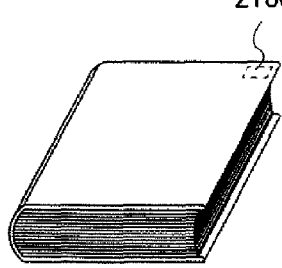
Figure 25F:
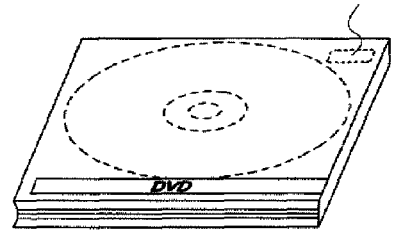
Figure 25G:
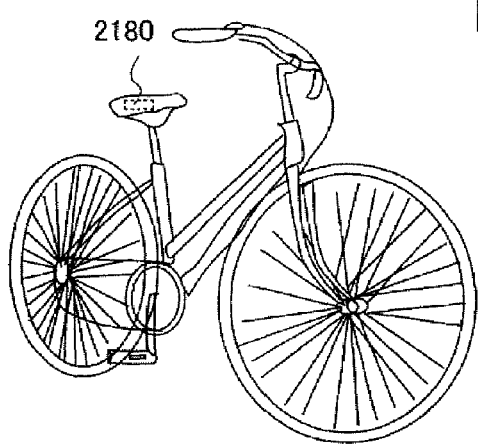
Figure 25H:
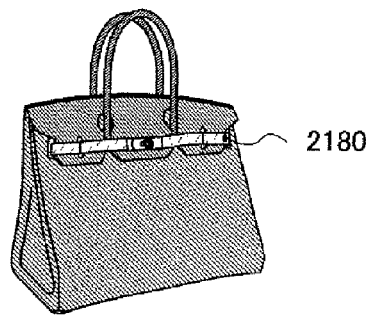

A display device in which a pixel portion, a CPU, and the other circuits are formed over the same substrate, a so-called System-On-Panel is shown in FIG. 24. A pixel portion 3701, a scan line driver circuit 3702 for selecting each pixel included in the pixel portion 3701, and a signal line driver circuit 3703 for supplying a video signal to each selected pixel are provided over a substrate 3700. A CPU 3704 and another circuit such as a control circuit 3705 are connected with wirings drawn from the scan line driver circuit 3702 and the signal line driver circuit 3703. Note that the control circuit includes an interface. Further, a connection portion for connection to an FPC terminal is provided at the edge of the substrate to communicate with an external signal.

As the other circuits, in addition to the control circuit 3705, an image signal processing circuit, a power source circuit, a gradation power source circuit, a video RAM, a memory (e.g., DRAM, SRAM, or PROM), and/or the like can be provided. Further, such a circuit may be formed using an IC chip and mounted over the substrate. Further, the scan line driver circuit 3702 and the signal line driver circuit 3703 are not necessarily formed over the same substrate as the pixel portion; for example, the scan line driver circuit 3702 may be formed over the same substrate as the pixel portion and the signal line driver circuit 3703 may be formed using an IC chip and mounted over the substrate.

Note that although the example in which a semiconductor device according to the present invention is applied to a CPU is described in this embodiment mode, the present invention is not limited thereto. For example, the semiconductor device according to the present invention can be applied to a pixel portion, a driver circuit portion, or the like of a display device including an organic light-emitting element, an in organic light-emitting element, a liquid crystal element, or the like. Furthermore, by applying the present invention, the following can also be manufactured; a camera such as a digital camera, an audio reproducing device such as a car audio system, a laptop computer, a game machine, a portable information terminal (e.g., a cellular phone or a mobile game machine), an image reproducing device provided with a recording medium such as a home-use game machine, and the like.

In a semiconductor device manufactured by applying the present invention, the subthreshold factor (S value) can be reduced, and the threshold voltage can be reduced. Further, the leakage current can be reduced. Therefore, operating characteristics and the reliability can be improved and high-speed circuit operation and lower power consumption can be realized.

Further, by application of a transistor having the structure including silicide regions as described in Embodiment Modes 2 to 5, the contact resistance can be reduced so that signal delay or the like can be prevented. Therefore, higher-speed circuit operation is enabled.

Embodiment Mode 7

In this embodiment mode, one example of a usage mode of the semiconductor device described in any of the above embodiment modes is described. Specifically, an application example of a semiconductor device to/from which data can be input/output noncontactly is described with reference to drawings. The semiconductor device to/from which data can be input/output noncontactly is also called an RFID tag, an ID tag, an IC tag, an IC chip, an RF tag, a wireless tag, an electronic tag, or a wireless chip.

One example of an upper-surface structure of a semiconductor device described in this embodiment mode is described with reference to FIG. 26A. A semiconductor device 2180 shown in FIGS. 26A to 26C includes a thin film integrated circuit 2131 including a plurality of elements such as thin film transistors for forming a memory portion and a logic portion, and a conductive layer 2132 which functions as an antenna. The conductive layer 2132 which functions as an antenna is electrically connected to the thin film integrated circuit 2131. The thin film transistor according to the present invention described in any of Embodiment Modes 1 to 4 can be applied to the thin film integrated circuit 2131.

Figure 26A:
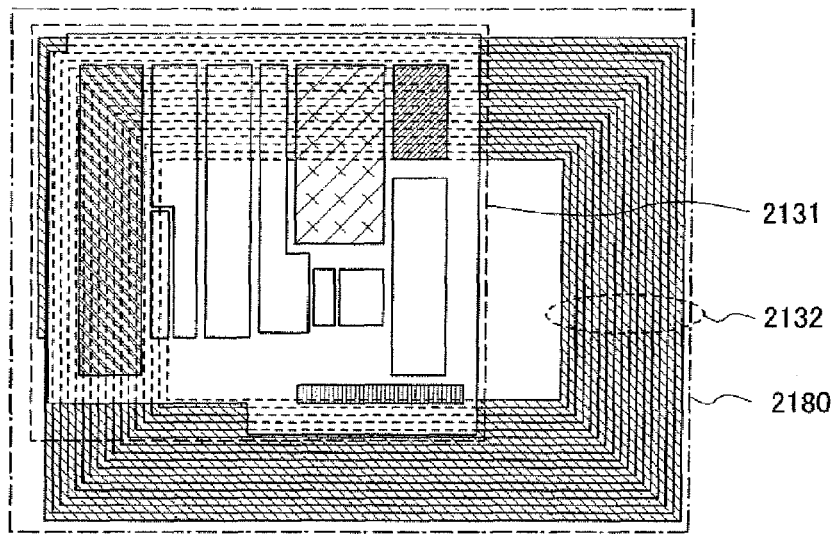
FIG. 26A is a top diagram and FIGS. 26B and 26C are cross-sectional diagrams, showing one example of a semiconductor device of the present invention.
Figure 26B:
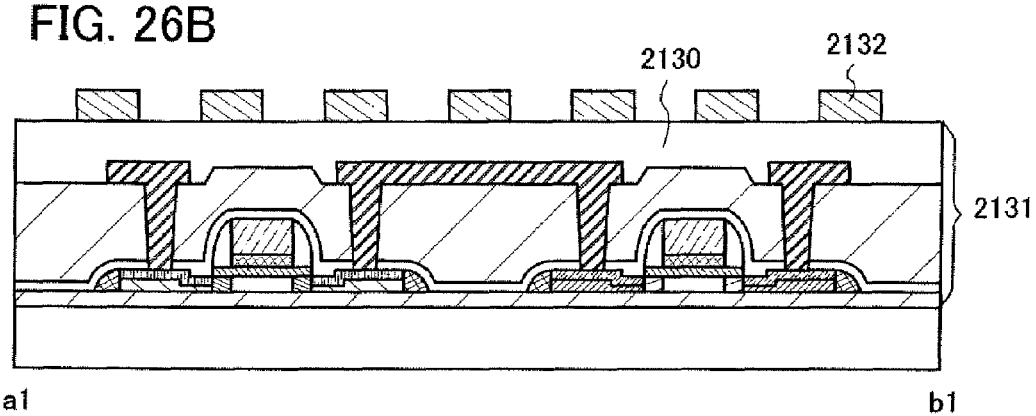
Figure 26C:
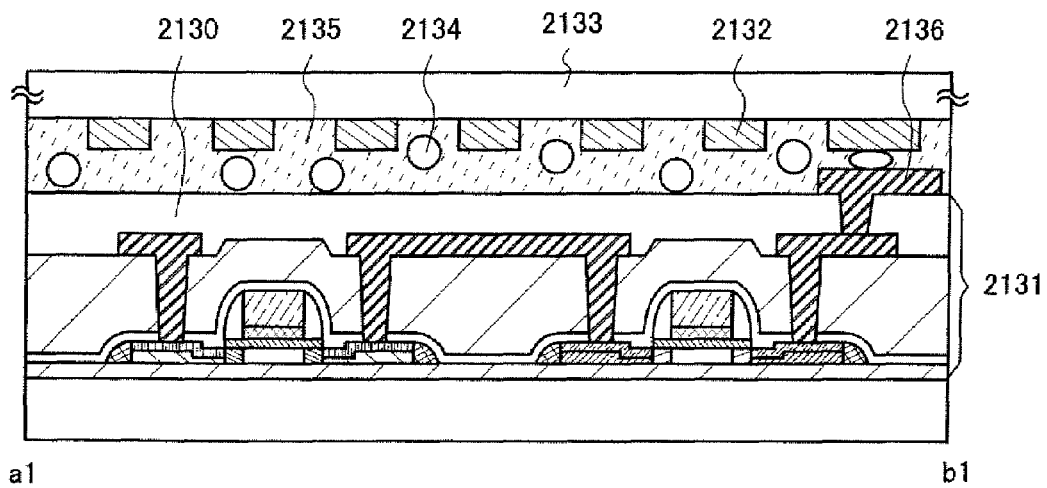

Pattern diagrams of a cross-sectional surface of FIG. 26A are shown in FIGS. 26B and 26C. The conductive layer 2132 which functions as an antenna is provided above the elements for forming the memory portion and the logic portion; for example, the conductive layer 2132 which functions as an antenna can be provided above the structure described in Embodiment Mode 5 with an insulating layer 2130 interposed therebetween (see FIG. 26B). Alternatively, the conductive layer 2132 which functions as an antenna may be provided using a substrate 2133 and then the substrate 2133 and the thin film integrated circuit 2131 may be attached to each other so as to interpose the conductive layer 2132 (see FIG. 26C). The example in which a conductive layer 2136 provided over the insulating layer 2130 and the conductive layer 2132 which functions as an antenna are electrically connected to each other with conducting particles 2134 contained in an adhesive resin 2135 is shown in FIG. 26C.

Note that, although the example in which the conductive layer 2132 which functions as an antenna is provided in the shape of a coil and either an electromagnetic induction method or an electromagnetic coupling method is employed is described in this embodiment mode, a semiconductor device of the present invention is not limited thereto, and a microwave method may be employed as well. In the case of a microwave method, the shape of the conductive layer 2132 which functions as an antenna may be decided as appropriate depending on the wavelength of an electromagnetic wave.

Figure 27A:
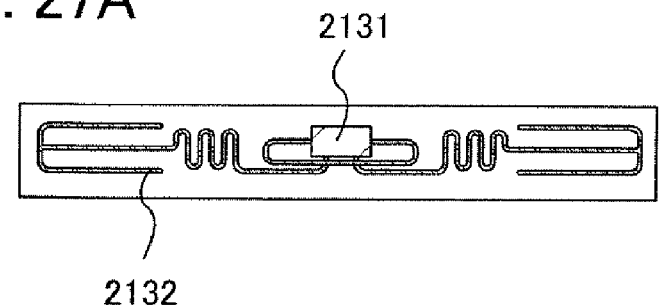
FIGS. 27A to 27D are diagrams showing antennas applicable to a semiconductor device of the present invention.
Figure 27B:
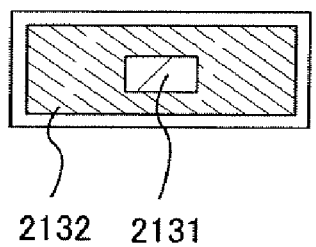
Figure 27C:
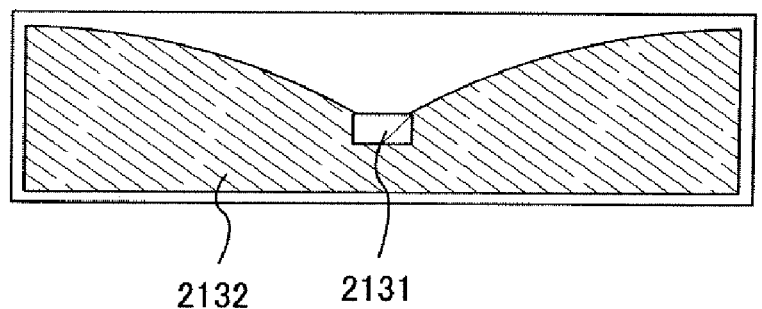
Figure 27D:
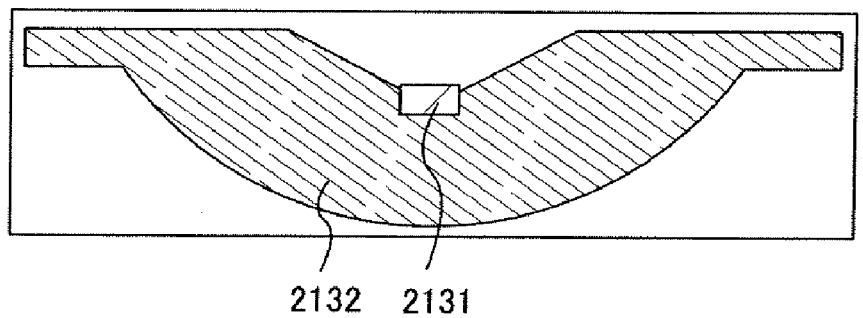

For example, when the microwave method (e.g., with an UHF band (in the range of 860 MHz to 960 MHz), a frequency band of 2.45 GHz, or the like) is employed as the signal transmission method of the semiconductor device 2180, the shape such as length of the conductive layer which functions as an antenna may be set as appropriate in consideration of the wavelength of an electromagnetic wave used in sending a signal. For example, the conductive layer which functions as an antenna can be formed in the shape of a line (e.g., a dipole antenna (see FIG. 27A)), in the flat shape (e.g., a patch antenna (see FIG. 27B)), in the shape of a ribbon (see FIGS. 27C and 27D), or the like. Further, the shape of the conductive layer 2132 which functions as an antenna is not limited to a line, and the conductive layer in the shape of a curved line, in an S-shape, or in a shape combining them may be provided as well in consideration of the wavelength of the electromagnetic wave.

The conductive layer 2132 which functions as an antenna is formed of a conductive material by a CVD method, a sputtering method, a printing method such as a screen printing method or a gravure printing method, a droplet discharge method, a dispenser method, a plating method, or the like. As the conductive material, any of a metal element such as aluminum (Al), titanium (Ti), silver (Ag), copper (Cu), gold (Au), platinum (Pt), nickel (Ni), palladium (Pd), tantalum (Ta), molybdenum (Mo), or the like, or an alloy material or a compound material including the element as its main component is used, and the conductive layer 2132 employs a single layer structure or a stacked-layer structure.

For example, when the conductive layer 2132 which functions as an antenna is formed by a screen printing method, it can be provided by selective printing with a conductive paste in which conductive particles with a grain diameter of several nm to several tens of μm are dissolved or dispersed in an organic resin. As the conductive particle, at least one of metal particles such as silver (Ag), gold (Ag), copper (Cu), nickel (Ni), platinum (Pt), palladium (Pd), tantalum (Ta), molybdenum (Mo), titanium (Ti), and the like; fine particles of silver halide; or dispersive nanoparticles can be used. Further, as the organic resin included in the conductive paste, at least one of organic resins which function as a binder, a solvent, a dispersing agent, and a coating material of metal particles can be used. Typically, an organic resin such as an epoxy resin and a silicone resin can be given as an example. Further, in forming the conductive layer, it is preferable to bake the conductive paste after being provided. For example, in the case of using fine particles (e.g, with a grain diameter of 1 nm or more and 100 nm or less) containing silver as its main component as a material of the conductive paste, the conductive layer can be formed by baking the conductive paste at temperatures in the range of 150° C. to 300° C. to be hardened. Alternatively, fine particles containing solder or lead-free solder as its main component may be used. In this case, fine particles with a grain diameter of 20 μm or less are preferably used. Solder and lead-free solder have the advantage of low cost.

Lower power consumption can be achieved in a semiconductor device to which the present invention is applied. Therefore, the present invention is effective in the case of a small semiconductor device to/from which data can be input/output noncontactly as described in this embodiment mode.

Next, an operation example of the semiconductor device according to this embodiment mode is described.

Figure 28A:
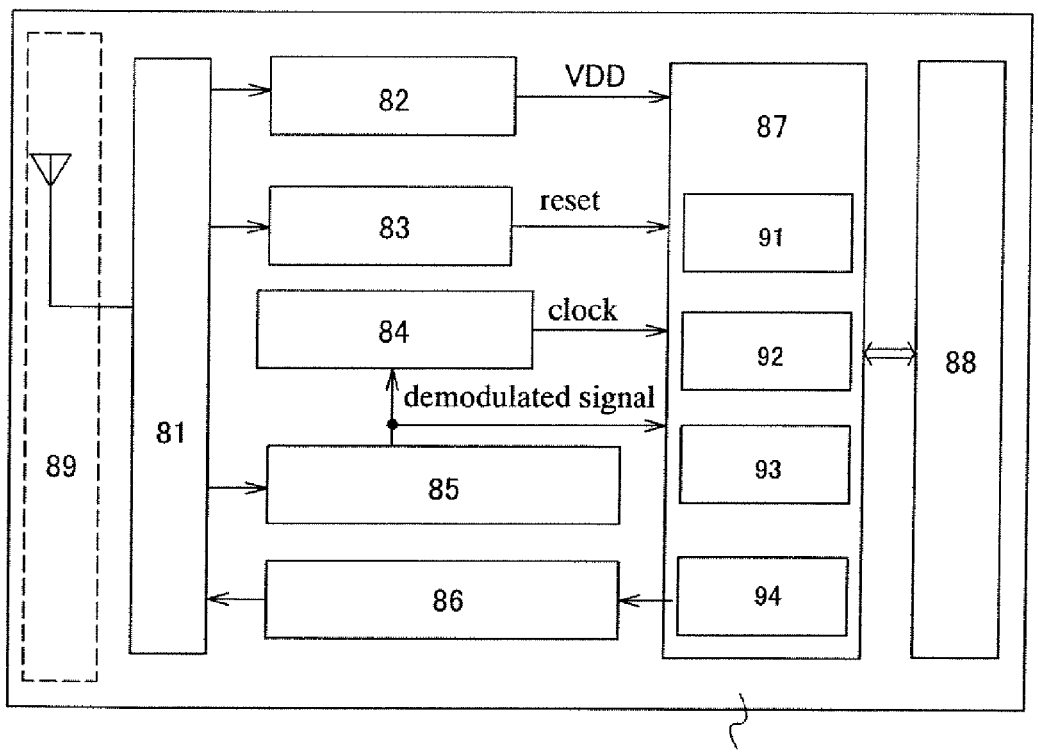
FIG. 28A is a block diagram showing one example of a semiconductor device of the present invention and FIGS. 28B and 28C are diagrams showing examples of usage pattern thereof.

The semiconductor device 2180 has a function of exchanging data noncontactly, and includes a high-frequency circuit 81, a power source circuit 82, a reset circuit 83, a clock generating circuit 84, a data demodulating circuit 85, a data modulating circuit 86, a controlling circuit 87 for controlling another circuit, a memory circuit 88, and an antenna 89 (see FIG. 28A). The high-frequency circuit 81 receives a signal from the antenna 89 and then outputs a signal received from the data modulating circuit 86, through the antenna 89. The power source circuit 82 generates a power source potential from a received signal. The reset circuit 83 generates a reset signal. The clock generating circuit 84 generates various clock signals based on a received signal input from the antenna 89. The data demodulating circuit 85 demodulates a received signal and outputs to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code. In FIG. 28A, in addition to the controlling circuit 87, the high-frequency circuit 81 and the power source circuit 82 which are analog circuits are included.

Next, one example of an operation of the aforementioned semiconductor device is described. First, a wireless signal is received by the antenna 89 and then sent to the power source circuit 82 through the high-frequency circuit 81, so that a high power source potential (hereinafter referred to as VDD) is generated. VDD is supplied to each circuit in the semiconductor device 2180. A signal sent to the data demodulating circuit 85 through the high-frequency circuit 81 is demodulated (hereinafter this signal is called a demodulated signal). Moreover, signals passed through the reset circuit 83 and the clock generating circuit 84 from the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is output. The output information of the semiconductor device is encoded through the output unit circuit 94. Further, the encoded information of the semiconductor device 2180 passes through the data modulating circuit 86 and then is sent by the antenna 89 while being superimposed on a wireless signal. Note that a low power source potential (hereinafter called VSS) is common in the plurality of circuits included in the semiconductor device 2180 and GND can be used as VSS.

In this manner, by sending a signal from a reader/writer to the semiconductor device 2180 and receiving a signal sent from the semiconductor device 2180 by the reader/writer, data of the semiconductor device can be read.

Further, in the semiconductor device 2180, a power source voltage may be supplied to each circuit by electromagnetic waves without providing a power supply (a battery), or a power supply (battery) may be provided so that a power supply voltage is supplied to each circuit by both electromagnetic waves and the power supply (battery).

Figure 28B:
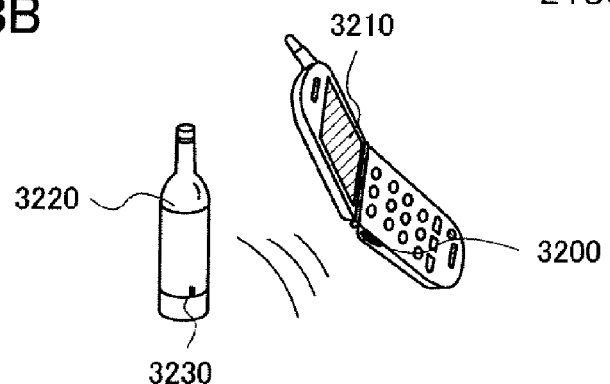
Figure 28C:
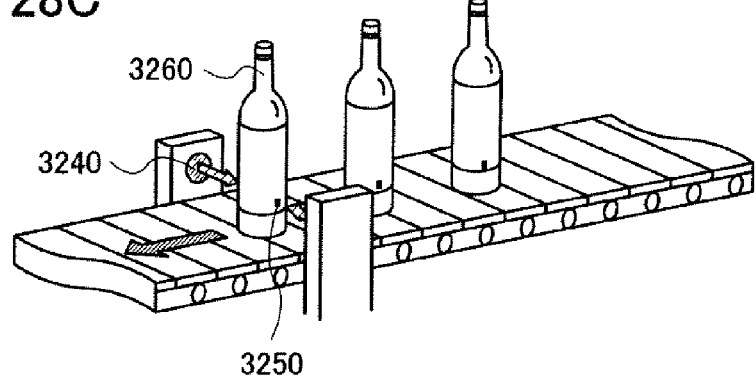

Next, one example of usage mode of a semiconductor device to/from which data can be input/output noncontactly is described. The side surface of a mobile terminal including a display portion 3210 is provided with a reader/writer 3200, and the side surface of a product 3220 is provided with a semiconductor device 3230 (see FIG. 28B). When the reader/writer 3200 is held over the semiconductor device 3230 included in the product 3220, the display portion 3210 displays information on the product, such as a row material, a place of origin, an inspection result for each production step, a history of distribution process, description of the product, or the like. Further, while a product 3260 is transferred by a conveyer belt, the product 3260 can be inspected by using a reader/writer 3240 and a semiconductor device 3250 provided for the product 3260 (see FIG. 28C). As the semiconductor devices 3230 and 3250, the aforementioned semiconductor device 2180 can be applied. In this manner, by using a semiconductor device according to the present invention in the system, information can be obtained easily and higher performance and a high added value are achieved. Further, since a semiconductor device according to the present invention can realize lower power consumption, a semiconductor device provided for a product can be downsized.

Note that an applicable range of a semiconductor device according to the present invention is wide in addition to the above, and the semiconductor device can be applied to any product as long as it clarifies information of an object, such as the history thereof, noncontactly and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 25A to 25H.

The bills and coins are money distributed to the market, and include one valid in a certain area (a cash voucher), memorial coins, and the like. The securities refer to checks, certificates, promissory notes, and the like (see FIG. 25A). The certificates refer to driver's licenses, certificates of residence, and the like (see FIG. 25B). The bearer bonds refer to stamps, rice coupons, various gift certificates, and the like (see FIG. 25C). The packing containers refer to wrapping paper for food containers and the like, plastic bottles, and the like (see FIG. 25D). The books refer to hardbacks, paperbacks, and the like (see FIG. 25E). The recording media refer to DVD software, video tapes, and the like (see FIG. 25F). The vehicles refer to wheeled vehicles such as bicycles, ships, and the like (see FIG. 25G). The personal belongings refer to bags, glasses, and the like (see FIG. 25H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, FL display devices, television devices (TV sets and flat-panel TV sets), cellular phones, and the like.

Forgery can be prevented by providing the semiconductor device 2180 for the bills, the coins, the securities, the certificates, the bearer bonds, or the like. Further, the efficiency of an inspection system, a system used in a rental shop, or the like can be improved by providing the semiconductor device 2180 for the packing containers, the books, the recording media, the personal belongings, the food, the commodities, the electronic devices, or the like. Forgery or theft can be prevented by providing the semiconductor device 2180 for the vehicles, the health products, the medicine, or the like; and in the case of the medicine, medicine can be prevented from being taken mistakenly. The semiconductor device 2180 can be provided by being attached to the surface or being embedded in the object. For example, in the case of a book, the semiconductor device 2180 may be embedded in the paper; and in the case of a package made from an organic resin, the semiconductor device 2180 may be embedded in the organic resin.

As described above, the efficiency of an inspection system, a system used in a rental shop, or the like can be improved by providing the semiconductor device for the packing containers, the recording media, the personal belonging, the food, the clothing, the commodities, the electronic devices, or the like. Further, by providing the semiconductor device for the vehicles or the like, forgery or theft thereof can be prevented. Further, by enveloping the semiconductor device in a creature such as an animal, an individual creature can be easily identified. For example, by enveloping/attaching the semiconductor device with a sensor in/to a creature such as livestock, its health condition such as a current body temperature as well as its birth year, sex, breed, or the like can be easily managed.

This embodiment mode can be freely combined with any of the above embodiment modes.

Embodiment Mode 8

Figure 30A:
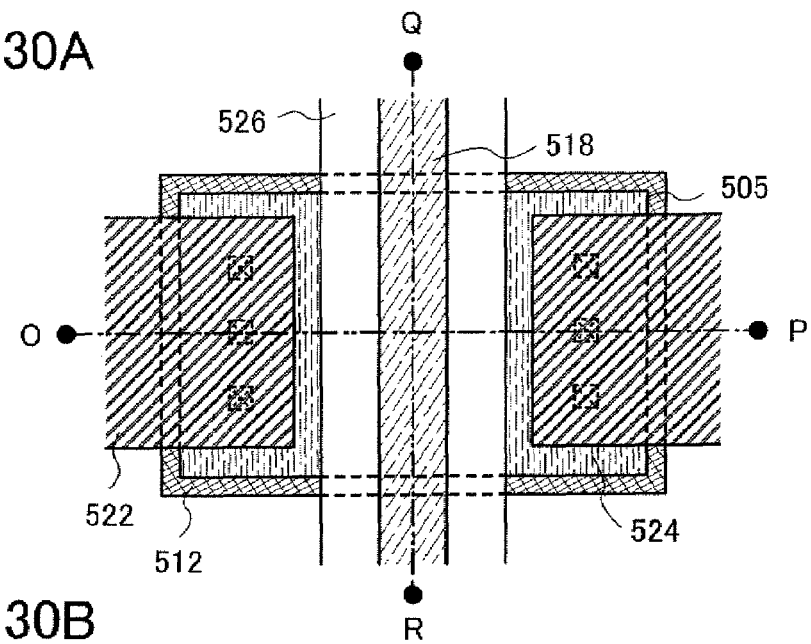
FIGS. 30A to 30C are diagrams showing an example of a main structure of a semiconductor device of the present invention.
Figure 30B:
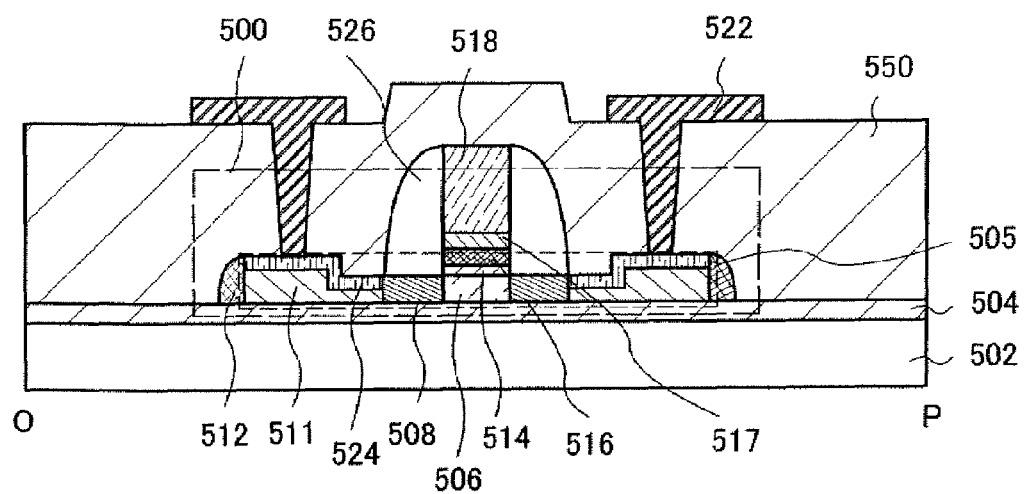
Figure 30C:
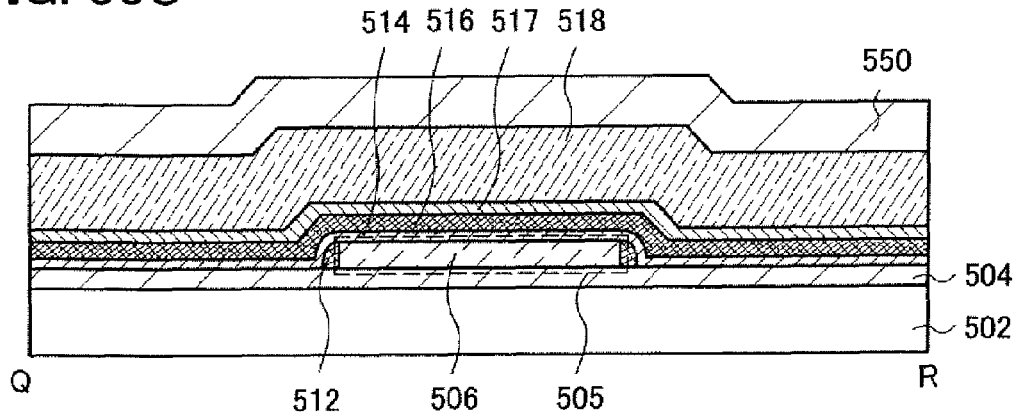

In this embodiment mode, an example of a semiconductor device having a structure which is different from those described in the above embodiment modes is described using FIGS. 30A to 30C. Specifically, the example of a memory transistor which is one nonvolatile semiconductor memory device is described as a semiconductor device.

A memory transistor described in this embodiment mode has a similar structure to a MOSFET (metal oxide semiconductor field effect transistor), and a region in which charge can be accumulated for a long period of time is provided over a channel formation region. This charge accumulation region is formed over an insulating layer, and is also called a floating gate electrode because it is insulated and isolated from the periphery. A control gate electrode is provided over the floating gate electrode with an insulating layer interposed therebetween.

In a memory transistor having such a structure, an operation in which charge is accumulated in and released from the floating gate electrode by a voltage applied to the control gate electrode. That is, data is stored by taking charge in and out of the floating gate electrode. The injection and extraction of charge into and from the floating gate electrode is performed by application of a high voltage between the semiconductor layer including a channel formation region and the control gate electrode. It is said that, at this time, Fowler-Nordheim (F-N) type tunnel current (NAND type) or a thermoelectron (NOR type) flows through the insulating layer over the channel formation region. The insulating layer provided over the channel formation region is also called a tunnel insulating layer.

FIG. 30A is a top diagram and FIGS. 30B and 30C are cross-sectional diagrams for describing a main structure of a nonvolatile semiconductor memory device which is a semiconductor device according to this embodiment mode. FIGS. 30A to 30C particularly show a structure of a memory transistor; FIG. 30A is a top diagram, FIG. 30B is a cross-sectional diagram along a one-dotted dashed line O-P in FIG. 30A, and FIG. 30C is a cross-sectional diagram along a one-dotted dashed line Q-R in FIG. 30A. Note that a thin film and the like are partially omitted in FIG. 30A.

The nonvolatile semiconductor memory device shown in FIGS. 30A to 30C includes a memory transistor 500 which is provided over a substrate 502 with an insulating layer 504 interposed therebetween. The memory transistor 500 includes an island-shaped semiconductor layer 505; a side-surface insulating layer 512 which is provided in contact with the side surface of the semiconductor layer 505; a stack of a first insulating layer 514, a charge accumulation layer 516 forming a floating gate electrode, a second insulating layer 517, and a conductive layer 518 forming a control gate electrode which are provided in order over the surface of the semiconductor layer 505; and conductive layers 522 which form source and drain electrodes, provided over the semiconductor layer 505 with an insulating layer 550 interposed therebetween. A sidewall insulating layer 526 is provided in contact with the side surface of stack of the first insulating layer 514, the charge accumulation layer 516, the second insulating layer 517, and the conductive layer 518. The conductive layers 522 are electrically connected to the semiconductor layer 505 through the insulating layer 550.

The island-shaped semiconductor layer 505 includes a locally thinned region. The thickness of the semiconductor layer 505 is 0.5 to 200 nm, and preferably 10 to 50 nm. Further, the thickness of the thinned region of the semiconductor layer 505 is 0.5 to 30 nm, and preferably 10 to 25 nm. Further, the edge of the semiconductor layer 505 may be tapered similarly to those in the above embodiment modes.

The semiconductor layer 505 includes a channel formation region 506, a pair of low-concentration impurity regions 508 which function as LDD regions, a pair of high-concentration impurity regions 511 which function as a source and drain region, and silicide regions 524 which are formed on the high-concentration impurity regions 511. It can also be said that the silicide regions 524 are formed in part of the high-concentration impurity regions.

The channel formation region 506 is formed in the locally thinned region of the semiconductor layer 505. That is, the thickness of the channel formation region 506 is 0.5 to 30 nm, and preferably 10 to 25 nm. By thinning the semiconductor layer 505 in the region for forming the channel formation region 506 to preferably 10 to 25 nm, the subthreshold factor (S value) can be decreased, the threshold voltage can be decreased, and variations of the threshold voltage can be decreased Consequently, the operating range of a memory transistor can be increased, and the operating characteristics can be improved. One feature of the present invention is to form the channel formation region in the locally thinned region of the semiconductor layer.

At least part of the silicide regions 524 are formed in the semiconductor layer 505 in the non-thinned regions. Further, the silicide regions 524 are formed in the semiconductor layer 505 in the regions which are on the high-concentration impurity regions 511 and do not overlap with the sidewall insulating layer 526 and the conductive layer 518. The conductive layers 522 which function as source and drain electrodes are in contact with the silicide regions 524 and electrically connected to the high-concentration impurity regions 511 with the silicide regions 524 interposed therebetween. In the semiconductor layer 505, by employing the structure in which the silicide regions 524 are interposed between the conductive layers 522 which function as source and drain electrodes and the high-concentration impurity regions 511, contact resistance (contact resistance between semiconductor layer and conductive layer) can be reduced. Further, by formation of the silicide regions, the resistance of the impurity regions which function as a source and drain region can be reduced. By thus provision of the silicide regions, of a semiconductor device, signal delay can be prevented, lower power consumption can be realized, and operating characteristics can be prevented from being deteriorated.

Further, by forming the conductive layers 522 which function as source and drain electrodes so as to be in contact with the non-thinned regions of the semiconductor layer 505, when openings in which the conductive layers 522 are formed are formed in the insulating layer 550, the semiconductor layer (the high-concentration impurity regions) in the periphery of the openings can be prevented from being removed. Therefore, reduction of the yield in the manufacturing process can be suppressed.

Note that the semiconductor layer included in the memory transistor is not limited to have the structure shown in FIGS. 30A to 30C, any structure of a semiconductor layer described in Embodiment Modes 1 to 5 can be applied. For example, there may be no silicide region, or the entire of impurity regions which function as a source and drain region may be made silicide.

Further, the example in which the low-concentration impurity regions which function as LDD regions are formed in the semiconductor layer 505 is described in this embodiment mode; however, the present invention is not limited thereto and LDD regions are not necessarily formed. In the case where LDD regions are not formed, it is preferable to employ the structure in which a channel formation region is formed in contact with and between a pair of impurity regions which function as a source and drain region.

The stack of the first insulating layer 514, the charge accumulation layer 516, the second insulating layer 517, and the conductive layer 518 is formed over the semiconductor layer 505 in the locally thinned region. Further, such a stack is provided so as to get across the island-shaped semiconductor layer 505. The first insulating layer 514 functions as a tunnel insulating layer, and the charge accumulation layer 516 functions as a floating gate electrode. The second insulating layer 517 functions as a control insulating layer, and the conductive layer 518 functions as a control gate electrode. Note that the example in which each layer of the first insulating layer 514, the charge accumulation layer 516, the second insulating layer 517, and the conductive layer 518 employs a single layer structure is described in this embodiment mode, the present invention is not limited thereto and a stacked-layer structure including two or more layers may be employed as well.

The side-surface insulating layer 512 is formed so as to be in contact with the side surface of the island-shaped semiconductor layer 505. As shown in FIGS. 30A and 30C, in the region where the charge accumulation layer 516 and the conductive layer 518 get across the semiconductor layer 505 (the region where the charge accumulation layer 516 and the like go up the edge of the semiconductor layer 505), the first insulating layer 514 which functions as a tunnel insulating layer is formed over the semiconductor layer 505 and the side-surface insulating layer 512 formed in contact with the side surface of the semiconductor layer 505. Accordingly, a defect caused by insufficiency of coverage with the insulating layer at the edge of the semiconductor layer 505, in particular, in the region where the edge of the semiconductor layer 505 and the charge accumulation layer 516 and the like overlap with each other (the region where the charge accumulation layer 516 goes up the edge of the semiconductor layer 505) can be prevented. For example, occurrence of a leakage current, electrostatic breakdown, or the like can be prevented. Further, since a high voltage is applied to a memory transistor for operation, an electric field tends to be locally concentrated in the edge of the semiconductor layer; however, the concentration of the electric field can be relaxed and local degradation can be suppressed by employing the structure of the present invention. Consequently, the reliability of a nonvolatile semiconductor memory device to be completed can be improved.

The semiconductor layer 505 is preferably formed of a single crystalline semiconductor of a crystalline semiconductor. For example, the semiconductor layer 505 can be formed as follows; an amorphous semiconductor layer is formed over an entire surface of the substrate by a CVD method or a sputtering method, crystallized, and then etched into a desired shape. As a semiconductor material, a material containing silicon as its main component is preferably used; specifically, silicon, silicon germanium, or the like can be used. Further, germanium may be used as well. As the method for crystallizing the semiconductor layer, a laser crystallization method, a thermal crystallization method using RTA (rapid thermal anneal) or an annealing furnace, a crystallization method using a metal element that promotes crystallization, a method in which a plurality of these methods is combined, or the like can be used. Further, the semiconductor layer 505 may be formed as well as follows; instead of performing such a thin-film process, an SOI substrate in which a single crystalline semiconductor layer is provided on an insulating surface is used and the single crystalline semiconductor layer provided on an insulating surface is processed.

The channel formation region 506, the low-concentration impurity regions 508, the high-concentration impurity regions 511, and the silicide regions 524 are formed in the semiconductor layer 505. The channel formation region 506 is positioned between the pair of high-concentration impurity regions 511 and each of the low-concentration impurity regions 508 is positioned between the channel formation region 506 and each of the high-concentration impurity regions 511. The silicide regions 524 are positioned on the high-concentration impurity regions 511.

An impurity element which provides one conductivity type has been added into the low-concentration impurity regions 508 at a first concentration, and an impurity element which provides one conductivity type has been added into the high-concentration impurity regions 511 at a second concentration. The impurity elements which have been added into the low-concentration impurity regions 508 and the high-concentration impurity regions 511 provide the same conductivity type. Note that, when the impurity elements are added, the second concentration is set to be higher than the first concentration. As the impurity element which provides one conductivity type, an element which provides a p-type conductivity such as boron (B), aluminum (Al), or gallium (Ga) or an element which provides an n-type conductivity such as phosphorus (P) or arsenic (As) can be used.

Further, in order to control the threshold voltage of a memory transistor, an impurity element which provides one conductivity type may he added into the channel formation region 506. By addition of the impurity element at a certain concentration into the channel formation region 506, the threshold voltage of a transistor can be shifted forcibly to a desired threshold voltage.

Further, an impurity element may have been added into the silicide regions 524 at a similar concentration to the high-concentration impurity regions 511.

The side-surface insulating layer 512 is formed as follows; an insulating layer is formed to envelop the semiconductor layer and is selectively etched by anisotropic etching mainly in a perpendicular direction. For example, the side-surface insulating layer 512 can be formed of a material such as silicon oxide, silicon nitride, silicon oxynitride, silicon nitride oxide, SiOF, SiOC, DLC, porous silica, or the like. Note that the side-surface insulating layer 512 is preferably formed before the island-shaped semiconductor layer is locally thinned.

The first insulating layer 514 is preferably formed of silicon oxide, silicon nitride, silicon oxynitride, silicon nitride oxide, aluminum nitride, or the like to have a single layer structure or a stacked-layer structure. The first insulating layer 514 may be formed by a CVD method, a sputtering method, an ALD method, or the like, but is preferably formed by solid phase oxidation or solid phase nitridation with high-density plasma treatment. By performing solid phase oxidation or solid phase nitridation to the semiconductor layer with plasma treatment, a dense thin film in which the withstand voltage is high can be formed. The first insulating layer 514 which functions as a tunnel insulating layer is effective when a dense thin film in which the withstand voltage is high is formed as the first insulating layer 514. This is because the amount of tunnel current is increased and charge accumulation to a floating gate electrode over the first insulating layer 514 can be performed at a lower voltage as the first insulating layer 514 becomes thinner. Further, the first insulating layer 514 can be formed as well as follows; an insulating layer is formed by a CVD method, a sputtering method, an ALD method, or the like, and then subjected to solid phase oxidation or solid phase nitridation with high-density plasma treatment. The first insulating layer 514 is formed to have a thickness of 1 to 50 nm, preferably 1 to 20 nm, and more preferably 1 to 10 nm.

The charge accumulation layer 516 is formed to have a single layer structure or a stacked-layer structure over the first insulating layer 514. The charge accumulation layer 516 may be formed of a semiconductor material such as silicon (Si) or germanium (Ge); a compound containing silicon as its main component; a metal selected from tungsten (W), titanium (Ti), tantalum (Ta), molybdenum (Mo), and the like; or an alloy containing such a metal as its main component; a metal compound containing such a metal as its main component (e.g., metal nitride or metal oxide); and/or the like. As examples of the compound containing silicon as its main component, silicon nitride, silicon nitride oxide, silicon carbide, silicide (e.g., tungsten silicide, titanium silicide, or nickel silicide), and the like can be given. As an example of the semiconductor material, n-type or p-type silicon, silicon germanium containing germanium at a concentration of less than 10 at. %, and the like can be given. As examples of the metal compound, tantalum nitride, tantalum oxide, tungsten nitride, titanium nitride, titanium oxide, tin oxide, and the like can be given. Further, in the case of using silicon, an impurity which provides one conductivity type, such as phosphorus or boron may be added.

Further alternatively, the charge accumulation layer 516 can be formed of a layer which has insulation properties and a trap for charge holding. For example, the charge accumulation layer 516 can be formed of a silicon compound or a germanium compound. As examples of the silicon compound, silicon nitride, silicon oxynitride, silicon oxynitride added with hydrogen, and the like can be given. As examples of the germanium compound, germanium nitride, germanium nitride added with oxygen, germanium oxide added with nitrogen, germanium nitride added with oxygen and hydrogen, germanium oxide added with nitrogen and hydrogen, and the like can be given.

The second insulating layer 517 is formed to have a single layer structure or a stacked-layer structure over the charge accumulation layer 516. The second insulating layer 517 is, for example, formed of silicon oxide, silicon oxynitride, silicon nitride, silicon nitride oxide, aluminum oxide, and/or the like. Alternatively, high-density plasma treatment may be performed to the charge accumulation layer 516, so that a nitride film may be formed by sold phase nitrization of the surface of the charge accumulation layer 516 (for example, silicon nitride is formed when silicon is used for the charge accumulation layer 516). As for the first insulating layer 514 and the second insulating layer 517, at least one of them on the side which is in contact with the charge accumulation layer 516 is preferably formed of a nitride film or a layer after being subjected to nitrization treatment, in order to prevent the charge accumulation layer 516 from being oxidized.

The conductive layer 518 is formed to have a single layer structure or a stacked-layer structure over the second insulating layer 517. The conductive layer 518 can be formed of a metal element such as tantalum (Ta), tungsten (W), titanium (Ti), molybdenum (Mo), chromium (Cr), aluminum (Al), copper (Cu), niobium (Nb), or the like, or an alloy material or a compound material containing the above-described metal element. Further, a semiconductor material typified by polycrystalline silicon to which an impurity element which provides one conductivity type, such as phosphorus has been added can be used as well.

The sidewall insulating layer 526 is formed in contact with the side-surfaces of the first insulating layer 514, the charge accumulation layer 516, the second insulating layer 517, and the conductive layer 518. The sidewall insulating layer 526 can be formed as follows; an insulating layer is formed of an inorganic material such as silicon oxide, silicon nitride, silicon oxynitride, or silicon nitride oxide, or an organic material such as an organic resin by a CVD method or a sputtering method to have a single layer structure or a stacked-layer structure, and then selectively etched by anisotropic etching mainly in a perpendicular direction. The sidewall insulating layer 526 is used as a silicide mask in forming silicide regions.

Furthermore, it is also used as a doping mask in forming LDD regions in this embodiment mode.

The channel formation region 506 is formed in the semiconductor layer 505 in the region which overlaps with the charge accumulation layer 516 and the conductive layer 518 with the first insulating layer 514 interposed therebetween. That is, the charge accumulation layer 516 and the conductive layer 518 are provided so as to get across the semiconductor layer 505, above the channel formation region 506. The low-concentration impurity regions 508 are formed in the regions which overlap with the sidewall insulating layer 526. The high-concentration impurity regions 511 are formed in the regions which do not overlap with the charge accumulation layer 516, the conductive layer 518, and the sidewall insulating layer 526. Further, the high-concentration impurity regions 511 are at least partially formed in the non-thinned regions of the semiconductor layer 505.

Next, the insulating layer 550 is formed so as to cover the insulating layers, the conductive layers, and the like provided over the substrate 502, and the conductive layers 522 which function as source and drain electrodes are formed so as to be electrically connected to the high-concentration impurity regions 511 formed in the semiconductor layer 505 through the insulating layer 550.

The insulating layer 550 is formed by a CVD method, a sputtering method, an ALD method, a coating method, a method in which a plurality of the above-described methods is combined, or the like, using an inorganic insulating material such as silicon oxide, silicon nitride, silicon oxynitride, silicon nitride oxide, or the like; an insulating material containing carbon such as DLC (Diamond-Like Carbon); an organic insulating material such as epoxy, polyimide, polyamide, polyvinyl phenol, benzocyclobutene, acrylic, or the like; or a siloxane material such as a siloxane resin. Note that the siloxane material corresponds to a material having Si—O—Si bonds. Siloxane includes a skeleton structure of a bond of silicon (Si) and oxygen (O). As a substituent, an organic group containing at least hydrogen (such as an alkyl group or an aromatic hydrocarbon) is used. Alternatively, a fluoro group, or a fluoro group and an organic group containing at least hydrogen can be used as a substituent. Further, the insulating layer 550 may be formed as well by forming an insulating layer with a CVD method, a sputtering method, or the like and then performing high-density plasma treatment thereto.

Each of the conductive layers 522 is formed by a CVD method or a sputtering method, using a metal element selected from aluminum (Al), tungsten (W), titanium (Ti), tantalum (Ta), molybdenum (Mo), nickel (Ni), platinum (Pt), copper (Cu), gold (Au), silver (Ag), manganese (Mg), and neodymium (Nd), or an alloy material or a compound material containing the metal element, to have a single layer structure or a stacked-layer structure. As examples of an alloy material containing aluminum, a material containing aluminum as its main component and nickel and an alloy material containing aluminum as its main component, nickel, and at least one of carbon and silicon can be given.

In a nonvolatile semiconductor memory device manufactured by applying the present invention, the subthreshold factor (S value) can be decreased, the threshold voltage can be decreased, and variations of the threshold voltage can be decreased. Consequently, the operating range of a memory transistor can be increased, and the operating characteristics can be improved. Further, a defect due to shape, characteristics, and the like of edge of a semiconductor layer can be prevented or reduced, so that the reliability can be improved. Further, the contact resistance between semiconductor layer and electrode (wiring) can be reduced, so that lower power consumption can be realized. Thus, higher performance of a semiconductor device can be realized.

Note that this embodiment mode can be combined with another embodiment mode described in this specification as needed.

This application is based on Japanese Patent Application Serial No. 2007016116 filed with Japan Patent Office on Jan. 26, 2007, the entire contents of which are hereby incorporated by reference.

What is claimed is:

1. A semiconductor device comprising:
    an island-shaped semiconductor layer provided over a substrate, the semiconductor layer including a channel formation region provided between a pair of impurity regions;
    a source region and a drain region provided in the semiconductor layer, the channel formation region and the pair of impurity regions interposing the source region and the drain region;
    a first insulating layer being in contact with a side surface of the semiconductor layer;
    a gate electrode provided over the channel formation region, the gate electrode crossing the semiconductor layer; and
    a second insulating layer provided between the semiconductor layer and the gate electrode,
    wherein the second insulating layer covers at least a region where the gate electrode and the semiconductor layer overlap with each other, and
    wherein the semiconductor layer includes a concave portion in which the channel formation region and the pair of impurity regions are provided.

2. The semiconductor device according to claim 1,
    wherein a part of the source region and a part of the drain region are included in the concave portion.

3. The semiconductor device according to claim 2,
    wherein a thickness of the concave portion is within a range of 10 nm to 25 nm.

4. The semiconductor device according to claim 1,
    wherein a thickness of the second insulating layer is within a range of 1 nm to 10 nm.

5. The semiconductor device according to claim 1,
    wherein a concentration of an impurity element of the pair of impurity regions is lower than that of the source region and the drain region.

6. A semiconductor device comprising:
    an island-shaped semiconductor layer provided over a substrate, the semiconductor layer including a channel formation region provided between a pair of impurity regions;
    a source region and a drain region provided in the semiconductor layer, the channel formation region and the pair of impurity regions interposing the source region and the drain region;
    a silicide region provided over and being in contact with the source region and the drain region;
    a first insulating layer being in contact with a side surface of the semiconductor layer;
    a gate electrode provided over the channel formation region, the gate electrode crossing the semiconductor layer;
    a second insulating layer provided between the semiconductor layer and the gate electrode; and
    a third insulating layer provided on a side surface of the gate electrode, wherein the second insulating layer covers at least region where the gate electrode and the semiconductor layer overlap with each other, and wherein the semiconductor layer includes a concave portion in which the channel formation region and the pair of impurity regions are provided.

7. The semiconductor device according to claim 6, wherein a part of the source region and a part of the drain region are included in the concave portion.

8. The semiconductor device according to claim 7, wherein a thickness of the concave portion is within a range of 10 nm to 25 nm.

9. The semiconductor device according to claim 6, further comprising a conductive layer over the source region and the drain region, wherein the conductive layer is electrically connected to the source region and the drain region via the silicide region.

10. The semiconductor device according to claim 6, wherein the silicide regions include any of nickel silicide, titanium silicide, cobalt silicide, or platinum silicide.

11. The semiconductor device according to claim 6, wherein an impurity element which provides the same conductivity type as the source region and the drain region is added into the silicide region.

12. The semiconductor device according to claim 6, wherein a thickness of the second insulating layer is within a range of 1 nm to 10 nm.

13. The semiconductor device according to claim 6, wherein a concentration of an impurity element of the pair of impurity regions is lower than that of the source region and the drain region.

* * * * *

UNITED STATES PATENT AND TRADEMARK OFFICE
CERTIFICATE OF CORRECTION

PATENT NO. : 7,692,194 B2  Page 1 of 1
APPLICATION NO. : 12/015362
DATED : April 6, 2010
INVENTOR(S) : Shunpei Yamazaki et al.

It is certified that error appears in the above-identified patent and that said Letters Patent is hereby corrected as shown below:

column 1, line 53, "he" should read "be"

column 2, line 12, "properties" should read "properties."

column 6, line 60, "Layer" should read "layer"

column 11, line 58, "he" should read "be"

column 12, line 6, "he" should read "be"

column 19, line 3, "118+The" should read "118. The"

column 19, line 59, "electrodes Further" should read "electrodes. Further"

column 20, line 37, "given Each" should read "given. Each"

column 20, line 64, "thereof An" should read "thereof. An"

column 21, line 22, "etching In" should read "etching. In"

column 22, line 8, "FIG 5C" should read "FIG. 5C"

column 22, line 49, "O-R" should read "Q-R"

column 27, line 37, "he" should read "be"

column 27, line 40, "pan" should read "part"

column 29, line 43, "below" should read "below."

column 34, line 44, "prevented Moreover" should read "prevented. Moreover"

column 38, line 21, "examples" should read "example,"

column 39, line 13, "1SA" should read "15A"

column 48, line 33, "1/F" should read "I/F"

column 53, line 21, "FL" should read "EL"

column 55, line 9, "decreased Consequently" should read "decreased. Consequently"

column 56, line 38, "semiconductor of" should read "semiconductor or"

column 57, line 18, "he" should read "be"

Signed and Sealed this
Twenty-sixth Day of February, 2013

Teresa Stanek Rea
*Acting Director of the United States Patent and Trademark Office*